(12) United States Patent
Takaiwa et al.

(10) Patent No.: US 10,151,983 B2
(45) Date of Patent: *Dec. 11, 2018

(54) EXPOSURE APPARATUS AND DEVICE MANUFACTURING METHOD

(71) Applicant: NIKON CORPORATION, Tokyo (JP)

(72) Inventors: Hiroaki Takaiwa, Kumagaya (JP); Takashi Horiuchi, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 670 days.

This patent is subject to a terminal disclaimer.

(21) Appl. No.: 14/703,138

(22) Filed: May 4, 2015

(65) Prior Publication Data
US 2015/0234293 A1    Aug. 20, 2015

Related U.S. Application Data

(62) Division of application No. 13/936,517, filed on Jul. 8, 2013, now Pat. No. 9,041,906, which is a division
(Continued)

(30) Foreign Application Priority Data

Feb. 3, 2004 (JP) ................................. 2004-026864

(51) Int. Cl.
*G03F 7/20* (2006.01)
*G03B 27/42* (2006.01)

(52) U.S. Cl.
CPC ......... *G03F 7/70341* (2013.01); *G03B 27/42* (2013.01); *G03F 7/7085* (2013.01); *G03F 7/70916* (2013.01)

(58) Field of Classification Search
CPC . G03F 7/70341; G03F 7/70916; G03F 7/7085
See application file for complete search history.

(56) References Cited

U.S. PATENT DOCUMENTS 3,727,620 A    4/1973    Orr
4,346,164 A    8/1982    Tabarelli et al.
(Continued)

FOREIGN PATENT DOCUMENTS

DE    221 563 A1    4/1985
DE    224 448 A1    7/1985
(Continued)

OTHER PUBLICATIONS

Jun. 25, 2008 Office Action in U.S. Appl. No. 10/587,268.
(Continued)

*Primary Examiner* — Steven H Whitesell Gordon
(74) *Attorney, Agent, or Firm* — Oliff PLC

(57) ABSTRACT

An exposure apparatus includes a projection system having a final optical element via which an exposure beam is projected, an immersion member having an opening through which the exposure beam is projected, liquid supply ports and liquid recovery ports, a stage which is movable below and relative to the projection system and the immersion member, the stage including a holder configured to hold a substrate, and a detection system configured to detect a residual liquid on at least one of the substrate held on the holder of the movable stage and the movable stage. A liquid immersion area that covers only a portion of the upper surface of the substrate is formed on an upper surface of the substrate held on the holder of the movable stage, while supplying immersion liquid via the liquid supply ports and removing the immersion liquid via the liquid recovery ports.

43 Claims, 12 Drawing Sheets

Related U.S. Application Data of application No. 13/067,867, filed on Jun. 30, 2011, now Pat. No. 8,488,101, which is a division of application No. 10/587,268, filed as application No. PCT/JP2005/001225 on Jan. 28, 2005, now Pat. No. 7,990,516.

(56) References Cited

U.S. PATENT DOCUMENTS

| | | |
|---|---|---|
| 4,465,368 A | 8/1984 | Matsuura et al. |
| 4,480,910 A | 11/1984 | Takanashi et al. |
| 5,177,528 A | 1/1993 | Koromegawa et al. |
| 5,274,434 A | 12/1993 | Morioka et al. |
| 5,444,529 A | 8/1995 | Tateiwa |
| 5,493,403 A | 2/1996 | Nishi |
| 5,528,118 A | 6/1996 | Lee |
| 5,610,683 A | 3/1997 | Takahashi |
| 5,623,853 A | 4/1997 | Novak et al. |
| 5,646,413 A | 7/1997 | Nishi |
| 5,684,296 A | 11/1997 | Hamblin et al. |
| 5,715,039 A | 2/1998 | Fukuda et al. |
| 5,825,043 A | 10/1998 | Suwa |
| 5,874,820 A | 2/1999 | Lee |
| 5,969,441 A | 10/1999 | Loopstra et al. |
| 6,012,966 A | 1/2000 | Ban et al. |
| 6,020,964 A | 2/2000 | Loopstra et al. |
| 6,025,206 A | 2/2000 | Chen et al. |
| 6,195,154 B1 | 2/2001 | Imai |
| 6,208,407 B1 | 3/2001 | Loopstra |
| 6,281,962 B1 | 8/2001 | Ogata et al. |
| 6,341,007 B1 | 1/2002 | Nishi et al. |
| 6,400,441 B1 | 6/2002 | Nishi et al. |
| 6,418,640 B1 | 7/2002 | Fukuda et al. |
| 6,538,823 B2 | 3/2003 | Kroupenkine et al. |
| 6,549,269 B1 | 4/2003 | Nishi et al. |
| 6,590,634 B1 | 7/2003 | Nishi et al. |
| 6,827,816 B1 | 12/2004 | Uziel et al. |
| 7,070,915 B2 | 7/2006 | Ho et al. |
| 7,369,217 B2 | 5/2008 | Carroll |
| 7,463,330 B2 * | 12/2008 | Streefkerk .......... G03F 7/70341 355/30 |
| 7,990,517 B2 | 8/2011 | Takaiwa et al. |
| 7,995,186 B2 | 8/2011 | Ohta et al. |
| 8,345,216 B2 | 1/2013 | Ohta et al. |
| 8,488,101 B2 | 7/2013 | Takaiwa et al. |
| 2001/0055100 A1 | 12/2001 | Murakami |
| 2002/0041377 A1 | 4/2002 | Hagiwara et al. |
| 2002/0061469 A1 | 5/2002 | Tanaka |
| 2002/0163629 A1 | 11/2002 | Switkes et al. |
| 2003/0013026 A1 | 1/2003 | Lim |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0020782 A1 | 2/2004 | Cohen et al. |
| 2004/0075895 A1 | 4/2004 | Lin |
| 2004/0103950 A1 | 6/2004 | Iriguchi |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0024609 A1 | 2/2005 | De Smit et al. |
| 2005/0030497 A1 | 2/2005 | Nakamura |
| 2005/0030498 A1 | 2/2005 | Mulkens |
| 2005/0030506 A1 | 2/2005 | Schuster |
| 2005/0030511 A1 | 2/2005 | Auer-Jongepier et al. |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0041225 A1 | 2/2005 | Sengers et al. |
| 2005/0042554 A1 | 2/2005 | Dierichs et al. |
| 2005/0046813 A1 | 3/2005 | Streefkerk et al. |
| 2005/0046934 A1 | 3/2005 | Ho et al. |
| 2005/0048220 A1 | 3/2005 | Mertens et al. |
| 2005/0048223 A1 | 3/2005 | Pawloski et al. |
| 2005/0052632 A1 | 3/2005 | Miyajima |
| 2005/0068639 A1 | 3/2005 | Pierrat et al. |
| 2005/0073670 A1 | 4/2005 | Carroll |
| 2005/0074704 A1 | 4/2005 | Endo et al. |
| 2005/0078286 A1 | 4/2005 | Dierichs et al. |
| 2005/0078287 A1 | 4/2005 | Sengers et al. |
| 2005/0084794 A1 | 4/2005 | Meagley et al. |
| 2005/0088635 A1 | 4/2005 | Hoogendam et al. |
| 2005/0094114 A1 | 5/2005 | Streefkerk et al. |
| 2005/0094116 A1 | 5/2005 | Flagello et al. |
| 2005/0094119 A1 | 5/2005 | Loopstra et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 * | 6/2005 | Mulkens ............. B41C 1/1075 101/463.1 |
| 2005/0134815 A1 | 6/2005 | Van Santen et al. |
| 2005/0134817 A1 | 6/2005 | Nakamura |
| 2005/0141098 A1 | 6/2005 | Schuster |
| 2005/0145265 A1 | 7/2005 | Ravkin et al. |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0161644 A1 | 7/2005 | Zhang et al. |
| 2005/0164502 A1 | 7/2005 | Deng et al. |
| 2005/0173682 A1 | 8/2005 | Zhang et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219499 A1 | 10/2005 | Maria Zaal et al. |
| 2005/0225734 A1 | 10/2005 | De Smit et al. |
| 2005/0225735 A1 | 10/2005 | Magome et al. |
| 2005/0225737 A1 | 10/2005 | Weissenrieder et al. |
| 2005/0231694 A1 | 10/2005 | Kolesnychenko et al. |
| 2005/0233081 A1 | 10/2005 | Tokita |
| 2005/0237501 A1 | 10/2005 | Furukawa et al. |
| 2005/0243292 A1 | 11/2005 | Baselmans et al. |
| 2005/0245005 A1 | 11/2005 | Benson |

(56) References Cited

U.S. PATENT DOCUMENTS

| | | |
|---|---|---|
| 2005/0253090 A1 | 11/2005 | Gau et al. |
| 2005/0259232 A1 | 11/2005 | Streefkerk et al. |
| 2005/0259233 A1 | 11/2005 | Streefkerk et al. |
| 2005/0259236 A1 | 11/2005 | Straaijer |
| 2005/0264774 A1 | 12/2005 | Mizutani et al. |
| 2005/0264778 A1 | 12/2005 | Lof et al. |
| 2005/0270505 A1 | 12/2005 | Smith |
| 2006/0007419 A1 | 1/2006 | Streefkerk et al. |
| 2006/0077367 A1 | 4/2006 | Kobayashi et al. |
| 2006/0098177 A1 | 5/2006 | Nagasaka |
| 2006/0119813 A1 | 6/2006 | Hultermans et al. |
| 2006/0132737 A1 | 6/2006 | Magome et al. |
| 2006/0177777 A1 | 8/2006 | Kawamura et al. |
| 2006/0256316 A1 | 11/2006 | Tanno et al. |
| 2006/0257553 A1 | 11/2006 | Ohta et al. |
| 2007/0159609 A1 | 7/2007 | Takaiwa et al. |
| 2011/0261330 A1 | 10/2011 | Ohta et al. |

FOREIGN PATENT DOCUMENTS

| | | |
|---|---|---|
| EP | 0 605 103 A1 | 7/1994 |
| EP | 1-491-957 A2 | 12/2004 |
| EP | 1 557 721 A2 | 7/2005 |
| EP | 1 571 694 A1 | 9/2005 |
| EP | 1 571 699 A1 | 9/2005 |
| EP | 1 628 329 A1 | 2/2006 |
| EP | 1 632 991 A1 | 3/2006 |
| EP | 1 653 501 A1 | 5/2006 |
| EP | 1 672 681 A1 | 6/2006 |
| JP | A 57-117238 | 7/1982 |
| JP | A-57-153433 | 9/1982 |
| JP | A 58-202448 | 11/1983 |
| JP | A 59-19912 | 2/1984 |
| JP | A 62-65326 | 3/1987 |
| JP | A 63-73628 | 4/1988 |
| JP | A 63-157419 | 6/1988 |
| JP | A 4-65603 | 3/1992 |
| JP | A 4-305915 | 10/1992 |
| JP | A 4-305917 | 10/1992 |
| JP | A 5-62877 | 3/1993 |
| JP | A 6-53120 | 2/1994 |
| JP | A 6-124873 | 5/1994 |
| JP | A 6-168866 | 6/1994 |
| JP | A 6-188169 | 7/1994 |
| JP | A 7-176468 | 7/1995 |
| JP | A 7-220990 | 8/1995 |
| JP | A 8-37149 | 2/1996 |
| JP | A 8-166475 | 6/1996 |
| JP | A 8-316125 | 11/1996 |
| JP | A 8-330224 | 12/1996 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-16816 | 1/1999 |
| JP | A 11-135400 | 5/1999 |
| JP | A 11-176727 | 7/1999 |
| JP | A 2000-58436 | 2/2000 |
| JP | A-2000-505958 | 5/2000 |
| JP | A-2000-155079 | 6/2000 |
| JP | A-2000-180371 | 6/2000 |
| JP | A 2002-14005 | 1/2002 |
| JP | A-2003-7669 | 1/2003 |
| JP | A 2004-207696 | 7/2004 |
| JP | A 2005-5713 | 1/2005 |
| JP | A 2005-12195 | 1/2005 |
| JP | A 2005-57278 | 3/2005 |
| JP | A-2005-184004 | 7/2005 |
| JP | A-2005/252239 | 9/2005 |
| WO | WO 98/28665 | 7/1998 |
| WO | WO 99/49504 | 9/1999 |
| WO | WO 02/091078 A1 | 11/2002 |
| WO | WO 03/077037 A1 | 9/2003 |
| WO | WO 2004/019128 A2 | 3/2004 |
| WO | WO 2004/053952 A1 | 6/2004 |
| WO | WO 2004/053958 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/105106 A1 | 12/2004 |
| WO | WO 2004/105107 A1 | 12/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/010962 A1 | 2/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/036621 A1 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/076321 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

Feb. 20, 2009 Office Action in U.S. Appl. No. 10/587,268.
Sep. 29, 2009 Office Action in U.S. Appl. No. 10/587,268.
Mar. 5, 2010 Office Action in U.S. Appl. No. 10/587,268.
Sep. 9, 2010 Notice of Allowance in U.S. Appl. No. 10/587,268.
May 31, 2005 International Search Report in Application No. PCT/JP2005/001225, with translation.
May 31, 2005 Written Opinion in Application No. PCT/JP2005/001225, with translation.
Dec. 8, 2009 Office Action in Japanese Application No. 2005-517658, with translation.
Apr. 6, 2010 Notice of Allowance in Japanese Application No. 2005-517658, with translation.
Aug. 20, 2010 Supplemental European Search Report in European Application No. 05709451.8.
B.J. Lin, "Semiconductor Foundry, Lithography, and Partners" Proceedings of SPEI vol. 4688 (2002), p. 11-24.

(56) References Cited

OTHER PUBLICATIONS

M. Switkes et al., "Resolution Enhancement of 157nm Lithography by Liquid Immersion" Proceedings of SPEI vol. 4691 (2002), p. 459-465.
M. Switkes et al., "Resolution Enhancement of 157nm Lithography by Liquid Immersion" J. Microlith., Microfab., vol. 1 No. 3, Oct. 2002, p. 1-4.
Soichi Owa et al., "Nikon F2 Exposure Tool" slides 1-25, 3$^{rd}$ 157nm Symposium 2002, Sep. 4, 2002.
Soichi Owa, "Immersion Lithography" slides 1-24, Immersion Lithography Workshop, Dec. 11, 2002.
Soichi Owa and Hiroyuki Nagasaka, "Immersion Lithography; Its Potential Performance and Issues", SPIE Optical Microlithography XVI, vol. 5040 (2003) p. 724-733.
Soichi Owa and Hiroyuki Nagasaka, "Potential Performance and Feasibility of Immersion Lithography" slides 1-33, NGL Workshop 2003, Jul. 10, 2003.
S. Owa et al., "Update on 193nm Immersion Exposure Tool" slides 1-38, Immersion Workshop 2004, Jan. 27, 2004.
S. Owa et al., "Update on 193nm Immersion Exposure Tool" slides 1-51, Litho Forum, Jan. 28, 2004.
Mar. 4, 2008 Office Action in U.S. Appl. No. 11/398,572.
Nov. 28, 2008 Office Action in U.S. Appl. No. 11/398,572.
Aug. 27, 2009 Office Action in U.S. Appl. No. 11/398,572.
Nov. 18, 2009 Office Action in U.S. Appl. No. 11/398,572.
Jul. 28, 2010 Office Action in U.S. Appl. No. 11/398,572.
Mar. 13, 2008 Office Action in U.S. Appl. No. 11/652,015.
Dec. 30, 2008 Notice of Allowance in U.S. Appl. No. 11/652,015.
Apr. 13, 2009 Office Action in U.S. Appl. No. 11/652,015.
Dec. 1, 2009 Office Action in U.S. Appl. No. 11/652,015.
May 19, 2010 Advisory Action in U.S. Appl. No. 11/652,015.
Aug. 5, 2010 Office Action in U.S. Appl. No. 11/652,015.
Dec. 7, 2009 Office Action in U.S. Appl. No. 11/889,288.
Jul. 28, 2010 Office Action in U.S. Appl. No. 11/889,288.
Apr. 2, 2008 Supplementary European Search Report in European Application No. 04792152.3.
Jul. 18, 2008 Office Action in European Application No. 04792152.3.
Feb. 17, 2009 Office Action in European Application No. 04792152.3.
Oct. 28, 2010 Office Action in European Application No. 04792152.3.
Jan. 11, 2005 International Search Report in International Application No. PCT/JP2004/014855, with translation.
Jan. 11, 2005 Written Opinion in International Application No. PCT/JP2004/014855, with translation.
Nov. 25, 2008 Office Action in Japanese Application No. 2005-514600, with translation.
May 19, 2009 Notice of Allowance in Japanese Application No. 2005-514600, with translation.
Feb. 16, 2011 Office Action in U.S. Appl. No. 11/398,572.
Mar. 11, 2011 Office Action issued in Korean Patent Application No. 10-2006-7006650 (w/English-language Translation).
Mar. 29, 2001 Notice of Allowance issued in U.S. Appl. No. 11/652,015.
Apr. 5, 2011 Office Action issued in Japanese Patent Application No. 2009-013518 (w/English-language Translation).
Apr. 26, 2011 Office Action issued in Korean Patent Application No. 10-2006-7011212 (w/English-language Translation).
Apr. 27, 2011 Office Action issued in U.S. Appl. No. 11/889,288.
Jun. 25, 2008 Office Action in U.S. Appl. No. 11/651,551.
Feb. 12, 2009 Office Action in U.S. Appl. No. 11/651,551.
Sep. 30, 2009 Office Action in U.S. Appl. No. 11/651,551.
Mar. 5, 2010 Office Action in U.S. Appl. No. 11/651,551.
Nov. 3, 2010 Notice of Allowance in U.S. Appl. No. 11/651,551.
Mar. 21, 2011 Notice of Allowance in U.S. Appl. No. 11/651,551.
Mar. 2, 2012 Office Action issued in U.S. Appl. No. 13/067,842.
Apr. 5, 2012 Office Action issued in Taiwanese Application No. 093130457 (with English translation).
Jul. 11, 2012 Office Action issued in European Patent Application No. 05 709 451.8.
Sep. 24, 2012 Office Action issued in U.S. Appl. No. 13/067,842.
Feb. 28, 2012 Office Action issued in U.S. Appl. No. 13/067,867.
Sep. 21, 2012 Office Action issued in U.S. Appl. No. 13/067,867.
May 30, 2013 Notice of Allowance issued in U.S. Appl. No. 13/067,867.
Jul. 3, 2013 Office Action issued in U.S. Appl. No. 13/067,845.
Jul. 5, 2013 Office Action issued in U.S. Appl. No. 13/690,577.
Aug. 21, 2013 Office Action issued in U.S. Appl. No. 13/067,842.
Oct. 22, 2013 Office Action issued in Japanese Patent Application No. 2012-081381 (with translation).
Feb. 13, 2014 Office Action issued in U.S. Appl. No. 13/067,845.
Feb. 20, 2014 Office Action issued in U.S. Appl. No. 13/690,577.
Apr. 22, 2014 Office Action issued in Japanese Patent Application No. 2011-126741 (with translation).
Jun. 19, 2014 Office Action issued in U.S. Appl. No. 13/067,845.
Jun. 12, 2014 Office Action issued in Taiwanese Patent Application No. 101136838 (with translation).
Jul. 18, 2014 Office Action issued in U.S. Appl. No. 13/690,577.
Nov. 14, 2014 Office Action issued in U.S. Appl. No. 13/690,577.
Nov. 17, 2014 Office Action Issued in U.S. Appl. No. 13/067,845.
Nov. 14, 2013 Office Action issued in U.S. Appl. No. 13/936,517.
Jan. 31, 2014 Office Action issued in U.S. Appl. No. 13/936,517.
Aug. 8, 2014 Office Action issued in U.S. Appl. No. 13/936,517.
Jan. 22, 2015 Notice of Allowance issued in U.S. Appl. No. 13/936,517.
May 30, 2017 Office Action issued in European Patent Application No. 05709451.8.

\* cited by examiner

EXPOSURE APPARATUS AND DEVICE MANUFACTURING METHOD

This is a Division of U.S. patent application Ser. No. 13/936,517 filed Jul. 8, 2013 (now U.S. Pat. No. 9,041,906), which in turn is a Division of U.S. patent application Ser. No. 13/067,867 filed Jun. 30, 2011 (now U.S. Pat. No. 8,488,101), which in turn is a Division of U.S. patent application Ser. No. 10/587,268 filed Jul. 26, 2006 (now U.S. Pat. No. 7,990,516), which is a U.S. National Stage of PCT/JP2005/001225, filed Jan. 28, 2005. The disclosure of each of the prior applications is hereby incorporated by reference herein in its entirety.

TECHNICAL FIELD

The present invention relates to an exposure apparatus that exposes a substrate by irradiating the substrate with exposure light through a projection optical system and a liquid, and to a device manufacturing method that uses that exposure apparatus.

BACKGROUND ART

Semiconductor devices and liquid crystal display devices are fabricated by a so-called photolithography technique, wherein a pattern formed on a mask is transferred onto a photosensitive substrate.

An exposure apparatus used in this photolithographic process has a mask stage that supports a mask, as well as a substrate stage that supports a substrate, and transfers the pattern of the mask onto the substrate through a projection optical system while successively moving the mask stage and the substrate stage.

There has been demand in recent years for higher resolution projection optical systems in order to handle the much higher levels of integration of device patterns. The shorter the exposure wavelength used and the larger the numerical aperture of the projection optical system, the higher the resolution of the projection optical system. Consequently, the exposure wavelength used in exposure apparatuses has shortened year by year, and the numerical aperture of projection optical systems has increased. Furthermore, the mainstream exposure wavelength currently is the 248 nm KrF of excimer laser, but an even shorter wavelength 193 nm of ArF excimer laser is also being commercialized. In addition, as with resolution, the depth of focus (DOF) is important when performing an exposure. The following equations express the resolution R and the depth of focus δ, respectively.

$$R = k_1 \cdot \lambda / NA \quad (1)$$

$$\delta = \pm k_2 \cdot \lambda / NA^2 \quad (2)$$

Therein, λ, is the exposure wavelength, NA is the numerical aperture of the projection optical system, and $k_1$ and $k_2$ are the process coefficients. Equations (1) and (2) teach that if the exposure wavelength λ is shortened and the numerical aperture NA is increased in order to enhance the resolution R, then the depth of focus δ decreases.

At this time, if the depth of focus δ becomes excessively small, then it will become difficult to align the front surface of the substrate with the image plane of the projection optical system, and there will be a risk of insufficient margin of focus during the exposure operation.

Accordingly, a liquid immersion method has been proposed, as disclosed in, for example, Patent Document 1 below, as a method to substantially shorten the exposure wavelength and increase the depth of focus. This liquid immersion method forms a liquid immersion area by filling a gap between the lower surface of the projection optical system and the front surface of the substrate with a liquid, such as water or an organic solvent, thus taking advantage of the fact that the wavelength of the exposure light in a liquid is 1/n that of in air (where n is the refractive index of the liquid, normally about 1.2 to 1.6), and thereby improving the resolution as well as increasing the depth of focus by approximately n times.

Patent Document 1: PCT International Publication WO99/49504

Incidentally, it is important in an immersion exposure apparatus to form a liquid immersion area in a desired state. For example, if the liquid immersion area on the substrate is not formed in a desired state, then problems will arise, such as the degradation of the pattern image or the failure of the exposure light to reach the substrate, which will result in a degradation of the exposure accuracy. In addition, it is also conceivable that a measurement process will be performed through the liquid using, for example, a measurement member and a measurement sensor, which are provided on the substrate stage; however, even in that case, the measurement accuracy will degrade if the liquid immersion area on the substrate stage is not formed in a desired state.

In addition, if the liquid in the immersion area flows out of the immersion area, or if the liquid used during exposure leaks and then infiltrates and adheres to a position outside of the desired position, then there is a possibility that that liquid will cause problems, such as a failure of apparatuses and members, electrical leakage, and rusting, thereby causing the degradation of exposure accuracy, measurement accuracy, and the like. If, unfortunately, a substrate is loaded onto a substrate holder in a state wherein, for example, liquid is adhering to that substrate holder that holds a substrate, then that liquid will function as a lubricating film and cause the mispositioning of the substrate with respect to the substrate holder, thereby degrading exposure accuracy, measurement accuracy, and the like.

In addition, to satisfactorily form the liquid immersion area and to satisfactorily recover the liquid, it is preferable to maintain the affinity between the liquid and the substrate as well as the upper surface of the substrate stage in an optimal state. If the liquid is not completely recovered and unfortunately remains, then that remaining liquid vaporizes and, for example, causes: thermal deformation of the substrate, the substrate stage, and the like; fluctuations in the environment (temperature, humidity) wherein the substrate is disposed; and fluctuations in the optical paths of the various measurement beams that measure the positional information of the substrate, and the like, thereby degrading exposure accuracy, measurement accuracy, and the like. In addition, after the remaining liquid vaporizes, a water residue (a so-called watermark) is unfortunately formed, which creates an error factor in the various measurements, and there is also a possibility that the substrate and the like will be contaminated by the generation of foreign matter.

DISCLOSURE OF THE INVENTION

The present invention was made considering such circumstances, and it is an object of the present invention to provide an exposure apparatus that can satisfactorily perform exposure and measurement processes through a liquid, and to provide a device manufacturing method.

To solve the abovementioned problems, the present invention adopts the following constitution.

The exposure apparatus in accordance with the present invention is an exposure apparatus that exposes a substrate by emitting exposure light onto the substrate through a projection optical system and a liquid, comprising a detection apparatus that detects whether the liquid is present on an object, which is disposed lower than a front end of the projection optical system.

According to the present invention, the detection apparatus can be used to detect whether the liquid is present on the object, which is disposed lower than the front end of the projection optical system. Accordingly, if, for example, an immersion area is not formed at a desired position, then it is possible to take appropriate measures, based on a detection result of the detection apparatus, in order to dispose the liquid at the desired position, thereby maintaining high exposure and measurement accuracies.

Likewise, if liquid flows out and adheres to a position outside of the desired position, then it is possible to take appropriate measures based on the detection result of the detection apparatus, e.g., stopping the supply of the liquid, removing the liquid, and the like, thereby maintaining high exposure and measurement accuracies.

The exposure apparatus in accordance with the present invention is an exposure apparatus that exposes a substrate by emitting exposure light onto the substrate through a projection optical system and a liquid, comprising a detection apparatus having an emitting portion that emits detection light to an immersion area formed between the projection optical system and an object disposed on an image plane side of the projection optical system, and a light receiving portion that is disposed at a predetermined position with respect to the detection light, wherein the detection apparatus obtains at least one of a size and a shape of the immersion area based on a light receiving result of the light receiving portion.

According to the present invention, the detection apparatus is used to optically derive at least one of the size and the shape of the immersion area, and it is thereby possible to take appropriate measures based on the derived result in order to set the size and shape of the immersion area to a desired state. Thereby, the optical path of the exposure light can be reliably filled with the liquid, and the exposure and measurement processes can be satisfactorily performed. In addition, even if there is a risk that, for example, the immersion area will spread excessively and the liquid will flow out therefrom, it is possible to prevent the occurrence of problems, such as the outflow of the liquid, by taking appropriate measures based on the detection result of the detection apparatus.

The exposure apparatus in accordance with the present invention is an exposure apparatus that exposes a substrate by emitting exposure light onto the substrate through a projection optical system and a liquid, comprising a shape detection apparatus that obtains a shape of the liquid on an object movable on an image plane side of the projection optical system.

According to the present invention, the shape detection apparatus is used to derive the shape of the liquid, and it is therefore possible to derive the affinity of the liquid for the object, specifically the contact angle of the liquid with respect to the object. Accordingly, based on the derived result, it is possible to take appropriate measures in order to maintain the affinity of the liquid for the substrate, the upper surface of the substrate stage, and the like in an optimal state, thereby maintaining high exposure and measurement accuracies.

The exposure apparatus in accordance with the present invention is an exposure apparatus that exposes a substrate by emitting exposure light onto the substrate through a projection optical system and a liquid, comprising a detection apparatus that detects a contact angle of the liquid, on an upper surface of a substrate stage that holds the substrate, with respect to the upper surface of the substrate stage.

According to the present invention, it is possible to know the contact angle of the liquid with respect to the upper surface of the substrate stage, and it is therefore possible to take appropriate measures based on that result in order to maintain the affinity of the liquid for the upper surface of the substrate stage in an optimal state, thereby maintaining high exposure and measurement accuracies.

The device manufacturing method of the present invention uses the exposure apparatus recited above.

According to the present invention, it is possible to use the exposure apparatus, which is capable of satisfactorily performing the exposure and measurement processes through the liquid, to manufacture a device that exhibits the desired performance.

According to the present invention, the detection apparatus is used to detect the presence of liquid on an object disposed lower than the front end of a projection optical system, the state of the immersion area, or the shape or contact angle of the liquid, and it is therefore possible to take optimal measures based on those detection results in order to maintain high exposure and measurement accuracies. Accordingly, a device that has the desired performance can be manufactured.

BEST MODE FOR CARRYING OUT THE INVENTION

The following explains the exposure apparatus of the present invention, referencing the drawings, but the present invention is not limited thereto.

Figure 1:
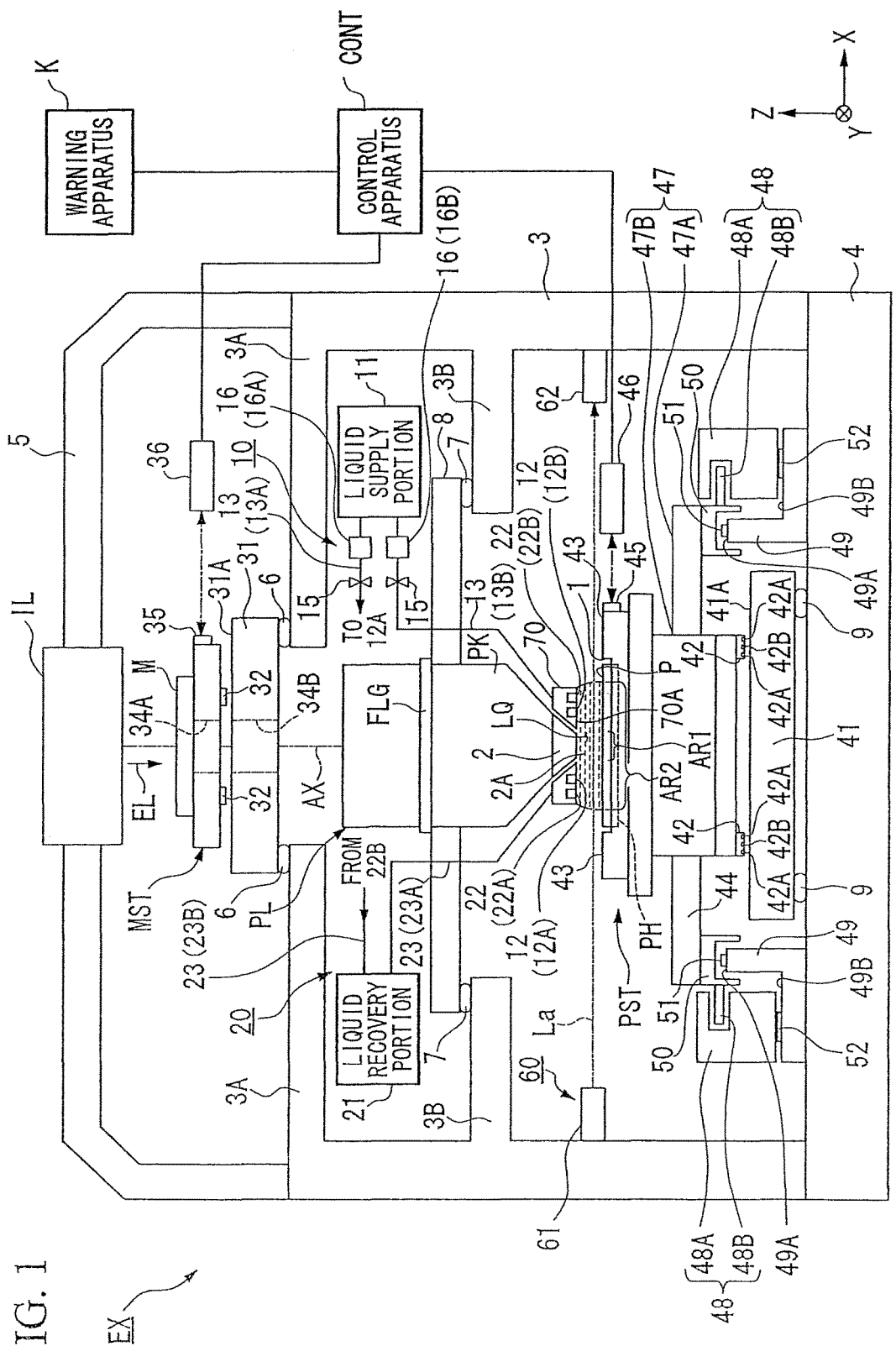
FIG. 1 is a schematic block diagram that depicts one embodiment of an exposure apparatus of the present invention.

FIG. 1 is a schematic diagram that depicts the structure of one embodiment of the exposure apparatus according to the present invention.

In FIG. 1, an exposure apparatus EX has: a mask stage MST that supports a mask M; a substrate stage PST that supports a substrate P; an illumination optical system IL that illuminates the mask M, which is supported by the mask stage MST, with an exposure light EL; a projection optical system PL that projects a pattern image of the mask M illuminated by the exposure light EL onto the substrate P supported by the substrate stage PST so as to expose the substrate P; a detection apparatus 60 that detects whether a liquid LQ is present on an object, which is disposed lower than the front end portion of the projection optical system PL on the image plane side thereof; and a control apparatus CONT that provides overall control of the operation of the entire exposure apparatus EX. The control apparatus CONT is connected to a warning apparatus K that issues a warning when an abnormality arises in the exposure process. Furthermore, the exposure apparatus EX has a main column 3 that supports the mask stage MST and the projection optical system PL. The main column 3 is installed on a base plate 4 which is mounted horizontal to the floor surface. An upper side step portion 3A and a lower side step portion 3B, which project inwardly, are formed in the main column 3.

The exposure apparatus EX of the present embodiment is a liquid immersion type exposure apparatus that applies the liquid immersion method to substantially shorten the exposure wavelength so as to improve the resolution, as well as substantially increase the depth of focus, and has a liquid supply mechanism 10 that supplies the liquid LQ onto the substrate P, and a liquid recovery mechanism 20 that collects and recovers the liquid LQ on the substrate P. At least during the transfer of the pattern image of the mask M onto the substrate P, the exposure apparatus EX locally forms a (liquid) immersion area AR2, which is larger than a projection area AR1 and smaller than the substrate P, with the liquid LQ, which is supplied by the liquid supply mechanism 10, on a portion of the substrate P that includes the projection area AR1 of the projection optical system PL. Specifically, the exposure apparatus EX exposes the substrate P by filling a gap between an optical element 2 at the front end portion of the projection optical system PL on the image plane side and the front surface of the substrate P with the liquid LQ, and then projecting the pattern image of the mask M onto the substrate P through the projection optical system PL and the liquid LQ that is between this projection optical system PL and the substrate P.

The present embodiment will now be explained as exemplified by a case of using a scanning type exposure apparatus (a so-called scanning stepper) as the exposure apparatus EX that exposes the substrate P with the pattern formed on the mask M, while synchronously moving the mask M and the substrate P in mutually different (i.e., reverse) directions along the scanning direction. In the following explanation, the direction that coincides with an optical axis AX of the projection optical system PL is the Z axial direction, the direction in which the mask M and the substrate P synchronously move (in the scanning direction) within the plane perpendicular to the Z axial direction is the X axial direction, and the direction (non-scanning direction) perpendicular to the Z axial direction and the X axial direction is the Y axial direction. In addition, the rotational (inclination) directions around the X, Y, and Z axes are the θX, θY, and θZ directions, respectively. Furthermore, "substrate" herein includes a semiconductor wafer coated with a photoresist, which is a photosensitive material, and "mask" includes a reticle wherein a device pattern, which is reduction-projected onto the substrate, is formed.

The illumination optical system IL is supported by a support column 5, which is fixed to an upper portion of the main column 3. The illumination optical system IL illuminates the mask M, which is supported by the mask stage MST, with the exposure light EL, and has: an exposure light source; an optical integrator that uniformizes the luminous flux intensity (i.e., illuminance) of the light beam emitted from the exposure light source; a condenser lens that condenses the exposure light EL from the optical integrator; a relay lens system; a variable field stop that sets an illumination region on the mask M illuminated by the exposure light EL to be slit-shaped; and the like. The illumination optical system IL illuminates the prescribed illumination region on the mask M with the exposure light EL, which has a uniform luminous flux intensity distribution. Examples of light that can be used as the exposure light EL emitted from the illumination optical system IL include: deep ultraviolet light (DUV light), such as the bright lines (g, h, and i lines) emitted from a mercury lamp for example, and KrF excimer laser light (248 nm wavelength); and vacuum ultraviolet light (VUV light), such as ArF excimer laser light (193 nm wavelength) and $F_2$ laser light (157 nm wavelength). ArF excimer laser light is used in the present embodiment.

In the present embodiment, pure water is used as the liquid LQ. Pure water is capable of transmitting not only ArF excimer laser light, but also deep ultraviolet light (DUV light), such as the bright lines (g, h, and i lines) emitted from, for example, a mercury lamp, and KrF excimer laser light (248 nm wavelength).

The mask stage MST supports the mask M and has an open portion 34A at its center portion, which the pattern image of the mask M passes through. A mask surface plate 31 is supported on the upper side step portion 3A of the main column 3 via a vibration isolating unit 6. An open portion 34B, which the pattern image of the mask M passes through, is also formed at the center portion of the mask surface plate 31. A plurality of gas bearings (air bearings) 32, which are noncontact bearings, is provided at the lower surface of the mask stage MST. The mask stage MST is contactlessly supported by the air bearings 32 with respect to an upper surface (guide surface) 31A of the mask surface plate 31, and is two-dimensionally movable by the mask stage drive mechanism, such as a linear motor, within a plane perpendicular to the optical axis AX of the projection optical system PL, i.e., within the XY plane, and is finely rotatable about the θZ direction. Movable mirrors 35 are provided to the mask stage MST. In addition, a laser interferometer 36 is provided at a position opposing each movable mirror 35. The laser interferometers 36 measure in real time the positions in the two-dimensional directions as well as the rotational angle in the θZ direction (depending on the case, including the rotational angles in the θX and θY directions) of the mask M on the mask stage MST, and output these measurement results to the control apparatus CONT. The control apparatus CONT drives the mask stage drive mechanism based on the measurement results of the laser interferometers 36, thereby controlling the position of the mask M, which is supported by the mask stage MST.

The projection optical system PL projects the pattern of the mask M onto the substrate P at a prescribed projection magnification β so as to expose the substrate P, and has a plurality of optical elements, which includes an optical element (lens) 2 provided at the front end portion thereof on the substrate P side, that is supported by a lens barrel PK. In the present embodiment, the projection optical system PL is a reduction system that has a projection magnification β of, for example, ¼ or ⅕. Furthermore, the projection optical system PL may be an equal magnification system or an enlargement system. In addition, the projection optical system PL may be a reflecting system, which does not include refracting elements, a refracting system, which does not include reflecting elements, or a catadioptric system, which includes both refracting elements and reflecting elements. A flange portion FLG is provided at the outer circumferential portion of the lens barrel PK. In addition, a lens barrel surface plate 8 is supported by the lower side step portion 3B of the main column 3 via a vibration isolating unit 7. Furthermore, the projection optical system PL is supported by the lens barrel surface plate 8 due to the flange portion FLG of the projection optical system PL engaging with the lens barrel surface plate 8.

In addition, the optical element 2 at the front end portion of the projection optical system PL of the present embodiment is exposed to the exterior of the lens barrel PK, and makes contact with the liquid LQ of the immersion area AR2. The optical element 2 is made of calcium fluoride. The liquid LQ can adhere to substantially the entire surface of a liquid contact surface 2A of the optical element 2 because liquid contact surface 2A, which is made of calcium fluoride, has a strong affinity for water. Namely, because the liquid (water) LQ supplied in the present embodiment has a strong affinity for the liquid contact surface 2A of the optical element 2, the liquid contact surface 2A of the optical element 2 and the liquid LQ have strong adhesion characteristics, and therefore the optical path between the optical element 2 and the substrate P can be reliably filled with the liquid LQ. Furthermore, the optical element 2 may be made of silica glass, which also has a strong affinity for water. In addition, the liquid contact surface 2A of the optical element 2 may be given hydrophilic (lyophilic) treatment in order to further raise its affinity for the liquid LQ.

The substrate stage PST is provided so that it is capable of holding and moving the substrate P via a substrate holder PH, and is also provided so that it is capable of moving with respect to the projection optical system PL. The substrate holder PH holds the substrate P either by a vacuum suction system or an electrostatic chuck system. A plurality of gas bearings (air bearings) 42, which are noncontact bearings, are provided to the lower surface of the substrate stage PST. A substrate surface plate 41 is supported on the base plate 4 via vibration isolating units 9. Each of the air bearings 42 has a blowout port 42B that blows a gas (air) out toward an upper surface (guide surface) 41A of the substrate surface plate 41, as well as intake ports 42A that suction the gas between the lower surface (bearing surface) of the substrate stage PST and the guide surface 41A and that maintain a fixed gap therebetween due to the equilibrium between the repellent force caused by blowing the gas out from the blowout port 42B and the suction force of the intake ports 42A. Namely, the substrate stage PST is contactlessly supported by the air bearings 42 with respect to an upper surface (guide surface) 41A of the substrate surface plate 41, and is finely rotatable in the θZ direction and two-dimensionally movable within a plane perpendicular to the optical axis AX of the projection optical system PL, i.e., within the XY plane, by a substrate stage drive mechanism, such as a linear motor. Furthermore, the substrate holder PH is provided so that it is also capable of moving in the Z axial direction as well as the θX and θY directions via a holder drive mechanism. The control apparatus CONT controls the substrate stage drive mechanism.

In addition, the exposure apparatus EX has a focus leveling detection system (not shown) that detects the position of the front surface of the substrate P that is supported by the substrate stage PST. Furthermore, the system disclosed in, for example, Japanese Published Unexamined Patent Application No. 8-37149 can be used to constitute the focus leveling detection system. The detection result of the focus leveling detection system is outputted to the control apparatus CONT. Based on the detection result of the focus leveling detection system, the control apparatus CONT can detect the positional information of the front surface of the substrate P in the Z axial direction, as well as the inclination information of the substrate P in the θX and θY directions.

The control apparatus CONT aligns the front surface of the substrate P with the image plane of the projection optical system PL by using an auto focus system and an auto leveling system, and by driving the holder drive mechanism as well as controlling the focus position (Z position) and inclination angle of the front surface of the substrate P, which is held on the substrate holder PH.

A recessed portion 1 is provided on the substrate stage PST, and the substrate holder PH is disposed in that recessed portion 1. Furthermore, an upper surface 43 of the substrate stage PST is a flat surface that is constituted so that it is substantially the same height as (flush with) the front surface of the substrate P, which is supported by the substrate holder PH.

Movable mirrors 45 are provided to the substrate stage PST. In addition, a laser interferometer 46 is provided at a position opposing each movable mirror 45. The laser interferometers 46 measure in real time the positions in the two-dimensional directions as well as the rotational angle of the substrate P on the substrate stage PST, and output these measurement results to the control apparatus CONT. The control apparatus CONT drives the substrate stage drive mechanism, which includes a linear motor, based on the measurement results of the laser interferometers 46, and thereby positions the substrate P, which is supported on the substrate stage PST, in the X and Y axial directions.

In addition, the substrate stage PST is supported so that it is freely movable in the X axial direction by an X guide stage 44. The substrate stage PST is movable by a prescribed stroke in the X axial direction by an X linear motor 47 while being guided by the X guide stage 44. The X linear motor 47 has a stator 47A provided to the X guide stage 44 extending in the X axial direction, and a slider 47B provided corresponding to this stator 47A and fixed to the substrate stage PST. Furthermore, the substrate stage PST moves in the X axial direction by driving the slider 47B with respect to the stator 47A. Here, the substrate stage PST is contactlessly supported by a magnetic guide having an actuator and a magnet that maintains a predetermined gap in the Z axial direction with respect to the X guide stage 44. The X linear motor 47 moves the substrate stage PST in the X axial direction in a state in which it is contactlessly supported by the X guide stage 44.

The ends of the X guide stage 44 in the longitudinal direction are provided with a pair of Y linear motors 48, 48 capable of moving this X guide stage 44 along with the substrate stage PST in the Y axial direction. The Y linear motors 48, 48 are provided at opposite ends of the X guide stage 44 in the longitudinal direction, each Y linear motor 48 has a slider 48B and a stator 48A, which is provided corresponding to the slider 48B.

Furthermore, the X guide stage 44 along with the substrate stage PST moves in the Y axial direction by driving the sliders 48B with respect to the stators 48A. In addition, the X guide stage 44 can also be rotated in the θZ direction by adjusting the respective drives of the Y linear motors 48. Accordingly, the substrate stage PST is movable substantially integrally with the X guide stage 44 in the Y axial direction and the θZ direction by these Y linear motors 48, 48.

Guide portions 49 are each formed in an L shape in a front view and guide the movement of the X guide stage 44 in the Y axial direction; furthermore, the guide portions 49 are respectively provided on opposite sides of the substrate surface plate 41 in the X axial direction. Each guide portion 49 is supported on the base plate 4. In the present embodiment, the stator 48A of each Y linear motor 48 is provided on a flat portion 49B of the corresponding guide portion 49. Further, a recessed guided member 50 is provided on the lower surface of the X guide stage 44 at each end thereof in the longitudinal direction. Each guide portion 49 is provided so that it engages with the respective guided member 50, and so that an upper surface (the guide surface) 49A of each guide portion 49 opposes the inner surface of the respective guided member 50. The guide surface 49A of each guide portion 49 is provided with a gas bearing (air bearing) 51, which is a noncontact bearing, and the X guide stage 44 is contactlessly supported with respect to the guide surfaces 49A.

In addition, a gas bearing (air bearing) 52, which is a noncontact bearing, is interposed between the stator 48A of each Y linear motor 48 and the flat portion 49B of the respective guide portion 49; additionally, each stator 48A is contactlessly supported by the respective air bearing 52 with respect to the flat portion 49B of the relevant guide portion 49. Consequently, by the law of conservation of momentum, each stator 48A moves in the −Y direction (+Y direction) in response to the movement of the X guide stage 44 and the substrate stage PST in the +Y direction (−Y direction). The movement of the stator 48A offsets the reaction force attendant with the movement of the X guide stage 44 and the substrate stage PST, and also prevents a change in the position of the center of gravity. Namely, each stator 48A functions as a so-called counter mass.

The liquid supply mechanism 10 supplies the prescribed liquid LQ on the image plane side of the projection optical system PL, and has: a liquid supply portion 11 that is capable of feeding the liquid LQ; and supply pipes 13 (13A, 13B), each having one end portion that is connected to the liquid supply portion 11. The liquid supply portion 11 has a tank that stores the liquid LQ, a pressure pump, and the like. The control apparatus CONT controls the liquid supply operation of the liquid supply portion 11. The liquid supply mechanism 10 supplies the liquid LQ, which is controlled at a prescribed temperature (e.g., 23° C.), onto the substrate P when forming the immersion area AR2 thereon. Furthermore, the exposure apparatus EX is not necessarily equipped with the tank, the pressure pump, and the like of the liquid supply portion 11, and such can be substituted by the equipment at, for example, the plant where the exposure apparatus EX is installed.

In addition, it is preferable to control the temperature stability and uniformity of the liquid LQ supplied from the liquid supply mechanism 10 to approximately 0.01° to 0.001° C.

Valves 15, which open and close the passageways of the supply pipes 13A, 13B, are respectively provided along the supply pipes 13A, 13B. The control apparatus CONT controls the operation of opening and closing the valves 15. Furthermore, the valves 15 in the present embodiment are so-called normally closed systems, which mechanically block the passageways of the supply pipes 13A, 13B if the drive source (power supply) of the exposure apparatus EX (the control apparatus CONT) stops due to, for example, a power outage.

The liquid recovery mechanism 20 collects and recovers the liquid LQ on the image plane side of the projection optical system PL, and has: a liquid recovery portion 21 that is capable of collecting the liquid LQ; and recovery pipes 23 (23A, 23B), each having one end portion that is connected to the liquid recovery portion 21. The liquid recovery portion 21 is provided with: a vacuum system (a suction apparatus), e.g., a vacuum pump and the like; a gas-liquid separator that separates the collected liquid LQ and gas; a tank that stores the recovered liquid LQ; and the like. Furthermore, instead of providing the exposure apparatus EX with a vacuum pump, the vacuum system at the plant where the exposure apparatus EX is disposed may be used as the vacuum system. The control apparatus CONT controls the liquid recovery operation of the liquid recovery portion 21. To form the immersion area AR2 on the substrate P, the liquid recovery mechanism 20 collects a prescribed amount of the liquid LQ on the substrate P that was supplied by the liquid supply mechanism 10.

A passageway forming member 70 is disposed in the vicinity of, among the plurality of optical elements that constitutes the projection optical system PL, the optical element 2 that contacts the liquid LQ. The passageway forming member 70 is an annular member provided above the substrate P (above the substrate stage PST) so that it surrounds the side surface of the optical element 2. A gap is provided between the optical element 2 and the passageway forming member 70, and the passageway forming member 70 is supported by a prescribed support mechanism so that it is vibrationally isolated from the optical element 2.

The passageway forming member 70 can be formed from, for example, aluminum, titanium, stainless steel, duralumin, or an alloy containing such. Alternatively, the passageway forming member 70 may be formed using a transparent member (an optical member) that has light transmitting properties, such as glass (silica glass).

The passageway forming member 70 is provided above the substrate P (above the substrate stage PST), and has liquid supply ports 12 (12A, 12B) disposed so that they oppose the front surface of the substrate P. In the present embodiment, the passageway forming member 70 has two liquid supply ports 12A, 12B. The liquid supply ports 12A, 12B are provided to a lower surface 70A of the passageway forming member 70.

In addition, the interior of the passageway forming member 70 has supply passageways corresponding to the liquid supply ports 12A, 12B. The plurality (two) of supply pipes 13A, 13B is provided corresponding to the liquid supply ports 12A, 12B and the supply passageways. Furthermore, one end portion of each of the supply passageways is connected to the liquid supply portion 11 via the supply pipes 13A, 13B, respectively, and the other end portion of each is connected to the liquid supply ports 12A, 12B, respectively.

In addition, flow controllers 16 (16A, 16B), which are called mass flow controllers and control the amount of liquid per unit of time fed from the liquid supply portion 11 to each of the liquid supply ports 12A, 12B, are provided along the two supply pipes 13A, 13B, respectively. The control of the amount of liquid by the flow controllers 16A, 16B is performed based on a command signal from the control apparatus CONT.

Furthermore, the passageway forming member 70 is provided above the substrate P (the substrate stage PST), and has liquid recovery ports 22 (22A, 22B) disposed so that they oppose the front surface of the substrate P.

In the present embodiment, the passageway forming member 70 has two liquid recovery ports 22A, 22B. The liquid recovery ports 22A, 22B are provided to the lower surface 70A of the passageway forming member 70.

In addition, the interior of the passageway forming member 70 has recovery passageways corresponding to the liquid recovery ports 22A, 22B. In addition, a plurality (two) of the recovery pipes 23A, 23B is provided corresponding to the liquid recovery ports 22A, 22B and the recovery passageways. Furthermore, one end portion of each of the recovery passageways is connected to the liquid recovery portion 21 via the recovery pipes 23A, 23B, respectively, and the other end portion of each is connected to the liquid recovery ports 22A, 22B, respectively.

In the present embodiment, the passageway forming member 70 constitutes a portion of both the liquid supply mechanism 10 and the liquid recovery mechanism 20. Furthermore, the liquid supply port 12A and the liquid supply port 12B, which constitute the liquid supply mechanism 10, are respectively provided at positions on opposite sides of the projection area AR1 of the projection optical system PL in the X axial direction so that the projection area AR1 is interposed therebetween, and the liquid recovery port 22A and the liquid recovery port 22B, which constitute the liquid recovery mechanism 20, are respectively provided on the outer sides of the liquid supply ports 12A, 12B of the liquid supply mechanism 10 with respect to the projection area AR1 of the projection optical system PL.

The control apparatus CONT controls the operation of the liquid supply portion 11 and the flow controllers 16. When supplying the liquid LQ onto the substrate P, the control apparatus CONT feeds the liquid LQ from the liquid supply portion 11 and supplies the liquid LQ onto the substrate P from the liquid supply ports 12A, 12B, which are provided above the substrate P, through the supply pipes 13A, 13B and the supply passageways. At this time, the liquid supply port 12A and the liquid supply port 12B are disposed respectively on opposite sides of the projection area AR1 of the projection optical system PL so that the projection area AR1 is interposed therebetween, and the liquid LQ can be supplied from both sides of the projection area AR1 through those liquid supply ports 12A, 12B. In addition, the amounts of the liquid LQ supplied per unit of time onto the substrate P from the liquid supply ports 12A, 12B can be separately controlled by the flow controllers 16A, 16B, which are respectively provided to the supply pipes 13A, 13B.

The control apparatus CONT controls the operation of recovering the liquid by the liquid recovery portion 21. The control apparatus CONT can control the amount of the liquid recovered per unit of time by the liquid recovery portion 21. The liquid LQ on the substrate P collected from the liquid recovery ports 22A, 22B, which are provided above the substrate P, is stored into the liquid recovery portion 21 via the recovery passageway of the passageway forming member 70 and the recovery pipes 23A, 23B.

Furthermore, in the present embodiment, the supply pipes 13A, 13B are connected to one liquid supply portion 11, but a plurality (herein, two) of liquid supply portions 11 corresponding to the number of the supply pipes may be provided, and the supply pipes 13A, 13B may be respectively connected to the plurality of liquid supply portions 11. In addition, the recovery pipes 23A, 23B are connected to one liquid recovery portion 21, but a plurality (herein, two) of the liquid recovery portions 21 corresponding to the number of recovery pipes may be provided, and the recovery pipes 23A, 23B may be respectively connected to the plurality of liquid recovery portions 21.

The liquid contact surface 2A of the optical element 2 of the projection optical system PL and the lower surface (liquid contact surface) 70A of the passageway forming member 70 are lyophilic (hydrophilic). In the present embodiment, the optical element 2 and the liquid contact surface of the passageway forming member 70 are lyophilically treated, and that lyophilic treatment makes the optical element 2 and the liquid contact surface of the passageway forming member 70 lyophilic. In other words, of the surfaces of the members that oppose the surface to be exposed (front surface) of the substrate P held by the substrate stage PST, at least the liquid contact surface is lyophilic. Because the liquid LQ in the present embodiment is water, which has a high polarity, the optical element 2 and the liquid contact surface of the passageway forming member 70 can be lyophilically treated (hydrophilically treated) to provide lyophilicity by, for example, forming a thin film with a substance that has a molecular structure having a high polarity, such as alcohol. Namely, if using water as the liquid LQ, then it is preferable to perform a process of providing a portion having a molecular structure that has a high polarity, such as the OH group, at the liquid contact surface. Alternatively, the liquid contact surface can be provided with a lyophilic material, such as $MgF_2$, $Al_2O_3$, $SiO_2$, and the like.

The lower surface (surface facing the substrate P side) 70A of the passageway forming member 70 is substantially a flat surface, the lower surface (liquid contact surface) 2A of the optical element 2 is also a flat surface, and the lower surface 70A of the passageway forming member 70 is substantially flush with the lower surface 2A of the optical element 2. Thereby, the immersion area AR2 can be satisfactorily formed within the desired area.

Furthermore, the mechanism for locally forming the immersion area AR2 on the substrate P (the substrate stage PST) is not limited to the one discussed above, and it is possible to adopt the mechanism disclosed in, for example, U.S. Patent Application Publication No. 2004/020782, which is hereby incorporated by reference in its entirety to the extent permitted by the national laws and regulations of the designated states (or elected states) designated by the present international patent application.

The detection apparatus 60 detects whether the liquid LQ is present on the substrate P or the substrate stage PST, which is disposed lower than the front end portion of the projection optical system PL, and has a light emitting portion 61 that emits a detection beam La, and a light receiving portion 62 disposed at a prescribed position with respect to the detection beam La. In the present embodiment, the light emitting portion 61 is provided to the main column 3 at a prescribed position, and the light receiving portion 62 is provided to the main column 3 at a position opposing the light emitting portion 61 so that the projection area AR1 of the projection optical system PL is interposed therebetween. The detection beam La emitted from the light emitting portion 61 of the detection apparatus 60 is set so that it is radiated substantially parallel to the front surface of the substrate P and the upper surface 43 of the substrate stage PST, which is substantially flush with the front surface of the substrate P. The detection beam La emitted from the light emitting portion 61 passes below the optical element 2, which is provided at the front end portion of the projection optical system PL.

Figure 2:
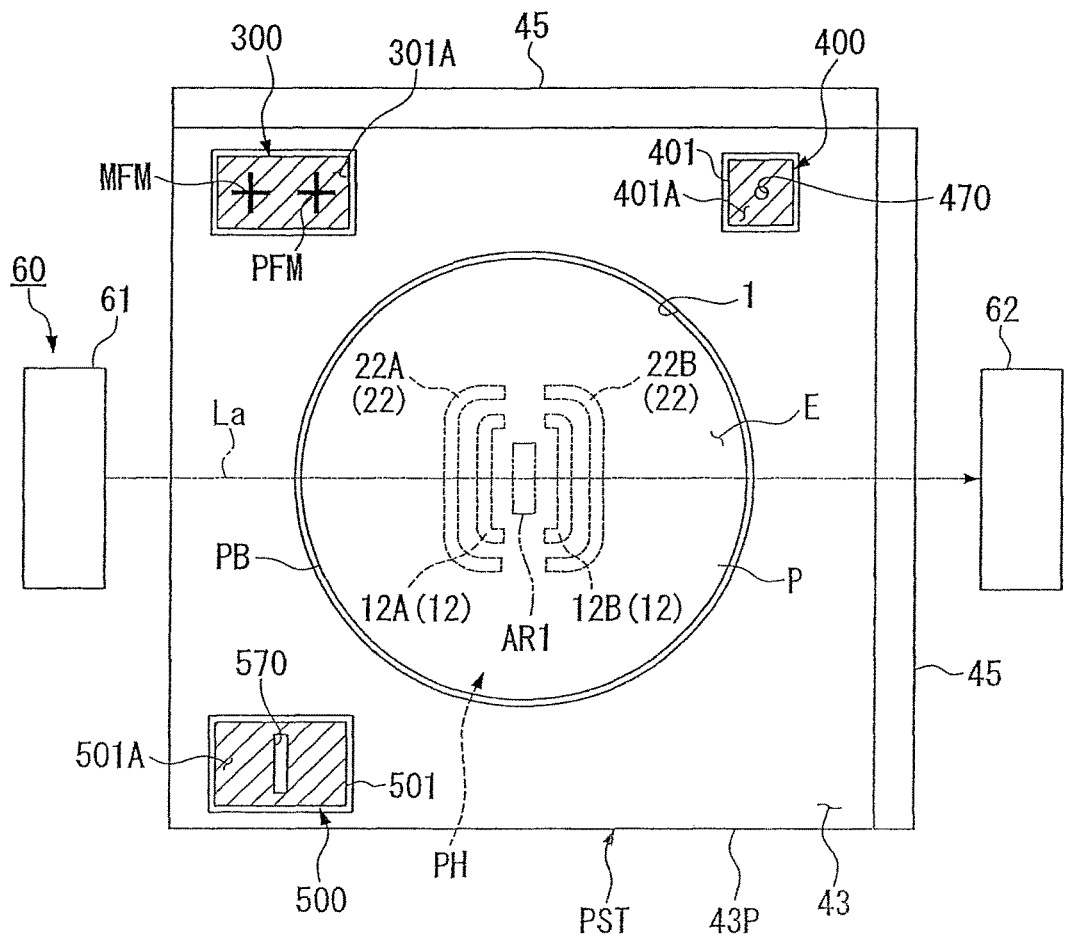
FIG. 2 is a plan view of a substrate stage, viewed from above.

FIG. 2 is a plan view of the substrate stage PST, which is capable of holding and moving the substrate P, viewed from above.

In FIG. 2, the movable mirrors 45 are respectively disposed at two mutually perpendicular edge portions of the substrate stage PST, which is rectangular in a plan view. In addition, the projection area AR1 of the projection optical system PL is set to a rectangular shape in a plan view, wherein the longitudinal direction is the Y axial direction and the latitudinal (i.e., shorter side) direction is the X axial direction.

Within the detection apparatus 60, the light emitting portion 61 that emits the detection beam La is fixed (in the present embodiment, to the main column 3) at a prescribed position away from the substrate stage PST on the −X side, and the light receiving portion 62 is fixed (to the main column 3) at a prescribed position away from the substrate stage PST on the +X side. Furthermore, the light emitting portion 61 of the detection apparatus 60 emits the detection beam La from the outer side of the substrate stage PST, and, based on the light receiving result of the light receiving portion 62, the detection apparatus 60 detects the liquid LQ on the substrate P and on the substrate stage PST. Namely, the detection apparatus 60 optically detects the liquid LQ from the outer side of the substrate stage PST, which is capable of holding and moving the substrate P.

The recessed portion 1 is formed at substantially the center portion of the substrate stage PST, and the substrate holder PH, which holds the substrate P, is disposed in the recessed portion 1. In the substrate stage PST, the upper surface 43 outside of the recessed portion 1 is set at substantially the same height (flush with) as the front surface of the substrate P held by the substrate holder PH. Because the upper surface 43, which is substantially flush with the front surface of the substrate P, is provided around the substrate P, it is possible to hold the liquid LQ on the image plane side of the projection optical system PL and thereby satisfactorily form the immersion area AR2, even when performing an immersion exposure of an edge area E of the substrate P.

In the present embodiment, the detection beam La is set below the optical element 2 at the front end portion of the projection optical system PL, so that it passes through the projection area AR1 of the projection optical system PL, i.e., the optical path of the exposure light EL. More specifically, the detection beam La is set so that it passes between the optical element 2 and the substrate P (the substrate stage PST). Furthermore, the detection beam La may be provided so that it passes through an area outside of the optical path of the exposure light EL. Furthermore, the detection beam La is emitted substantially parallel to the front surface of the substrate P and the upper surface 43 of the substrate stage PST.

In addition, the upper surface 43 of the substrate stage PST is given a liquid repellant treatment and is therefore liquid repellant. Examples of liquid repellent treatments for the upper surface 43 include coating it with a liquid repellent material, e.g., a fluororesin material or an acrylic resin material, as well as affixing a thin film made of the abovementioned liquid repellent material. A material that is insoluble in the liquid LQ is used as the liquid repellent material for providing liquid repellency. Furthermore, all or portion of the substrate stage PST may be made of a liquid repellent material, such as a fluororesin such as polytetrafluoroethylene (Teflon™). In addition, a liquid repellent plate member, which is made of the abovementioned polytetrafluoroethylene and the like, may be replaceably disposed on the upper surface of the substrate stage PST. In the present embodiment, a plate member 43P, which has the upper surface 43, is replaceably disposed on the substrate stage PST.

Furthermore, a gap is formed between the plate member 43P and a side surface PB of the substrate P, which is held by the substrate holder PH; however, this is a small gap on the order of a few millimeters, which suppresses the problem of the liquid LQ entering that gap, due to the action of the surface tension of the liquid LQ and the like.

The liquid supply port 12A and the liquid supply port 12B are respectively provided on opposite sides of the projection area AR1 of the projection optical system PL so that the projection area AR1 is interposed therebetween in the X axial direction (the scanning direction). Specifically, the liquid supply port 12A is provided to the lower surface 70A of the passageway forming member 70 on one side (the −X side) of the projection area AR1 in the scanning direction, and the liquid supply port 12B is provided on the other side (the +X side). In other words, the liquid supply port 12A and the liquid supply port 12B are provided respectively on opposite sides of and near to the projection area AR1 so that it is interposed therebetween in the scanning direction (the Y axis). The liquid supply ports 12A, 12B are each formed as a substantially U-shaped (arcuate) slit (in a plan view) extending in the Y axial direction. Furthermore, the length of each of the liquid supply ports 12A, 12B in the Y axial direction is at least longer than the length of the projection area AR1 in the Y axial direction. The liquid supply ports 12A, 12B are provided so that they surround at least the projection area AR1. The liquid supply mechanism 10 is capable of simultaneously supplying the liquid LQ to both sides of the projection area AR1 through the liquid supply ports 12A, 12B.

The liquid recovery port 22A and the liquid recovery port 22B are respectively provided on the outer sides of the liquid supply ports 12A, 12B of the liquid supply mechanism 10 with respect to the projection area AR1 of the projection optical system PL, and are respectively provided on opposite sides of the projection area AR1 of the projection optical system PL so that the projection area AR1 is interposed between the liquid recovery ports 22A, 22B in the X axial direction (the scanning direction). Specifically, the liquid recovery port 22A is provided to the lower surface 70A of the passageway forming member 70 on one side (the −X side) of the projection area AR1 in the scanning direction, and the liquid recovery port 22B is provided on the other side (the +X side). The liquid recovery ports 22A, 22B are each formed in a substantially U-shaped (arcuate) slit (in a plan view) extending in the Y axial direction. The liquid recovery ports 22A, 22B are provided so that they surround the projection area AR1 of the projection optical system PL as well as the liquid supply ports 12A, 12B.

Furthermore, the immersion area AR2, which is filled with the liquid LQ, is locally formed on portion of the substrate P and within an area that is substantially surrounded by the two liquid recovery ports 22A, 22B so that the projection area AR1 is included therein. Furthermore, the immersion area AR2 should cover at least the projection area AR1, but the entire area surrounded by at least the two liquid recovery ports 22A, 22B does not need to be an immersion area.

Furthermore, the present embodiment is constituted so that one liquid supply port 12 is provided on each side of the projection area AR1, but a plurality thereof may be provided, the number of which is arbitrary. Likewise, a plurality of the liquid recovery ports 22 may be provided. In addition, the liquid supply ports 12, which are provided on opposite sides of the projection area AR1, are formed so that they are substantially the same size (length), but may be of a size different from one another. Likewise, the liquid recovery ports 22, which are provided on opposite sides of the projection area AR1, may be of mutually differing sizes. In addition, the slit width of the supply ports 12 and the slit width of the recovery ports 22 may be the same, the slit width of the recovery ports 22 may be larger than the slit width of the supply ports 12, or, conversely, the slit width of the recovery ports 22 may be smaller than the slit width of the supply ports 12.

In addition, a fiducial member 300 is disposed on the substrate stage PST at a prescribed position on the outer side of the substrate P. The fiducial member 300 is provided with a prescribed positional relationship between a fiducial mark PFM detected by the substrate alignment system constituted as disclosed in, for example, Japanese Published Unexamined Patent Application No. H4-65603, and a fiducial mark MFM detected by the mask alignment system constituted as disclosed in, for example, Japanese Published Unexamined Patent Application No. H7-176468. An upper surface 301A of the fiducial member 300 is substantially a flat surface and is provided at substantially the same height as (flush with) the front surface of the substrate P and the upper surface 43 of the substrate stage PST. The substrate alignment system, which is provided in the vicinity of the substrate stage PST, also detects alignment marks on the substrate P. In addition, the mask alignment system is provided in the vicinity of the mask stage MST, and detects, through the mask M and the projection optical system PL, the fiducial mark MFM on the substrate stage PST.

In addition, a luminous flux intensity nonuniformity sensor 400 of the type disclosed in, for example, Japanese Published Patent Application No. S57-117238 is disposed as a measurement sensor on the substrate stage PST at a prescribed position on the outer side of the substrate P. The luminous flux intensity nonuniformity sensor 400 has an upper plate 401, which is rectangular in a plan view. An upper surface 401A of the upper plate 401 is substantially a flat surface and is provided at substantially the same height as (flush with) the front surface of the substrate P and the upper surface 43 of the substrate stage PST. A pinhole portion 470, wherethrough light can pass, is provided in the upper surface 401A of the upper plate 401. The upper surface 401A that is outside of the pinhole portion 470 is covered with a shielding material, such as chrome.

In addition, a spatial image measuring sensor 500 of the type disclosed in, for example, Japanese Published Patent Application No. 2002-14005 is provided as a measurement sensor on the substrate stage PST at a prescribed position on the outer side of the substrate P. The spatial image measuring sensor 500 has an upper plate 501, which is rectangular in a plan view. An upper surface 501A of the upper plate 501 is substantially a flat surface and is provided at substantially the same height as (flush with) the front surface of the substrate P and the upper surface 43 of the substrate stage PST. A slit portion 570, wherethrough light can pass, is provided in the upper surface 501A of the upper plate 501. The upper surface 501A that is outside of the slit portion 570 is covered with a shielding material, such as chrome.

In addition, although not shown, an irradiance sensor (an illuminance sensor) of the type disclosed in, for example, Japanese Published Patent Application No. H11-16816 is also provided on the substrate stage PST, and an upper surface of an upper plate of that irradiance sensor is provided at substantially the same height as (flush with) the front surface of the substrate P and the upper surface 43 of the substrate stage PST.

Thus, the upper surface 43 of the substrate stage PST is disposed at substantially the same height as (flush with) both the fiducial member 300 and the sensors 400, 500, and is liquid-repellent. Furthermore, the upper surface of each movable mirror 45 is also disposed at substantially the same height as (flush with) the upper surface 43 of the substrate stage PST, and both the upper surface and the reflecting surface of each movable mirror 45 is liquid-repellent. Thereby, it is not only possible to increase the range of movement of the substrate stage PST in the state wherein the immersion area AR2 is formed, but, even if the liquid adheres to the fiducial member 300, the sensors 400, 500, the upper surfaces or reflecting surfaces of the movable mirrors 45 or the like, it is also possible to easily eliminate that adhered liquid.

Furthermore, the fiducial member 300, the upper plates 401, 501, and the like are constituted so that they are detachable from the substrate stage PST, and can be replaced if, for example, the liquid repellency of their upper surfaces deteriorates.

Figure 3:
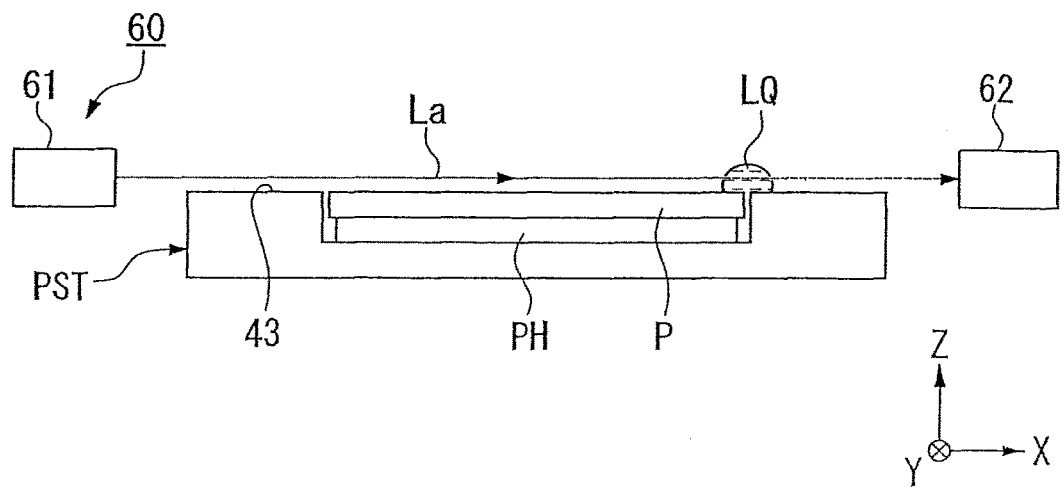
FIG. 3 is a side view that depicts one embodiment of a detection apparatus according to the present invention.

FIG. 3 is a side view that depicts one example of a state wherein the detection apparatus 60 is detecting the liquid LQ. As depicted in FIG. 3, the detection apparatus 60 emits the detection beam La substantially parallel to the upper surface 43 of the substrate stage PST and the front surface of the substrate P, which is held by the substrate holder PH. Furthermore, the detection apparatus 60 detects, based on the light receiving result of the light receiving portion 62, whether the liquid LQ is present on the substrate P or the substrate stage PST.

The light emitting portion 61 and the light receiving portion 62 are mutually opposing, and the detection beam La emitted from the light emitting portion 61 arrives at the light receiving portion 62 which receives a prescribed quantity (intensity) of the relevant light. At this time, if, for example, a liquid droplet (a water droplet) of the liquid LQ is disposed on the substrate P or on the substrate stage PST, as depicted in FIG. 3, and the liquid LQ is irradiated by the detection beam La, then that detection beam La is refracted, scattered, or absorbed by the liquid LQ. Accordingly, if the liquid LQ is present in the optical path of the detection beam La, then the light quantity (light intensity) received by the light receiving portion 62 decreases, or the detection beam La no longer arrives at the light receiving portion 62. Accordingly, the detection apparatus 60 can detect, based on the light receiving result (the amount of light received) of the light receiving portion 62, whether the liquid LQ is present in the optical path of the detection beam La. Furthermore, by detecting whether the liquid LQ is present in the optical path of the detection beam La, the detection apparatus 60 can detect whether the liquid LQ is present on the substrate stage PST or on the substrate P, which are disposed lower than the front end portion of the projection optical system PL.

In addition, by emitting the detection beam La while moving the detection beam La of the detection apparatus 60 and the substrate stage PST relative to one another, it is possible to detect whether the liquid LQ is present in a comparatively large area on the substrate stage PST, including on the substrate P.

Furthermore, by emitting the detection beam La while moving the detection beam La and the substrate stage PST relative to one another in a state wherein the liquid LQ is disposed on (or adhering to) the substrate P or the substrate stage PST, it is possible to derive the position of the liquid LQ on the substrate P or the substrate stage PST. In other words, the detection beam La is emitted while moving the substrate stage PST as well as while monitoring the position thereof using the laser interferometer 46. Based on the position measurement result of the laser interferometer 46 and the light receiving result of the light receiving portion 62 of the detection apparatus 60, the control apparatus CONT can derive the position of the liquid LQ in the coordinate system stipulated by the laser interferometer 46.

In addition, in FIG. 3, a constitution is adopted wherein the light emitting portion 61 and the light receiving portion 62 are respectively disposed on opposite sides of the substrate stage PST so that the substrate stage PST is interposed therebetween in the X axial direction, and the position of the liquid LQ on the substrate P or on the substrate stage PST in the Y axial direction is detected by moving the substrate stage PST in the Y axial direction while emitting the detection beam La from the light emitting portion 61; however, by respectively disposing the light emitting portion 61 and the light receiving portion 62 on opposite sides of the substrate stage PST so that the substrate stage PST is interposed therebetween in the Y axial direction, both the position and the area of the liquid LQ on the substrate P or the substrate stage PST in the X axial direction can be detected by moving the substrate stage PST in the X axial direction while emitting the detection beam La from the light emitting portion 61.

Figure 4:
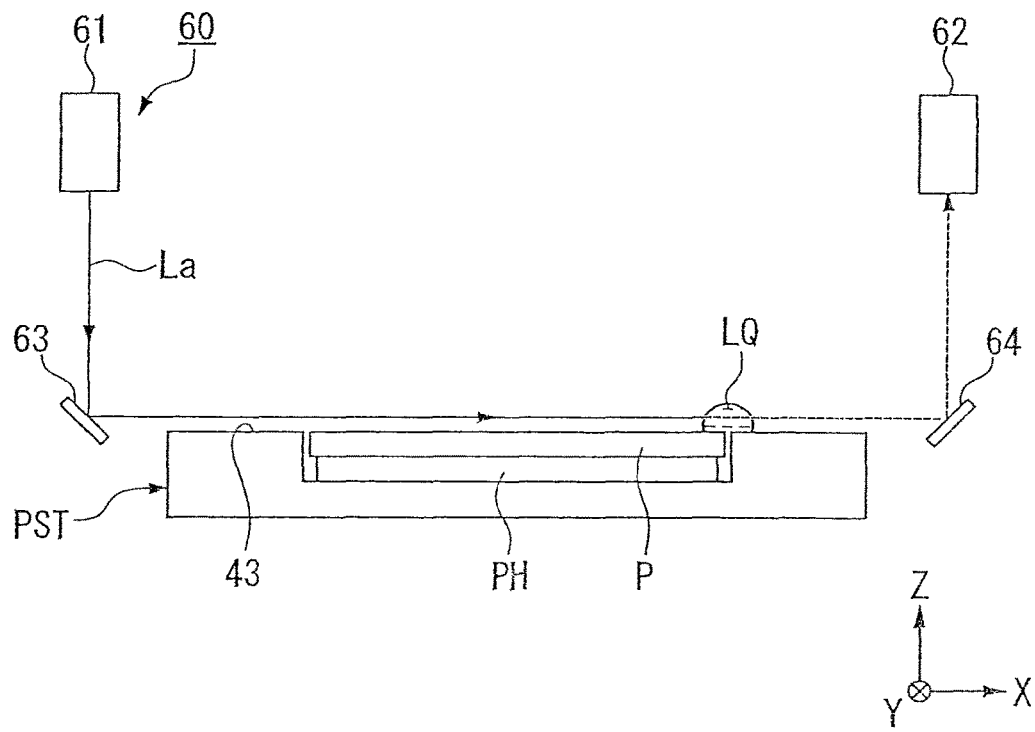
FIG. 4 is a side view that depicts another embodiment of the detection apparatus according to the present invention.

In addition, in FIG. 3, a constitution is adopted wherein the light emitting portion 61 and the light receiving portion 62 of the detection apparatus 60 are disposed opposing one another; however, as depicted in FIG. 4, optical members 63, 64, which serve as bending portions that bend the optical path of the detection beam La, may be provided in the optical path of the detection beam La of the detection apparatus 60. In so doing, the detection beam La can be emitted to a desired position while disposing the light emitting portion 61 and the light receiving portion 62 at arbitrary positions, which can increase the degrees of freedom of the arrangement of the various members and equipment that constitute the detection apparatus 60, as well as the degrees of freedom of the overall design of the exposure apparatus EX.

Furthermore, the detection beam La emitted from the light emitting portion 61 may be incident onto the incident end of an optical fiber, and the detection beam La that emitted from the output end of that optical fiber may be emitted. In addition, an optical fiber may be connected to the light receiving portion 62, and the detection beam La may be received thereby through that optical fiber.

Figure 5:
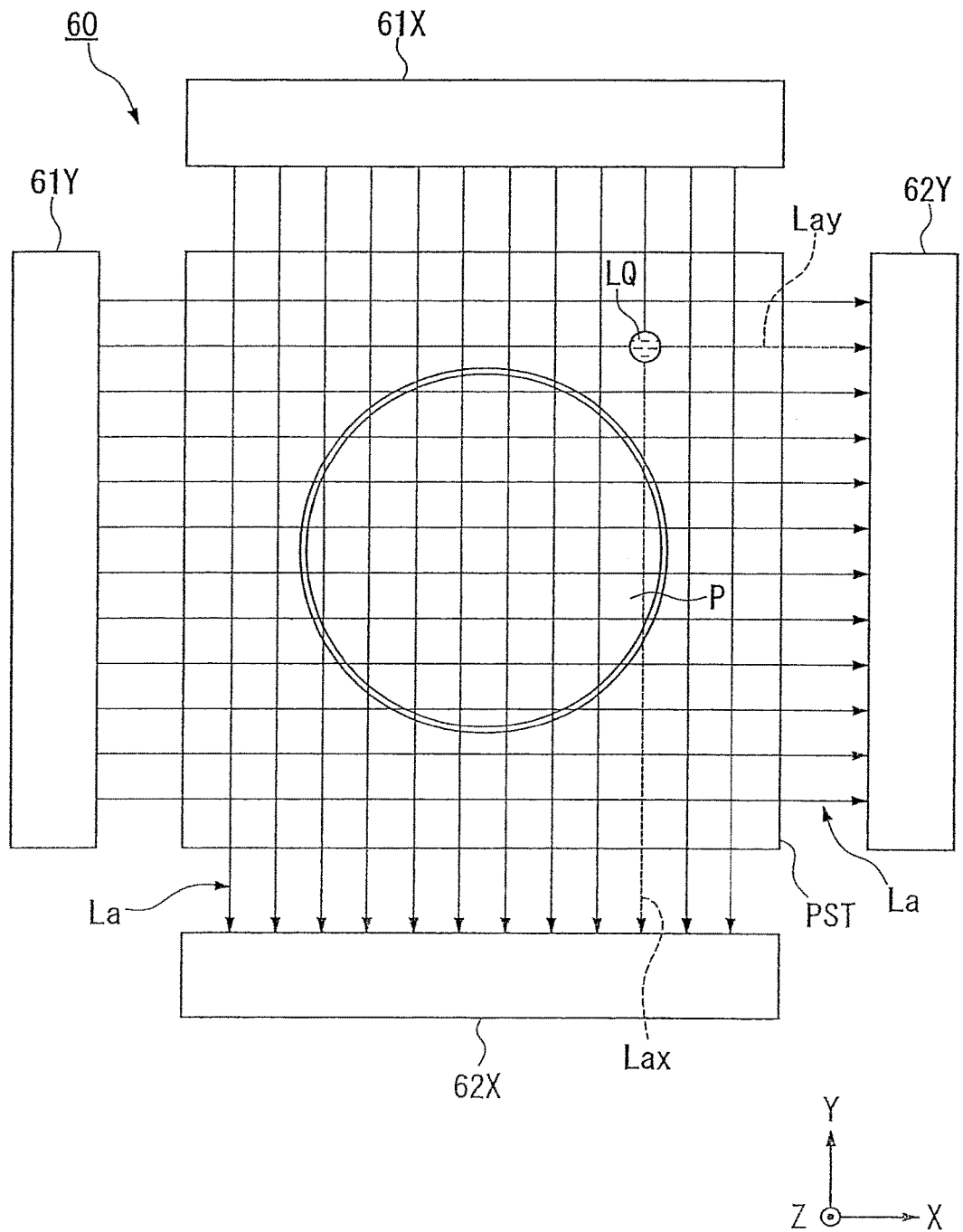
FIG. 5 is a plan view that depicts another embodiment of the detection apparatus according to the present invention.

In addition, in the constitution discussed above, the position of the liquid LQ on the substrate P or on the substrate stage PST is detected by performing detection while moving the substrate P and the substrate stage PST with respect to the detection beam La of the detection apparatus 60; however, as depicted in FIG. 5, the position of the liquid LQ on the substrate P or on the substrate stage PST can also be derived by emitting a plurality of detection beams La in a two dimensional matrix.

In FIG. 5, the detection apparatus 60 has: a first light emitting portion 61X, which is disposed on the +Y side of the substrate stage PST, that emits a plurality of detection beams La arrayed in the X axial direction; a first light receiving portion 62X, which is disposed on the −Y side of the substrate stage PST at a prescribed position with respect to the detection beams La emitted from the first light emitting portion 61X; a second light emitting portion 61Y, which is disposed on the −X side of the substrate stage PST, that emits a plurality of detection beams La arrayed in the Y axial direction; and a second light receiving portion 62Y, which is disposed on the +X side of the substrate stage PST at a prescribed position with respect to the detection beams La emitted from the second light emitting portion 61Y. The first light receiving portion 62X has a plurality of light receiving devices corresponding to the plurality of detection beams La emitted from the first light emitting portion 61X; likewise, the second light receiving portion 62Y has a plurality of light receiving devices corresponding to the plurality of detection beams La emitted from the second light emitting portion 61Y.

The detection beams La emitted from the first light emitting portion 61X and the detection beams La emitted from the second light emitting portion 61Y are each emitted substantially parallel to the front surface of the substrate P and the upper surface 43 of the substrate stage PST, and the optical paths of these detection beams La are provided in a matrix configuration in a plan view.

Here, as depicted in FIG. 5, if the liquid LQ is present in the optical path of a specific detection beam Lax among the plurality of detection beams La emitted from the first light emitting portion 61X, then the light quantity received by the light receiving device, which corresponds to that detection beam Lax among the plurality of light receiving devices of the first light receiving portion 62X, will decrease. Likewise, if the liquid LQ is present in the optical path of a specific detection beam Lay among the plurality of detection beams La emitted from the second light emitting portion 61Y, then the light quantity received by the light receiving device, which corresponds to that detection beam Lay among the plurality of light receiving devices of the second light receiving portion 62Y, will decrease. The light receiving results of the first and second light receiving portions 62X, 62Y are outputted to the control apparatus CONT. Based on these light receiving results from the first and second light receiving portions 62X, 62Y, the control apparatus CONT can specify that the position of the liquid LQ is in the vicinity of the intersection of the detection beam Lax and the detection beam Lay. At this point, because the positional information of the light receiving devices that receive the detection beams Lax, Lay is known in advance based on design values and the like, the control apparatus CONT can derive, based on the positional information of the light receiving devices that received the detection beams Lax, Lay, the position of the liquid LQ on the substrate P or on the substrate stage PST.

Figure 6:
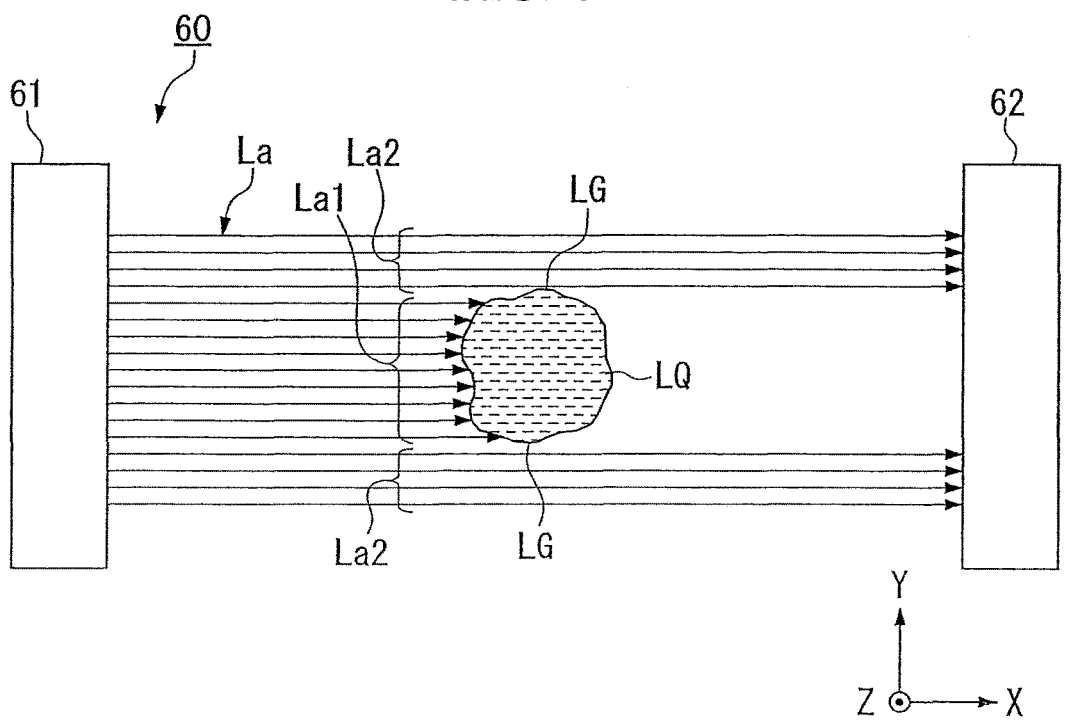
FIG. 6 is a plan view that depicts another embodiment of the detection apparatus according to the present invention.

In addition, as depicted in FIG. 6, the detection apparatus 60 can derive, based on the light receiving results of the light receiving portion 62 produced when the detection beams La were emitted from the light emitting portion 61 to each of a plurality of positions, the size of the liquid LQ (the size of the area in which the liquid LQ is disposed) present on the substrate P and on the substrate stage PST. In other words, if the liquid LQ is disposed in a prescribed area on the substrate stage PST (or on the substrate P), then the light emitting portion 61 emits the detection beams La to a plurality of positions that includes an edge portion LG of the liquid LQ. In the example depicted in FIG. 6, the light emitting portion 61 emits the plurality of detection beams La, which are arrayed in the Y axial direction, along the X axial direction.

The light receiving portion 62 has a plurality of light receiving devices corresponding to the plurality of detection beams La. The positional information of these light receiving devices is known in advance by, for example, design values. If the liquid LQ is irradiated by some of the plurality of detection beams La emitted from the light emitting portion 61, i.e., detection beams La1, then the detection beams La1 do not arrive at the light receiving devices of the light receiving portion 62 corresponding to those detection beams La1, or the light quantities received by those light receiving devices decrease. On the other hand, the remaining detection beams La, i.e., detection beams La1, arrive at the light receiving portion 62 without passing through the liquid LQ. Accordingly, the detection apparatus 60 can derive, based on the light receiving results of the light receiving devices of the light receiving portion 62 that received the detection beams La1 and based on the positional information of those light receiving devices, the size of the liquid LQ (the area in which the liquid LQ is disposed).

Furthermore, in the example depicted in FIG. 6, the detection apparatus 60 irradiates the liquid LQ with the detection beams La from the X axial direction, and consequently the size of the liquid LQ (the area in which the liquid LQ is disposed) in the Y axial direction can be derived; furthermore, by irradiating the liquid LQ with the detection beams La from the Y axial direction, the size of the liquid LQ in the X axial direction can be derived. In addition, it is also possible, of course, to emit the detection beams La within the XY plane from a direction diagonal to the X axis (as well as the Y axis) direction. Furthermore, by arithmetically processing the light receiving results produced when the liquid LQ was irradiated with the detection beams La from a plurality of directions, the detection apparatus 60 (or the control apparatus CONT) can derive the shape of the liquid LQ (the area in which the liquid LQ is disposed).

Furthermore, in the example explained referencing FIG. 6, the light emitting portion 61 emits the plurality of detection beams La all at once; however, as was explained referencing, for example, FIG. 3, it is also possible to emit one detection beam La (or a prescribed plurality thereof) from the light emitting portion 61 while moving the substrate stage PST as well as while monitoring the position thereof using the laser interferometer 46, and to derive the size or shape of the liquid LQ based on the light receiving result of the light receiving portion 62 produced when that detection beam La was emitted. In that case, the detection apparatus 60 (or the control apparatus CONT) derives at least the size or the shape of the liquid LQ by arithmetically processing the plurality of light receiving results of the light receiving portion 62 corresponding to a plurality of positions of the substrate stage PST.

In addition, in the example explained referencing FIG. 6, the light emitting portion 61 emits a plurality of arrayed detection beams La, but it may emit a sheet light beam that covers the liquid LQ. A so-called laser sheet light generated by, for example, passing the laser light beam emitted from a laser light source through an optical system that has a pinhole or a cylindrical lens, can be used as the sheet light beam.

Figure 7:
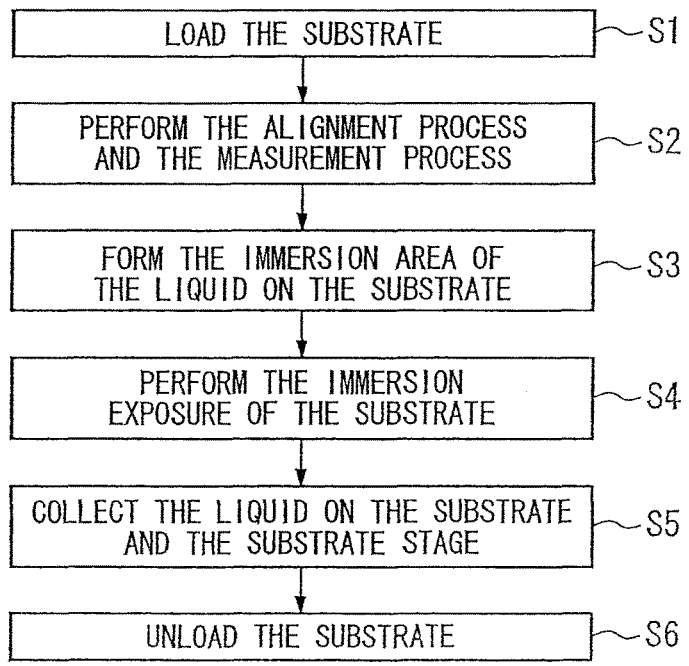
FIG. 7 is a flowchart diagram that depicts one example of an exposure operation of the exposure apparatus.

The following explains a method of using the exposure apparatus EX that has the constitution discussed above to expose the substrate P with the pattern image of the mask M, referencing the flowchart diagram depicted in FIG. 7.

First, the mask M is loaded on the mask stage MST and the substrate P, which is the exposure target, is loaded on the substrate stage PST (step S1).

When loading the substrate P on the substrate stage PST, the control apparatus CONT moves the substrate stage PST to a load position, which is set to a position away from the projection optical system PL. The substrate P is loaded at the load position by a conveyor system (loading apparatus), which is not shown.

After the substrate P is loaded on the substrate stage PST, the alignment process and the measurement process are performed on the substrate P (step S2).

In the alignment process, the control apparatus CONT uses, for example, the abovementioned substrate alignment system to detect the fiducial mark PFM formed on the fiducial member 300, and uses the mask alignment system to detect, through the projection optical system PL, the fiducial mark MFM formed on the fiducial member 300; thereby, the control apparatus CONT derives a baseline quantity that is the distance (positional relationship) between a detection reference position of the substrate alignment system within the coordinate system that stipulates the movement of the substrate stage PST, and the projection position of the pattern image of the mask M. When detecting the fiducial mark MFM on the fiducial member 300 using the mask alignment system, the control apparatus CONT supplies and recovers the liquid LQ using the liquid supply mechanism 10 and the liquid recovery mechanism 20 in a state wherein the projection optical system PL and the upper surface 301A of the fiducial member 300 oppose one another, thereby forming the immersion area AR2 of the liquid LQ between the optical element 2 at the front end portion of the projection optical system PL and the upper surface 301A of the fiducial member 300. Furthermore, the control apparatus CONT detects, through the projection optical system PL and the liquid LQ, the fiducial mark MFM on the fiducial member 300 using the mask alignment system.

After the detection of the fiducial mark MFM has finished, the control apparatus CONT uses the liquid recovery mechanism 20 or a prescribed liquid recovery mechanism provided separately therefrom to collect the liquid LQ in the immersion area AR2 formed on the upper surface 301A of the fiducial member 300.

When superimposingly exposing the substrate P, the projection position of the pattern image of the mask M can be aligned with a shot region by using the substrate alignment system to detect the alignment mark formed on that shot region, which is, for example, the exposure target area on the substrate P, deriving the positional information (deviation) of the shot region with respect to the detection reference position of the substrate alignment system, and then moving the substrate stage PST by the sum of the above-described baseline quantity and the deviation of the shot region that was derived by the substrate alignment system, from the current substrate stage PST position.

In addition, in the measurement process, the control apparatus CONT forms the immersion area AR2 of the liquid LQ between the optical element 2 at the front end portion of the projection optical system PL and the upper surface 401A of the upper plate 401 by supplying and recovering the liquid LQ using the liquid supply mechanism 10 and the liquid recovery mechanism 20 in a state wherein, for example, the projection optical system PL and the upper plate 401 of the luminous flux intensity nonuniformity sensor 400 are disposed so that they oppose one another. Furthermore, the control apparatus CONT emits the exposure light EL from the illumination optical system IL and detects, through the projection optical system PL and the liquid LQ, the luminous flux intensity distribution of the exposure light EL in the projection area AR1 by the luminous flux intensity nonuniformity sensor 400. The control apparatus CONT appropriately corrects the radiation distribution of the exposure light EL based on the detection result of the luminous flux intensity nonuniformity sensor 400 so that the luminous flux intensity distribution of the exposure light EL in the projection area AR1 of the projection optical system PL reaches a desired state.

After the detection of the luminous flux intensity distribution of the exposure light EL is finished, the control apparatus CONT uses the liquid recovery mechanism 20, or a prescribed liquid recovery mechanism provided separately therefrom, to collect the liquid LQ in the immersion area AR2 formed on the upper surface 401A of the upper plate 401 of the luminous flux intensity nonuniformity sensor 400.

In addition, the control apparatus CONT, in a state wherein the projection optical system PL and the upper plate 501 of the spatial image measuring sensor 500 are disposed so that they oppose one another, uses the liquid supply mechanism 10 and the liquid recovery mechanism 20 to supply and recover the liquid LQ so as to form the immersion area AR2 of the liquid LQ between the optical element 2 at the front end portion of the projection optical system PL and the upper surface 501A of the upper plate 501. Furthermore, the control apparatus CONT emits the exposure light EL from the illumination optical system IL and measures, through the projection optical system PL and the liquid LQ, the spatial image using the spatial image measuring sensor 500. Based on the measurement result of the spatial image measuring sensor 500, the control apparatus CONT appropriately corrects the image characteristics of the projection optical system PL so that the characteristics of the image formed through the projection optical system PL and the liquid LQ reach the desired state.

After the spatial image measurement is finished, the control apparatus CONT uses the liquid recovery mechanism 20, or a prescribed liquid recovery mechanism provided separately therefrom, to collect the liquid LQ in the immersion area AR2 formed on the upper surface 501A of the upper plate 501 of the spatial image measuring sensor 500.

Similarly, the control apparatus CONT, in a state wherein the immersion area AR2 of the liquid LQ is formed between the projection optical system PL and the luminous flux intensity sensor (not shown) discussed above, measures the amount of radiation of the exposure light EL (the luminous flux intensity) on the image plane side of the projection optical system PL and, based on that measurement result, appropriately corrects the luminous flux intensity of the exposure light EL. Furthermore, after the measurement process that uses the luminous flux intensity sensor is finished, the control apparatus CONT uses the liquid recovery mechanism 20 and the like to collect the liquid LQ on the upper plate of the luminous flux intensity sensor.

Incidentally, after the measurement process through the liquid LQ using, for example, the abovementioned fiducial member 300, the luminous flux intensity nonuniformity sensor 400, the spatial image measuring sensor 500, or the luminous flux intensity sensor, is finished and the liquid LQ is recovered, there is a possibility that the liquid LQ will remain on (adhere to) the upper surface 301A of the fiducial member 300 and the like. Therefore, after performing the work of recovering the liquid LQ, the control apparatus CONT uses the detection apparatus 60 to detect whether the liquid LQ is present on the substrate stage PST, including the abovementioned upper surfaces 301A, 401A, 501A, and the like.

For example, after the liquid LQ on the upper surface 301A of the fiducial member 300 is collected, the control apparatus CONT uses the detection apparatus 60 to detect whether the liquid LQ is present on the fiducial member 300. Based on the detection results of the detection apparatus 60, the control apparatus CONT controls the operation of the liquid recovery mechanism 20. Specifically, if it is determined that the liquid LQ is present on the fiducial member 300, then the control apparatus CONT uses the liquid recovery mechanism 20 and the like to once again perform the operation of collecting the liquid LQ present on the fiducial member 300. Subsequently, the control apparatus CONT uses the detection apparatus 60 to once again detect whether the liquid LQ is present on the fiducial member 300. Furthermore, the control apparatus CONT repetitively performs the detection operation using the detection apparatus 60 and the liquid recovery operation by the liquid recovery mechanism 20 until the liquid LQ is no longer detected by the detection apparatus 60. Alternatively, the control apparatus CONT can perform the liquid detection operation by using the detection apparatus 60 and the liquid recovery operation by the liquid recovery mechanism 20 in parallel.

In this case, the control apparatus CONT continues the liquid recovery operation by the liquid recovery mechanism 20 until the detection apparatus 60 no longer detects the liquid LQ. This avoids the problem wherein the liquid LQ remains on the substrate stage PST, including on the fiducial member 300, after the process of performing the measurement through the liquid LQ is finished. However, if it is determined based on the detection results of the detection apparatus 60 that the recovery of the liquid LQ was completed by a single liquid recovery procedure, then the detection apparatus 60 does not need to perform detection again.

In addition, when the immersion area AR2 of the liquid LQ has been formed on the upper surface 301A of the fiducial member 300, there is a possibility that the liquid LQ will scatter or flow out to the surroundings of the immersion area AR2. Accordingly, the control apparatus CONT uses the detection apparatus 60 to detect whether the liquid LQ is present on, for example, the upper surface 43 of the substrate stage PST as well as on the fiducial member 300. In addition, if it is determined that the liquid LQ is present on the upper surface 43 of the substrate stage PST, then the control apparatus CONT uses the liquid recovery mechanism 20 to collect the liquid LQ present on the upper surface 43.

Therefore, as discussed above, the detection apparatus 60 can derive the positional information of the liquid LQ present on the substrate stage PST (the fiducial member 300). Accordingly, the control apparatus CONT can perform the liquid recovery operation in a state wherein the liquid recovery ports 22 of the liquid recovery mechanism 20 are aligned with the position where the liquid LQ is present by moving the substrate stage PST based on the positional information of the liquid LQ. Thereby, it is possible to improve the throughput of the liquid recovery operation. Of course, the liquid may be recovered while moving the substrate stage PST with respect to the liquid recovery ports 22 so that the entire area of the upper surface 43 of the substrate stage PST passes below the liquid recovery ports 22.

In addition, as discussed above, the detection apparatus 60 can derive information related to the size of the liquid LQ on the substrate stage PST (the fiducial member 300), as well as to the amount of the liquid LQ. Accordingly, based on the information related to the size (amount) of the liquid LQ, the control apparatus CONT can control the recovery (i.e., collecting) force (suction force) of the liquid recovery mechanism 20 or the recovery time (suction time) thereof. For example, if the size of the liquid LQ is large (if the amount is great), then the control apparatus CONT increases the recovery force of the liquid recovery mechanism 20, or lengthens the recovery time.

Thereby, the liquid LQ is satisfactorily recovered. On the other hand, if the size of the liquid LQ is small (if the amount is small), then the control apparatus CONT reduces the recovery force of the liquid recovery mechanism 20, or shortens the recovery time. The throughput of the liquid recovery operation is thereby improved.

In addition, if it is determined based on the detection results of the detection apparatus 60 that the amount of the liquid LQ present on the fiducial member 300 (on the substrate stage PST) is less than a preset threshold value, or if it is determined that the liquid LQ is present at a position (on an object) that has little impact on the measurement process or the exposure process, then the control apparatus CONT can omit performing the operation of recovering the liquid LQ using the liquid recovery mechanism 20, even if the liquid LQ is present.

In addition, it is also possible to perform the detection operation by using the detection apparatus 60 in parallel with the measurement operation in a state wherein the immersion area AR2 of the liquid LQ is formed on the upper surface 301A of the fiducial member 300. For example, the detection apparatus 60 emits the detection beams La between the upper surface 301A and the optical element 2 of the projection optical system PL during the measurement operation in a state wherein the immersion area AR2 of the liquid LQ is formed on the upper surface 301A. It is thereby possible to detect whether a gap between the optical element 2 of the projection optical system PL and the upper surface 301A of the fiducial member 300 is filled with the liquid LQ. Furthermore, if it is determined that the gap is not filled with the liquid LQ, then the control apparatus CONT takes appropriate measures, such as, for example, stopping the measurement operation that uses the fiducial member 300, or modifying, for example, the liquid supply condition of the liquid supply mechanism 10 or the liquid recovery condition of the liquid recovery mechanism 20 so as to fill the gap with the liquid LQ.

In addition, the detection beams La may be made to pass the outer side of the immersion area AR2 of the liquid LQ formed on the upper surface 301A of the fiducial member 300, and the measurement operation may be performed using the fiducial member 300.

Thereby, if an abnormality occurs such as, for example, the outflow of the liquid LQ from the upper surface 301A of the fiducial member 300, then the detection apparatus 60 can detect that outflow of the liquid LQ. If it has been determined based on the detection results of the detection apparatus 60 that an abnormality has occurred, such as the outflow of the liquid LQ, then the control apparatus CONT, for example, reduces the amount of the liquid supplied per unit of time by the liquid supply mechanism 10, or stops the supply of the liquid LQ by the liquid supply mechanism 10. If the supply of the liquid LQ by the liquid supply mechanism 10 is stopped, then the drive of the liquid supply portion 11 may be stopped, or the passageways of the supply pipes 13A, 13B may be closed using the valves 15. Alternatively, the control apparatus CONT may increase the amount of the liquid recovered per unit of time by the liquid recovery mechanism 20, or stop the movement of the substrate stage PST.

As described above, the operation of the liquid supply mechanism 10, the liquid recovery mechanism 20, and the like can be controlled based on the detection results of the detection apparatus 60, and the immersion area AR2 can thereby be satisfactorily formed. In addition, even if an abnormality occurs, such as the outflow of the liquid LQ, it is possible to suppress an extension of the damage by taking appropriate measures, such as stopping the supply of the liquid LQ by the liquid supply mechanism 10.

Furthermore, the detection operation using the detection apparatus 60, of course, can be performed after, in parallel with, or before the measurement process that uses the fiducial member 300. For example, prior to performing the measurement process, it is possible to first use the detection apparatus 60 to detect whether the immersion area AR2 is satisfactorily formed between the projection optical system PL and the fiducial member 300, and then to perform the measurement process.

Furthermore, the explanation herein was made taking as an example a case wherein the immersion area AR2 of the liquid LQ is formed on the upper surface 301A of the fiducial member 300, the measurement process is performed, and the liquid is recovered, after which the detection apparatus 60 is used to detect the liquid LQ on the substrate stage PST, including on the upper surface 301A; however, it is also possible (i) to form the immersion area of the liquid LQ on the upper surface 401A of the upper plate 401 of the luminous flux intensity nonuniformity sensor 400, perform the measurement process, and collect the liquid LQ on that upper surface 401A, (ii) to form the immersion area of the liquid LQ on the upper surface 501A of the upper plate 501 of the spatial image measuring sensor 500, perform the measurement process, and collect the liquid LQ on the upper surface 501A, or (iii) to form the immersion area of the liquid LQ on the upper surface of the upper plate of the luminous flux intensity sensor, perform the measurement process, and collect the liquid LQ on that upper surface; and then use the detection apparatus 60 to detect whether the liquid LQ is present on those upper plates or the substrate stage PST. Furthermore, based on the detection results of the detection apparatus 60, the control apparatus CONT can control the operation of the liquid supply mechanism 10, the liquid recovery mechanism 20, and the like. Furthermore, it is also possible to perform the detection operation using the detection apparatus 60 in parallel with or before the measurement operation using the luminous flux intensity nonuniformity sensor 400, the spatial image measuring sensor 500, and the like.

After the abovementioned alignment process, measurement process, and the like are finished and prior to performing the scanning exposure process of the substrate P, the control apparatus CONT disposes the projection optical system PL and the substrate P so that they oppose one another. Furthermore, the control apparatus CONT supplies the liquid LQ to the substrate P by driving the liquid supply mechanism 10, and collects a prescribed amount of the liquid LQ on the substrate P by driving the liquid recovery mechanism 20. Thereby, the immersion area AR2 of the liquid LQ is formed between the substrate P and the optical element 2 at the front end portion of the projection optical system PL (step S3).

Furthermore, after the alignment process and the measurement process (step S2) are finished, the method may transition to the operation of the immersion exposure process of the substrate P while holding the liquid LQ on the image plane side of the projection optical system PL without recovering the liquid LQ.

The control apparatus CONT projects the pattern image of the mask M onto the substrate P via the projection optical system PL and the liquid LQ between the projection optical system PL and the substrate P so as to expose the substrate P while moving the substrate stage PST, which supports the substrate P, in the X axial direction (the scanning direction), and while the liquid supply mechanism 10 supplies the liquid LQ onto the substrate P and, in parallel, the liquid recovery mechanism 20 collects the liquid LQ on the substrate P (Step 4).

After the liquid LQ supplied from the liquid supply portion 11 of the liquid supply mechanism 10 to form the immersion area AR2 is distributed through the supply pipes 13A, 13B, it is supplied onto the substrate P by the liquid supply ports 12A, 12B through the supply passageways formed inside the passageway forming member 70. The liquid LQ supplied onto the substrate P from the liquid supply ports 12A, 12B is supplied so that it spreads between the substrate P and the lower end surface of the front end portion (the optical element 2) of the projection optical system PL, and locally forms the immersion area AR2, which is smaller than the substrate P and larger than the projection area AR1, on a portion of the substrate P that includes the projection area AR1. At this time, the control apparatus CONT simultaneously supplies the liquid LQ onto the substrate P from both sides of the projection area AR1 in the scanning directions by the liquid supply ports 12A, 12B of the liquid supply mechanism 10 disposed on both sides in the X axial direction (the scanning directions) of the projection area AR1. Thereby, the immersion area AR2 is uniformly and satisfactorily formed.

The exposure apparatus EX in the present embodiment exposes the substrate P by projecting the pattern image of the mask M onto the substrate, while moving the mask M and the substrate P in the X axial direction (the scanning direction); during scanning exposure, the pattern image of one portion of the mask M is projected inside the projection area AR1 through the projection optical system PL and the liquid LQ of the immersion area AR2, and, synchronized to the movement of the mask M at a velocity V in the −X direction (or the +X direction), the substrate P moves at a speed β−V (where β is the projection magnification) in the +X direction (or the −X direction) with respect to the projection area AR1. Furthermore, a plurality of shot regions are set on the substrate P; after the exposure of one shot region is finished, the next shot region moves to the scanning start position by the stepping movement of the substrate P, and the scanning exposure process is subsequently performed sequentially for each shot region while moving the substrate P by the step-and-scan system.

Furthermore, in the present embodiment, when supplying the liquid LQ to the substrate P from both sides of the projection area AR1 in the scanning directions, the control apparatus CONT uses the flow controllers 16A, 16B of the liquid supply mechanism 10 to adjust the amount of the liquid supplied per unit of time so that, during the scanning exposure of one shot region on the substrate P, the amount of liquid (supplied per unit of time) supplied from one side of the projection area AR1 in the scanning direction differs from the amount of liquid supplied from the other side. Specifically, the control apparatus CONT sets the amount of liquid supplied per unit of time from the near side of the projection area AR1 in the scanning direction so that it is greater than the amount of liquid supplied from the opposite side; for example, if performing an exposure process while moving the substrate P in the +X direction, then the control apparatus CONT sets the amount of liquid supplied from the −X side (i.e., the liquid supply port 12A) to the projection area AR1 so that it is greater than the amount of liquid supplied from the +X side (i.e., the liquid supply port 12B); on the other hand, if the exposure process is performed while moving the substrate P in the −X direction, then the amount of liquid supplied from the +X side to the projection area AR1 is set so that it is greater than the amount of liquid supplied from the −X side. Thus, the control apparatus CONT varies the amount of liquid supplied per unit of time from each of the liquid supply ports 12A, 12B in accordance with the movement direction of the substrate P.

Furthermore, the operation of the immersion exposure process of the substrate P can be performed in parallel with the detection operation of the detection apparatus 60. For example, during the measurement operation in a state wherein the immersion area AR2 of the liquid LQ is formed on the substrate P, the detection apparatus 60 emits the detection beams La between the substrate P and the optical element 2 of the projection optical system PL. Thereby, it is possible to detect whether the gap between the substrate P and the optical element 2 of the projection optical system PL is filled with the liquid LQ. Furthermore, if it is determined that the gap is not filled with the liquid LQ, then the control apparatus CONT takes appropriate measures, such as, for example: stopping the immersion exposure operation; or, in order to fill the gap with the liquid LQ, modifying, for example, the conditions in which the liquid is supplied by the liquid supply mechanism 10 or the conditions in which the liquid is recovered by the liquid recovery mechanism 20. Thereby, the exposure process can be performed in a state wherein the immersion area AR2 is satisfactorily formed.

In addition, the immersion exposure process may be performed on the substrate P in a state wherein the detection beams La are emitted to the outer side of the immersion area AR2 of the liquid LQ formed on the substrate P. Thereby, if, for example, an abnormality arises such as the outflow of the liquid LQ from the immersion area AR2 formed on the substrate P, then the detection apparatus 60 can detect that outflow of the liquid LQ. If it is determined based on the detection results of the detection apparatus 60 that an abnormality has occurred, such as the outflow of the liquid LQ, then the control apparatus CONT, for example, reduces the amount of liquid supplied per unit of time by the liquid supply mechanism 10, or stops the supply of the liquid LQ by the liquid supply mechanism 10. If the supply of the liquid LQ by the liquid supply mechanism 10 is stopped, then the drive of the liquid supply portion 11 may be stopped, or the passageways of the supply pipes 13A, 13B may be closed using the valves 15. Alternatively, based on the detection results of the detection apparatus 60, the control apparatus CONT may increase the amount of liquid recovered per unit of time by the liquid recovery mechanism 20. Alternatively, based on the detection results of the detection apparatus 60, the control apparatus CONT may stop the operation of exposing the substrate P, the movement of the substrate stage PST, and the like.

Furthermore, it is also possible to perform the detection operation using the detection apparatus 60 before the immersion exposure of the substrate P, or before supplying the liquid LQ thereto. For example, prior to performing the immersion exposure, it is possible to first use the substrate alignment system to detect the alignment mark on the substrate P after the detection apparatus 60 confirms that there is no liquid LQ on the substrate P, or to use the detection apparatus 60 to detect whether the immersion area AR2 of the liquid LQ is satisfactorily formed between the projection optical system PL and the substrate P, and then to perform the immersion exposure process.

After the immersion exposure of the substrate P is finished, the control apparatus CONT collects the liquid LQ of the immersion area AR2 formed on the substrate P using the liquid recovery mechanism 20, or a prescribed liquid recovery mechanism provided separately therefrom. In addition, there is also a possibility that the liquid LQ of the immersion area AR2 formed on the substrate P will scatter or flow out to the surroundings. Therefore, the control apparatus CONT uses the liquid recovery mechanism 20, or a prescribed liquid recovery mechanism provided separately therefrom, to collect, in addition to the liquid LQ remaining on the substrate P, the liquid LQ remaining on, for example, the fiducial member 300 or the upper surface 43 of the substrate stage PST, including on the upper plates 401, 501 (step S5).

After the liquid LQ on the substrate stage PST, including on the substrate P, is collected, the control apparatus CONT uses the detection apparatus 60 to detect whether the liquid LQ is present on the substrate P, the substrate stage PST, and the like. Based on the detection results of the detection apparatus 60, the control apparatus CONT controls the operation of the liquid recovery mechanism 20. Specifically, if it is determined that the liquid LQ is present on the substrate P or the substrate stage PST, then the control apparatus CONT uses the liquid recovery mechanism 20 and the like to once again perform the operation of collecting the liquid LQ present on the substrate P or the substrate stage PST. Subsequently, the control apparatus CONT uses the detection apparatus 60 to once again detect whether the liquid LQ is present on the substrate P or the substrate stage PST. Furthermore, the control apparatus CONT repetitively performs the detection operation using the detection apparatus 60 and the liquid recovery operation by the liquid recovery mechanism 20 until the liquid LQ is no longer detected by the detection apparatus 60. Alternatively, the control apparatus CONT can perform the liquid detection operation by using the detection apparatus 60 and the liquid recovery operation by the liquid recovery mechanism 20 in parallel. In this case, the control apparatus CONT continues the liquid recovery operation by the liquid recovery mechanism 20 until the detection apparatus 60 no longer detects the liquid LQ. This avoids the problem wherein the liquid LQ remains on the substrate P, the substrate stage PST, and the like after the immersion exposure. However, if it is determined based on the detection results of the detection apparatus 60 that the recovery of the liquid LQ was completed by a single liquid recovery procedure, then the detection apparatus 60 does not need to perform detection again.

The detection apparatus 60 can derive the positional information of the liquid LQ present on the substrate P or the substrate stage PST, and the control apparatus CONT can therefore perform the liquid recovery operation in a state wherein the liquid recovery ports 22 of the liquid recovery mechanism 20 are aligned with the position where the liquid LQ is present by moving the substrate stage PST based on the positional information of the liquid LQ. Thereby, it is possible to improve the throughput of the liquid recovery operation. Of course, the liquid may be collected while moving the substrate stage PST, including the front surface of the substrate P, with respect to the liquid recovery port 22 so that the entire area of the upper surface 43 of the substrate stage PST passes below the liquid recovery port 22.

In addition, as discussed above, the detection apparatus 60 can derive information related to the size of the liquid LQ on the substrate stage PST, including on the front surface of the substrate P, as well as to the amount of the liquid LQ. Accordingly, based on the information related to the size (amount) of the liquid LQ, the control apparatus CONT can control the recovery force (suction force) of the liquid recovery mechanism 20 or the recovery time (suction time) thereof. For example, if the size of the liquid LQ is large (if the amount is great), then the control apparatus CONT increases the recovery force of the liquid recovery mechanism 20, or lengthens the recovery time. Thereby, the liquid LQ is satisfactorily recovered. On the other hand, if the size of the liquid LQ is small (if the amount is small), then the control apparatus CONT reduces the recovery force of the liquid recovery mechanism 20, or shortens the recovery time. The throughput of the liquid recovery operation is thereby improved.

In addition, if it is determined based on the detection results of the detection apparatus 60 that the amount of the liquid LQ present on the substrate stage PST, including on the front surface of the substrate P, is less than a preset threshold value, or if it is determined that the liquid LQ is present at a position (on an object) that has little impact on the measurement process or the exposure process, then the control apparatus CONT can omit performing the operation of recovering the liquid LQ using the liquid recovery mechanism 20, even if the liquid LQ is present.

After collecting the liquid LQ on the substrate P and on the substrate stage PST, the control apparatus CONT unloads the substrate P for which the exposure has finished from the substrate stage PST (step S6).

When unloading the substrate P from the substrate stage PST, the control apparatus CONT moves the substrate stage PST to an unload position, which is set to a position away from the projection optical system PL. The conveyor system (unloading apparatus), which is not shown, unloads the substrate P at the unload position. Furthermore, the load position and the unload position may be the same position or they may be different.

Furthermore, in the present embodiment, the detection apparatus 60 detects whether the liquid LQ is present on the substrate stage PST, including on the front surface of the substrate P; however, the detection apparatus 60 can also detect whether the liquid LQ is present on, for example, the linear motors 47, 48, the surface of the X guide stage 44 wherein the stator 47A of the linear motor 47 is provided, the air bearings 42, 51, 52, or the side surface of the substrate stage PST, which are all disposed lower than the front end portion of the projection optical system PL. There is a possibility that the liquid LQ of the immersion area AR2 formed on the substrate P and on the substrate stage PST will scatter or flow out and adhere to the abovementioned linear motors and air bearings, or to the surface of the X guide stage 44. If the liquid LQ adheres to, for example, the linear motor 47 (stator 47A) of the X guide stage 44, then problems, such as electrical leakage, will occur. Alternatively, if the liquid LQ adheres to the vicinity of the air bearings 42, then a problem will occur wherein the liquid LQ will flow into the intake ports 42A of the air bearings 42. Alternatively, if the liquid LQ that adheres to the side surface of the substrate stage PST and the like is left as is, then there is also a possibility that the liquid LQ will cause rusting, or will vaporize and cause fluctuations in the environment wherein the substrate P is disposed. Accordingly, the control apparatus CONT uses the detection apparatus 60 to detect that adhered liquid LQ. Because it is abnormal if the liquid LQ adheres at a position (a member) outside of the desired position, such as to the X guide stage 44, if the control apparatus CONT determines that the detection results of the detection apparatus 60 are abnormal, then it can prevent the occurrence of the abovementioned problems by removing that liquid LQ using a prescribed liquid removal mechanism and the like.

In addition, if the presence of the liquid LQ is detected in the vicinity of electrical equipment, including the abovementioned linear motors (electromagnetic drive sources), then it is also possible that the control apparatus CONT determines that the detection results of the detection apparatus 60 are abnormal and, for example, stops the supply of electrical power to the electrical equipment. In so doing, it is possible to prevent the occurrence of electrical leakage.

In addition, if the presence of the liquid LQ is detected in, for example, the vicinity of the intake ports 42A of the air bearings 42, then it is possible that the control apparatus CONT stops the intake operation from the intake ports 42A.

In addition, if it is determined that the detection results of the detection apparatus 60 are abnormal, such as the adherence of the liquid LQ to the X guide stage 44 and the like, then the control apparatus CONT can also issue a warning by driving the warning apparatus K. Thereby, the operator, for example, can ascertain that an abnormality, such as the leakage of the liquid LQ, has occurred inside the exposure apparatus EX, and can therefore take appropriate measures. The warning apparatus K can issue a warning using a warning lamp, a warning sound, a display, and the like. Furthermore, if the detection results of the detection apparatus 60 are determined to be abnormal, then it is also possible to inform the operator that an abnormality has occurred via, for example, a computer network.

In addition, if the detection apparatus 60 detects an abnormality, such as the presence of a large amount of the liquid LQ on the X guide stage 44 or the side surface of the substrate stage PST, for example, during an immersion exposure of the substrate P or during the measurement process in a state wherein the immersion area AR2 is formed on the fiducial member 300, the upper plates 401, 501, and the like, then the control apparatus CONT determines that an abnormality has occurred, such as the outflow of the liquid LQ from the immersion area AR2 on the substrate stage PST. If it is determined that the detection results of the detection apparatus 60 are abnormal, then the control apparatus CONT may stop the supply of the liquid LQ by the liquid supply mechanism 10. Thereby, it is possible to prevent problems, such as electrical leakage, the scattering of the liquid LQ that flowed out, or the inflow of the liquid LQ into the intake ports 42A. In addition, even in this case, if it is determined that the detection results of the detection apparatus 60 are abnormal, then the control apparatus CONT may stop the exposure operation.

As explained above, the detection apparatus 60 can be used to detect whether the liquid LQ is present at a desired position or a position outside of the desired position, such as: on the substrate P, the substrate stage PST, or the X guide stage 44, which are disposed lower than the front end portion of the projection optical system PL. Accordingly, if the liquid LQ is disposed at, for example, a position outside of the desired position, then it is possible, based on the detection results of the detection apparatus 60, to take appropriate measures, such as controlling the operation of the liquid supply mechanism 10, the liquid recovery mechanism 20, and the like, as well as removing that liquid LQ; therefore, even if an abnormality, such as the outflow of the liquid LQ, occurs, it is possible to suppress the damage from extending further.

Furthermore, in the present embodiment discussed above, the light emitting portion 61 and the light receiving portion 62 of the detection apparatus 60 are provided to the outer side (the main column 3) of the substrate stage PST, but it is also possible to provide at least one of the light emitting portion 61 and the light receiving portion 62 of the detection apparatus 60 on the substrate stage PST. On the other hand, by adopting a constitution as in the embodiment discussed above, wherein the light emitting portion 61 and the light receiving portion 62 of the detection apparatus 60 are provided to the outer side of the substrate stage PST and optically (contactlessly) detect the liquid LQ from the outer side of the substrate stage PST, there is no need to dispose, for example, the detection devices, the wiring that connects those detection devices, and various members (equipment) in order to detect the liquid LQ on the substrate stage PST. Consequently, it is possible to reduce the impact on the movement of the substrate stage PST.

Furthermore, while it is also possible to use visible light and the like for the detection beams La, it is preferable to use infrared light of a prescribed wavelength (a prescribed wavelength band). Specifically, it is preferable to use infrared light of a wavelength of, for example, approximately 1200 nm, 1450 nm, 1940 nm, or 2950 nm for the detection beams La. Because the water (liquid) LQ has a physical property that absorbs light of the above wavelengths (infrared light), if the detection beams (infrared beams) La that have any of the above wavelengths are emitted to the liquid LQ, then the light energy of those detection beams La is absorbed by the water (liquid) LQ, which greatly decreases the amount of light received by the light receiving portion 62. Accordingly, there is an increased difference between the amount of light received by the light receiving portion 62 when the detection beams La are emitted to the liquid LQ and the amount of light received by the light receiving portion 62 when the detection beams La are not emitted to the liquid LQ, and the detection apparatus 60 can consequently detect with greater sensitivity whether the liquid LQ is present.

In addition, the use of infrared light for the detection beams La greatly increases the difference for example, between the amount of light received by the light receiving portion 62 when the detection beams La are emitted to foreign matter (particles) adhering on the substrate P and the amount of light received by the light receiving portion 62 when the detection beams La are emitted to the liquid LQ; thus, the detection apparatus 60 can discriminate particles from the liquid LQ. Furthermore, if it is determined that the liquid LQ is present, then the liquid LQ should be recovered using the liquid recovery mechanism 20 and the like; further, if it is determined that particles are present, then those particles should be removed using a prescribed particle removal mechanism.

In addition, when detecting whether the liquid LQ is present on the upper surface 43 of the substrate stage PST, the upper surface of the substrate holder PH, and the like, even if a member exists that, for example, protrudes slightly from the upper surface of the substrate holder PH (e.g., a pin member that constitutes portion of a holding mechanism (a pin chuck mechanism) that holds the substrate P), the use of infrared light for the detection beams La also enables the detection apparatus 60 to discriminate the liquid LQ from that protruding member. Accordingly, because it is possible to avoid the occurrence of a problem wherein it is mistakenly determined that the protruding member is the liquid LQ, it is possible to avoid the occurrence of the problem wherein throughput is unfortunately reduced by the operation of recovering the liquid LQ even when none exists.

Furthermore, if infrared light that has one of the abovementioned wavelengths is used for the detection beams La, then dual wavelength laser light may be emitted, wherein infrared light (laser light in the 2 μm band) that has a wavelength of, for example, approximately 1940 nm and infrared light (laser light in the 3 μm band) that has a wavelength of approximately 2950 nm are combined. Alternatively, detection beams may be emitted that combine a plurality of three or more laser lights that have wavelengths (or wavelength bands) that differ from one another.

Incidentally, the embodiment discussed above is constituted so that the detection beams La are emitted substantially parallel to the surface of an object, such as the substrate P or the substrate stage PST, and the presence of the liquid LQ on the object is detected by detecting whether the liquid LQ is present in the optical paths of those detection beams La. In other words, if the liquid LQ is present on the object, then the detection beams La must reliably irradiate the liquid LQ. Consequently, in order for the detection apparatus 60 to reliably emit the detection beams La to the liquid LQ present on the object, the detection beams La pass on the inner side of an area away within a prescribed distance from the surface of the object. Specifically, the detection beams La are set so that they pass through the area away by up to 5.5 mm from the surface of the object. This point will now be explained referencing FIG. 8.

Figure 8:
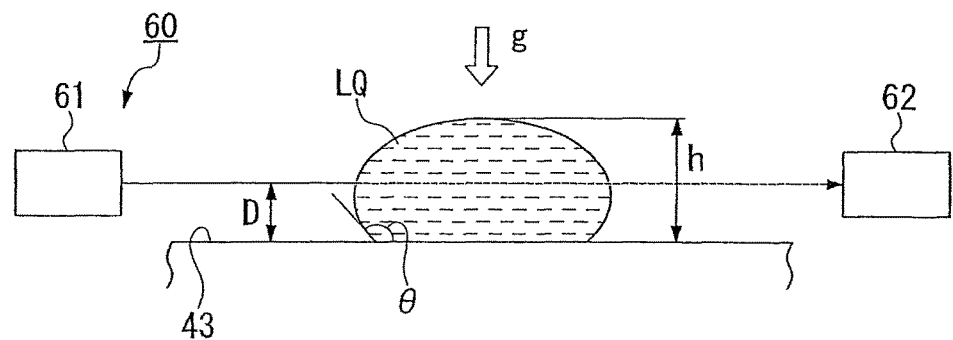
FIG. 8 is a schematic diagram for explaining the relationship between a detection beam and an object surface.

In FIG. 8, the liquid LQ on the object surface (in FIG. 8, the upper surface 43 of the substrate stage PST) is disposed in a liquid droplet (water droplet) state. In this state, the following relationship is defined:

$$\cos\theta = 1 - (\rho \times g \times h^2)/(2 \times \sigma) \quad (1A)$$

where θ: contact angle of the liquid LQ with respect to the object surface;

ρ: liquid density;

h: height of liquid (liquid droplet);

σ: surface tension coefficient; and g: gravitational acceleration.

The liquid LQ in the present embodiment is water, and therefore $\rho=998$ (kg/m$^3$) and $\sigma=73\times10^{-3}$ (N/m). Solving the abovementioned equation (1A) for h yields:

$$h = [(2\times\sigma)\times(1-\cos\theta)/(\rho\times g)]^{1/2} \quad (2A)$$

If the object surface is sufficiently liquid-repellent and if $\theta=180°$ (cos θ=−1), then $h=5.46\times10^{-3}$ (m), i.e., approximately 5.5 mm.

Because the value of the contact angle θ is actually less than 180°, the value of the height h is likewise less than 5.5 mm. For example, if the upper surface 43 is made of polytetrafluoroethylene (Teflon™), then the contact angle θ of the liquid (water) LQ with respect to that upper surface 43 is approximately 115°, and the height h is therefore approximately 4.6 mm. Furthermore, if the amount of the liquid LQ is sufficient, then the value of the height h becomes a fixed value that does not vary with the amount of that liquid LQ. Accordingly, by setting the detection beams La so that they pass within an area of a height up to 5.5 mm from the object surface, in other words by setting the distance D between the object surface and the detection beams La, which are emitted substantially parallel to that object surface, to 5.5 mm or less, it is possible to reliably emit the detection beams La to the liquid (water) LQ present on the object surface.

Furthermore, if detecting the presence of the liquid LQ on the upper surface of the substrate stage PST, including on the front surface of the substrate P, by emitting the detection beams La, for example, before or after the measurement process (step S2), or before or after the immersion exposure process (step S4), then the substrate stage PST may be driven in the Z axial direction to adjust the position of the upper surface so that the detection beams La pass through the area within 5.5 mm from the upper surface of the substrate stage PST. Alternatively, the positions of the detection beams La may be adjusted by moving the detection apparatus 60, including the light emitting portion 61, the optical member 63, and the like, or by moving the positions of both the substrate stage PST and the detection beams La.

Furthermore, because the value of the height h varies in accordance with, for example, the surface state (contact angle θ) of the object and the type (physical property) of the liquid LQ used, if, for example, a liquid other than water is used as the liquid LQ, then the height h should be derived from the abovementioned equation (2A), and the distance D should be set based on that height h.

In addition, if the amount of the liquid LQ is small (if the size of the liquid droplet is small), then the value of the height h thereof decreases; however, even in that case, the detection beams La can be emitted to the liquid (liquid droplet) LQ on the substrate stage PST by adjusting the positions of the substrate stage PST, the detection beams La, and the like.

The following explains another embodiment of the present invention. In the explanation below, components that are identical or equivalent to those in the embodiment discussed above are assigned the identical symbols, and the explanations thereof are abbreviated or omitted.

Figure 9:
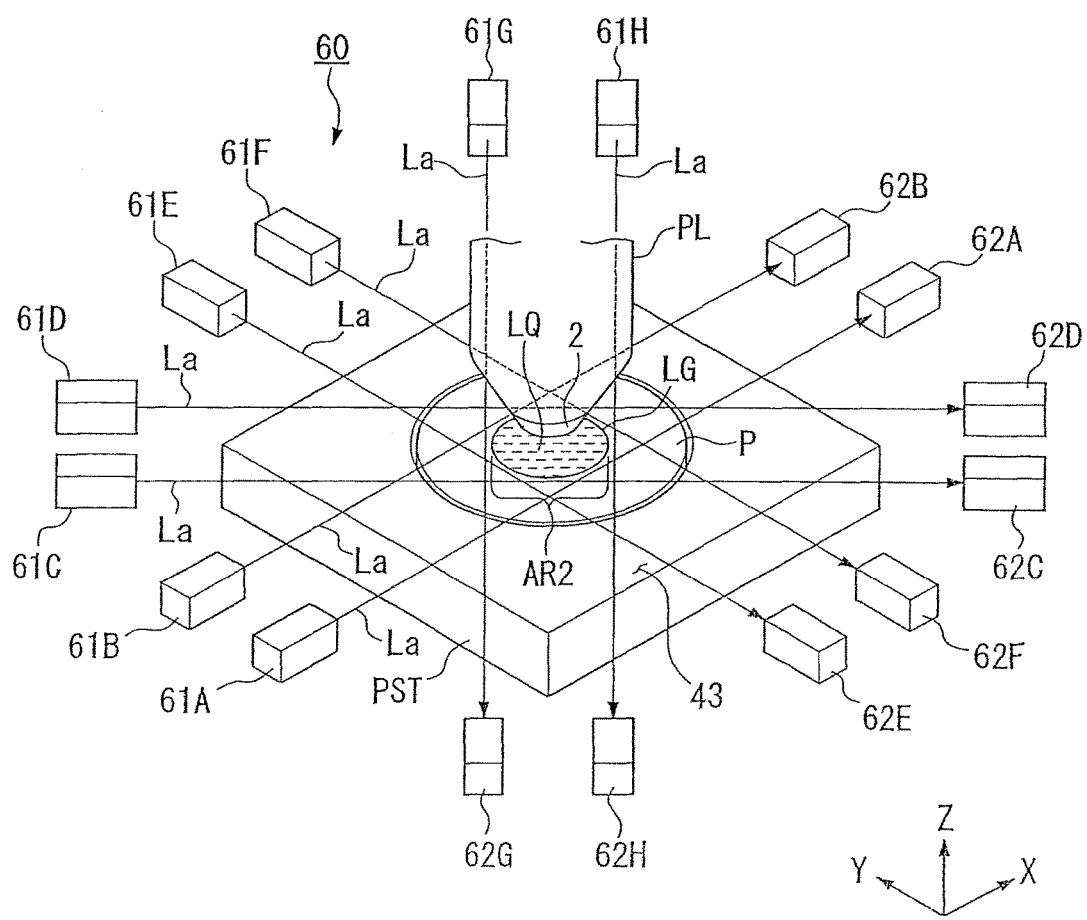
FIG. 9 is a perspective view that depicts another embodiment of the detection apparatus according to the present invention.

FIG. 9 is a perspective view that depicts another embodiment of the present invention. As depicted in FIG. 9, the detection apparatus 60 has a plurality of light emitting portions 61A-61H provided to the outer side of the substrate stage PST, and a plurality of light receiving portions 62A-62H provided so that they correspond to those light emitting portions 61A-61H. These light emitting portions 61A-61H and light receiving portions 62A-62H are fixed to the main column 3 or the like.

The detection apparatus 60 emits the detection beams La from each of the light emitting portions 61A-61H so that they are substantially parallel to the XY plane, i.e., substantially parallel to the substrate P and the upper surface 43 of the substrate stage PST. The plurality of detection beams La emitted from each of the light emitting portions 61A-61H is emitted to the vicinity of the edge portion LG of the immersion area AR2 of the liquid LQ formed on the substrate P. Furthermore, the detection apparatus 60 emits the detection beams La using the light emitting portions 61A-61H from a plurality of mutually different directions to a plurality of positions in the vicinity of the edge portion LG of the immersion area AR2. Specifically, of the plurality of provided light emitting portions 61A-61H, the light emitting portions 61A, 61B emit the detection beams La to the vicinity of the edge portion LG of the immersion area AR2 from directions substantially parallel to the X axial direction, and the light emitting portions 61E, 61F emit the detection beams La from directions substantially parallel to the Y axial direction. In addition, the light emitting portions 61C, 61D emit the detection beams La to the edge portion LG of the immersion area AR2 from a direction diagonal to the X axis (Y axis) direction, and the light emitting portions 61G, 61H emit the detection beams La from an inclination direction different from the detection beams La emitted from the light emitting portions 61C, 61D. Namely, the optical paths of the plurality of detection beams La emitted from the light emitting portions 61A-61H are set so that they surround the immersion area AR2.

In addition, the two detection beams La respectively emitted from the light emitting portions 61A, 61B are provided so that they are emitted to both sides of the vicinity of the edge portion LG of the immersion area AR2, which is thereby interposed therebetween. Likewise, the two detection beams La respectively emitted from the light emitting portions 61C, 61D are provided so that they are emitted to both sides of the vicinity of the edge portion LG of the immersion area AR2, the two detection beams La respectively emitted from the light emitting portions 61E, 61F are provided so that they are emitted to both sides of the vicinity of the edge portion LG of the immersion area AR2, and the two detection beams La respectively emitted from the light emitting portions 61G, 61H are provided so that they are emitted to both sides of the vicinity of the edge portion LG of the immersion area AR2.

The control apparatus CONT performs the immersion exposure by forming the immersion area AR2 on the substrate P in a state wherein the detection beams La are emitted by each of the light emitting portions 61A-61H and then emitting the exposure light EL through the liquid LQ upon the substrate P. In other words, the control apparatus CONT performs the detection operation using the detection apparatus 60 and the exposure of the substrate P in parallel. Of course, the detection operation may be performed in parallel with the measurement process discussed above.

At this point, when the immersion area AR2 is formed on the substrate P at the prescribed position and in the desired state (the desired size and shape), the optical paths of the detection beams La are set to positions away from the edge portion LG of the immersion area AR2 by a prescribed distance toward the outer side. Namely, when the immersion area AR2 is formed in the desired state, the detection beams La respectively emitted from each of the light emitting portions 61A-61H are provided so that they do not irradiate the liquid LQ of the immersion area AR2 but arrive at the light receiving portions 62A-62H without passing through the liquid LQ.

In other words, the optical paths of the plurality of detection beams La emitted to the vicinity of the edge portion LG of the immersion area AR2 are set in accordance with a preset target shape and size of the immersion area AR2.

For example, if the immersion area AR2 formed between the projection optical system PL and the substrate P during, for example, the immersion exposure of the substrate P exceeds a preset prescribed (desired) size, the liquid LQ is disposed in the optical path of any of the plurality of detection beams La. In addition, even when the liquid LQ flows out from above the substrate P or cannot be held on the image plane side of the projection optical system PL and flows out from between the front end portion of the projection optical system PL and the substrate P, the liquid LQ is disposed in the optical paths of the detection beams La. Consequently, based on the light receiving result of any of the light receiving portions 62A-62H, the detection apparatus 60 can detect the occurrence of an abnormality, such as the size of the immersion area AR2 exceeding a desired size, the outflow of the liquid LQ, and the like. Based on the detection results of the detection apparatus 60, the control apparatus CONT performs control in order to set the size of the immersion area AR2 to the desired size, for example, by reducing the amount of liquid supplied per unit of time by the liquid supply mechanism 10, increasing the amount of liquid recovered per unit of time by the liquid recovery mechanism 20, and the like. In addition, if the detection results of the detection apparatus 60 are determined to be abnormal, i.e., the immersion area AR2 exceeds a prescribed size or the liquid LQ has flowed out from above the substrate P, then the control apparatus CONT stops the supply of the liquid LQ by the liquid supply mechanism 10. Thereby, it is possible to prevent the outflow of the liquid LQ. Furthermore, based on the detection results of the detection apparatus 60, the control apparatus CONT may also stop the movement of the substrate stage PST, or stop the operation of exposing the substrate P.

In addition, because at least two of the plurality of detection beams La are respectively emitted to both sides of the vicinity of the edge portion LG of the immersion area AR2 and, in the present embodiment, the optical paths of the plurality of detection beams La are set so that they surround the immersion area AR2, it is also possible to detect the direction in which the liquid LQ flows out from the immersion area AR2. Accordingly, to suppress the outflow of the liquid LQ in that direction, the control apparatus CONT, for example, uses the flow controllers 16A, 16B and the like to separately adjust the amounts of liquid supplied from the plurality of liquid supply ports 12A, 12B, or separately adjusts the amounts of liquid recovered through the plurality of liquid recovery ports 22A, 22B.

In addition, if the substrate stage PST that holds the substrate P moves at high speed in a state wherein the immersion area AR2 of the liquid LQ is formed between the projection optical system PL and the substrate P, then there is a possibility that the liquid LQ of the immersion area AR2 will be dragged by the movement of the substrate P and will flow outwards or the size of the immersion area AR2 may be increased. In such a case, the speed of the movement of the substrate stage PST should be decreased. Thus, it is also possible to suppress the outflow of the liquid LQ by controlling the drive of the substrate stage PST, such as by adjusting the speed or the direction of the movement of the substrate stage PST.

In addition, when the detection apparatus 60 detects the direction in which the liquid LQ flowed out, for example, after the immersion exposure is finished, the substrate stage PST may be moved in the X and Y directions in accordance with that direction so that the liquid LQ that flowed out is disposed below the liquid recovery ports 22, and may then be recovered.

In addition, in the present embodiment as well, the accuracy of detecting the liquid LQ can be improved by using infrared light of a prescribed wavelength for the detection beams La.

Figure 10:
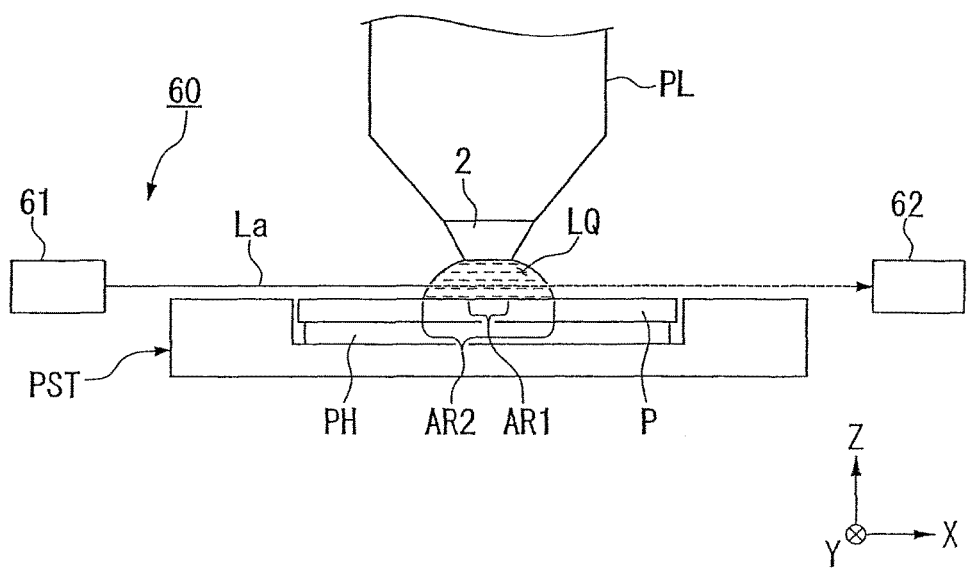
FIG. 10 is a side view that depicts another embodiment of the detection apparatus according to the present invention.
Figure 11:
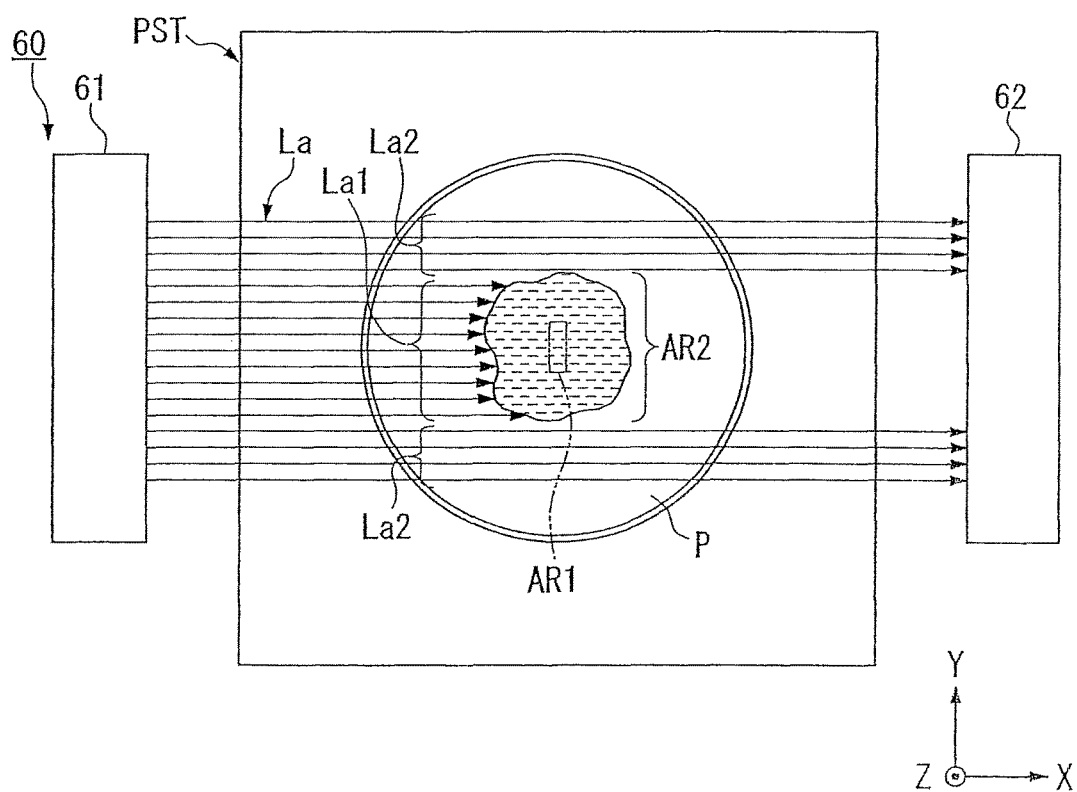
FIG. 11 is a plan view of the same embodiment.

FIG. 10 is a side view that depicts another embodiment of the present invention, and FIG. 11 is a plan view thereof. As depicted in FIG. 10 and FIG. 11, the detection apparatus 60 emits the detection beams La from the light emitting portion 61 to the immersion area AR2 of the liquid LQ formed between the projection optical system PL and the substrate P. In the present embodiment, the light emitting portion 61 emits the plurality of detection beams La, which are arrayed in the Y axial direction, along the X axial direction. In the present embodiment, the control apparatus CONT performs, in parallel, the exposure operation of the substrate P, the measurement operation, and the detection operation using the detection apparatus 60.

Based on the light receiving results of the light receiving portion 62 that receives the detection beams La emitted from the light emitting portion 61 to a plurality of positions in the immersion area AR2, the detection apparatus 60 can derive the size of the immersion area AR2 formed on the substrate P.

The light receiving portion 62 has a plurality of light receiving devices corresponding to the abovementioned plurality of detection beams La. The positional information of these light receiving devices is known in advance by, for example, design values. If the detection beams La1, which are a portion of the plurality of detection beams La emitted from the light emitting portion 61, are emitted to the immersion area AR2, then they do not arrive at the corresponding light receiving devices of the light receiving portion 62, or the amount of light received by those light receiving devices decreases. On the other hand, the detection beams La2, which are the remaining portion, arrive at the light receiving portion 62 without passing through the immersion area AR2. Accordingly, the detection apparatus 60 can derive the size of the immersion area AR2 based on the light receiving results of the light receiving devices of the light receiving portion 62 that received the detection beams La1, and on the positional information of those light receiving devices.

Furthermore, in the present embodiment, the detection apparatus 60 can derive the size of the immersion area AR2 in the Y axial direction because the detection beams La are emitted to the liquid LQ from the X axial direction; however, the detection apparatus 60 can also derive the size of the immersion area AR2 in the X axial direction by emitting the detection beams La to the immersion area AR2 from the Y axial direction. In addition, it is of course also possible to emit the detection beams La from a direction diagonal to the X axial direction within the XY plane. Furthermore, the detection apparatus 60 (or the control apparatus CONT) can derive the shape of the immersion area AR2 by arithmetically processing the light receiving results produced when the detection beams La were emitted to the immersion area AR2 from a plurality of directions.

Furthermore, based on the detection results of the detection apparatus 60, the control apparatus CONT controls the operation of either the liquid supply mechanism 10 or the liquid recovery mechanism 20, or both. For example, if it is detected that the immersion area AR2 is greater than a prescribed size, then, in order to make the immersion area AR2 the desired size, the control apparatus CONT, for example, reduces the amount of liquid supplied per unit of time by the liquid supply mechanism 10, or increases the amount of liquid recovered per unit of time by the liquid recovery mechanism 20. Alternatively, if it is detected that the immersion area AR2 is greater than a prescribed size, then the control apparatus CONT may also stop the supply of the liquid LQ by the liquid supply mechanism 10. Conversely, if it is detected that the immersion area AR2 is less than a prescribed size, then, in order to make the immersion area AR2 the prescribed size, the control apparatus CONT, for example, increases the amount of liquid supplied per unit of time by the liquid supply mechanism 10, or decreases the amount of liquid recovered per unit of time by the liquid recovery mechanism 20.

In addition, if the liquid LQ is disposed in the optical paths of each of the plurality of detection beams La and the detection beams La are not received with the prescribed light quantity at the light receiving portion 62, then the control apparatus CONT determines that an abnormality has occurred, such as the outflow of the liquid LQ from above the substrate P. In that case, the control apparatus CONT stops the supply of the liquid LQ by the liquid supply mechanism 10.

In addition, when the shape of the immersion area AR2 greatly differs from the preset target shape, the shape of the immersion area AR2 can also be adjusted by, for example, separately adjusting the amounts of liquid supplied per unit of time from the plurality of liquid supply ports 12A, 12B, separately adjusting the amounts of liquid recovered per unit of time through the plurality of liquid recovery ports 22A, 22B, or controlling the drive of the substrate stage PST.

In addition, because the present embodiment has a constitution wherein the detection apparatus 60 also emits the detection beams La onto the optical path of the exposure light EL within the immersion area AR2, it is also possible to detect, for example, a gas portion present between the optical element 2 at the front end of the projection optical system PL and the substrate P. Accordingly, if the detection apparatus 60 detects the gas portion, i.e., if a break in the liquid of the immersion area AR2 is detected, then, in order to eliminate the gas portion, the control apparatus CONT increases the amount of liquid supplied by the liquid supply mechanism 10, decreases the amount of liquid recovered by the liquid recovery mechanism 20, and the like. Alternatively, if a gas portion is generated, then the pattern image will not be satisfactorily transferred onto the substrate P and the control apparatus CONT may consequently stop the exposure thereof.

Furthermore, in the present embodiment, the light emitting portion 61 emits a plurality of arrayed detection beams La, but it may emit a sheet light beam so that it covers the immersion area AR2. A so-called laser sheet light generated by, for example, passing the laser light beam emitted from a laser light source through an optical system that has a pinhole or a cylindrical lens, can be used as the sheet light beam.

In addition, the irradiation area by the sheet light beam is set so that its size is at least greater than the target size of the immersion area AR2. In so doing, if the immersion area AR2 is the desired size, then the light receiving portion 62 can receive light of the detection beams La2.

Furthermore, in the present embodiment as well, the accuracy of detecting the presence of the liquid LQ can be improved by using infrared light of a prescribed wavelength for the detection beams La.

Furthermore, in each of the embodiments discussed above, the plurality of detection beams La are emitted so that they are arrayed in the horizontal direction, but they may be emitted so that they are arrayed in the vertical direction. In so doing, if the space between the projection optical system PL and the substrate P is filled with the liquid LQ, e.g., even if a situation arises wherein the liquid LQ is disposed in the vicinity of the front surface of the substrate P while, on the other hand, a gas portion has formed in the vicinity of the liquid contact surface 2A of the optical element 2 of the projection optical system PL, then that gas portion can be satisfactorily detected, and additionally, the liquid that adheres to the liquid contact surface 2A of the optical element 2 or the lower surface 70A of the passageway forming member 70 can also be detected after the liquid LQ has been recovered.

Incidentally, in each of the embodiments discussed above, the detection beams La are emitted substantially parallel to the upper surface of the substrate stage PST; however, if, for example, a recessed portion is formed on the substrate stage PST and the liquid LQ remains on (adheres to) the inner side of that recessed portion (e.g., on the substrate holder PH), then it will be difficult to detect the liquid LQ on the inner side of that recessed portion if the detection beams La are emitted substantially parallel to the upper surface of the substrate stage PST. In that case, the detection apparatus emits the detection beams La to the upper surface of the substrate stage PST from vertically above, or from diagonally above.

Figure 12:
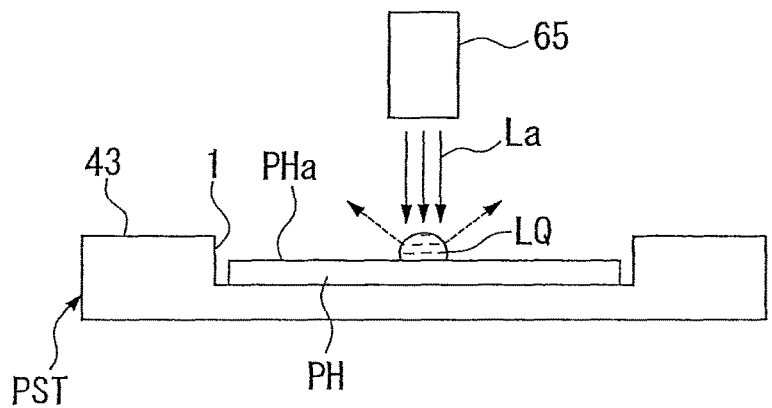
FIG. 12 is a side view that depicts another embodiment of the detection apparatus according to the present invention.

FIG. 12 is a schematic diagram that depicts a state wherein the liquid LQ disposed on the inner side of the recessed portion 1 formed on the substrate stage PST is being detected. A detection apparatus 65 depicted in FIG. 12 has the combined functions of the light emitting portion that emits the detection beams La and the light receiving portion that receives those beams. Furthermore, the detection apparatus 65 emits the detection beams La to the recessed portion 1, which is formed on the substrate stage PST and wherein the substrate holder PH is disposed, from above; receives the light from that recessed portion 1; and, based on that light receiving result, detects whether the liquid LQ is present on the inner side of the recessed portion 1. The detection apparatus 65 emits the detection beams La to the recessed portion 1 from above.

If the liquid LQ is not present on the inner side of the recessed portion 1, which includes an upper surface (holding surface) PHa of the substrate holder PH, then the reflected light of the detection beams La emitted to the recessed portion 1 is received by the detection apparatus 65 with a prescribed light intensity. On the other hand, if the liquid LQ is present on the inner side of the recessed portion 1, then the detection beams La emitted to the recessed portion 1 are scattered or absorbed by the liquid LQ, and that reflected light is consequently received by the detection apparatus 65 with a light intensity weaker than the abovementioned prescribed light intensity. Based on the light receiving results of the reflected light, it is possible to detect whether the liquid LQ is present on the inner side of the recessed portion 1.

Furthermore, in the present embodiment as well, if emitting the detection beams La to the recessed portion 1 (the upper surface of the substrate stage PST), then it is possible to perform detection while moving the substrate stage PST in the XY directions with respect to the detection beams La. Of course, it is also possible to perform detection while moving the detection beams La emitted from the detection apparatus 65, and it is also possible to perform detection while moving both the substrate stage PST and the detection beams La. Thus, it is possible to detect the presence of the liquid LQ in a large area on the inner side of the recessed portion 1 by performing detection while moving either the substrate stage PST or the detection beams La emitted from the detection apparatus 65, or both.

In addition, in this case as well, the accuracy of detecting the liquid LQ can be improved by using infrared light of a prescribed wavelength for the detection beams La.

Furthermore, the recessed portion is not limited to one wherein the substrate holder PH is disposed, and includes all recessed portions formed on the objects, such as the substrate stage PST, that are disposed lower than the front end portion of the projection optical system PL.

Incidentally, the detection apparatus 65 can detect whether the liquid LQ is present on the substrate holder PH on the inner side of the recessed portion 1, but the emission of the detection beams La to the substrate holder PH by the detection apparatus 65 is preferably performed before loading the substrate P on the substrate holder PH, i.e., before step S1, which was explained referencing FIG. 7.

Figure 13A:
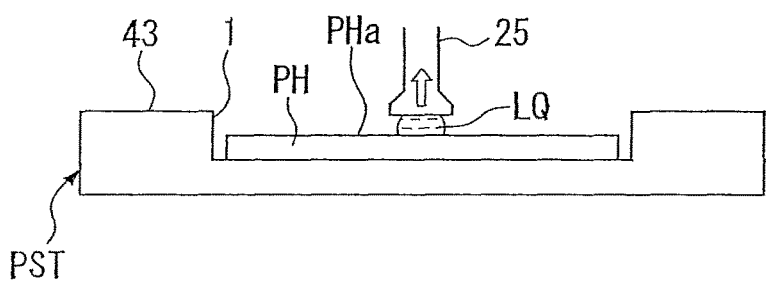
FIG. 13A is a schematic diagram that depicts one example of the operation of the exposure apparatus.
Figure 13B:
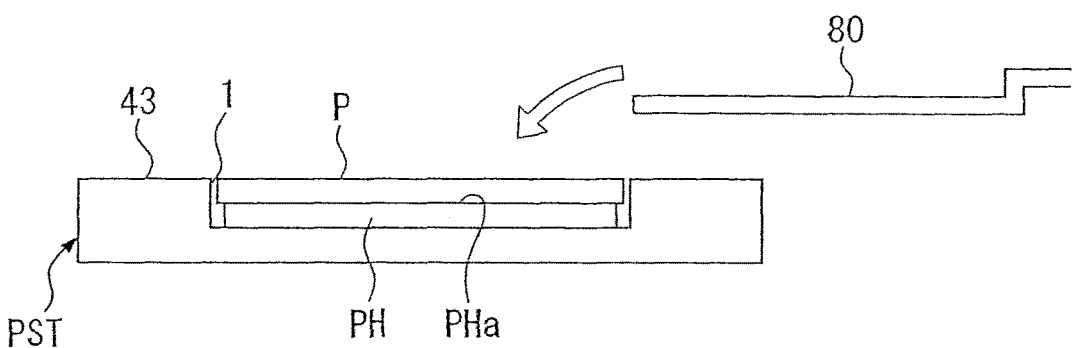
FIG. 13B is a schematic diagram that likewise depicts one example of the operation of the exposure apparatus.

Namely, if the detection apparatus 65 has detected the presence of the liquid LQ on the substrate holder PH, then the control apparatus CONT uses a prescribed liquid removal mechanism 25 to collect that liquid LQ on the substrate holder PH, as depicted in FIG. 13A. The liquid removal mechanism 25 depicted in FIG. 13A has a suction nozzle that collects the liquid LQ by suction. The suction nozzle approaches the substrate holder PH from above, and collects the liquid LQ thereon. Furthermore, the liquid removal mechanism 25 may also have a constitution wherein a gas is blown against the substrate holder PH to blow off the liquid LQ, or may have a constitution wherein the liquid LQ is absorbed by using a liquid absorbing member. Furthermore, after the liquid LQ on the substrate holder PH is collected, the substrate P is loaded on the substrate holder PH by a loading apparatus 80, as depicted in FIG. 13B.

If, unfortunately, the substrate P is loaded on the substrate holder PH in a state wherein the liquid LQ is disposed on the substrate holder PH, then there is a possibility that the liquid LQ will function as a lubricating film and cause the mispositioning of the substrate P with respect to the substrate holder PH, and will thereby degrade exposure accuracy, measurement accuracy, and the like. In addition, if a constitution is adopted wherein the substrate holder PH holds the substrate P by a vacuum suction system, then a problem still arises wherein the liquid LQ flows into the vacuum system through the vacuum suction holes. Incidentally, if the detection apparatus 65 detects whether the liquid LQ is present on the substrate holder PH before the substrate P is loaded on the substrate holder PH and the liquid LQ is then detected, then it is possible, by recovering the liquid LQ using the liquid removal mechanism 25, to reliably hold the substrate P to the substrate holder PH when loading the substrate P thereon.

Furthermore, the operation of detecting the liquid LQ on the substrate holder PH using the detection apparatus 65 can of course be performed after unloading the substrate P, for which the immersion exposure has finished, from the substrate holder PH, i.e., after step S6, which was explained referencing FIG. 7. In addition, the liquid removal mechanism 25 may be attached to the loading apparatus 80.

Furthermore, in addition to detecting whether the liquid LQ is present on the inner side of the recessed portion, the detection apparatus 65 can of course also detect whether the liquid LQ is present on a flat surface, such as on the front surface of the substrate P and on the upper surface 43 of the substrate stage PST. In addition, when detecting whether the liquid LQ is present on the upper surface 43 of the substrate stage PST in a state wherein the substrate P is loaded on the substrate holder PH, the detection operation using the detection apparatus 65 and the operation of exposing the substrate P may be performed in parallel.

Figure 14:
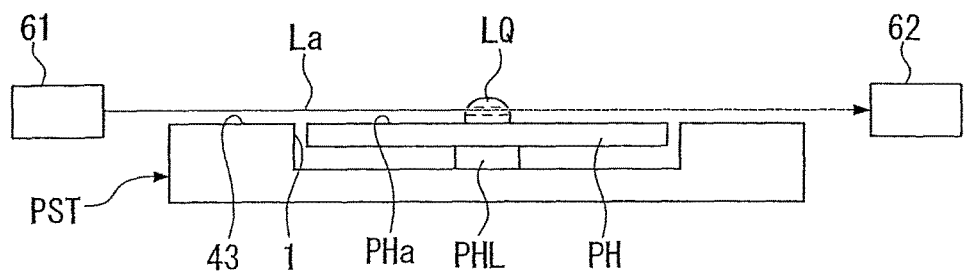
FIG. 14 is a side view that depicts another embodiment of the detection apparatus according to the present invention.

Furthermore, as depicted in FIG. 14, if a constitution is adopted wherein the substrate holder PH is movable in the Z axial direction and in the θX and θY directions with respect to the plate member 43 of the substrate stage PST, then, when detecting whether the liquid LQ is present on the substrate holder PH, a holder drive mechanism PHL that drives the substrate holder PH may be used to make the upper surface PHa of the substrate holder PH substantially flush with the upper surface 43 of the substrate stage PST, and the detection beams La may then be emitted substantially parallel to the upper surface PHa of the substrate holder PH and the upper surface 43 of the substrate stage PST.

Figure 15:
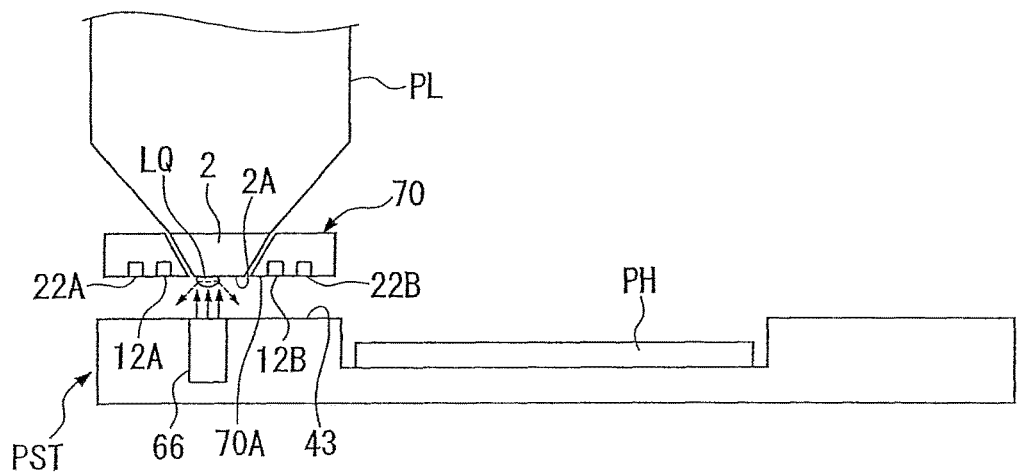
FIG. 15 is a side view that depicts another embodiment of the detection apparatus according to the present invention.

FIG. 15 depicts another embodiment of the present invention. In FIG. 15, the substrate stage PST is provided with a detection apparatus 66 that detects whether the liquid LQ is present, for example, on the lower surface 2A of the optical element 2 at the front end portion on the image plane side of the projection optical system PL, or on portions provided in the vicinity thereof, such as the lower surface 70A of the passageway forming member 70. Similar to the detection apparatus 65 that was explained referencing FIG. 12, the detection apparatus 66 has the combined functions of the light emitting portion that emits the detection beams La and the light receiving portion that receives those beams. The light emitting portion and the light receiving portion of the detection apparatus 66 are provided at a position on the substrate stage PST outside of the substrate holder PH, specifically on the upper surface 43.

The detection apparatus 66 emits the detection beams La to the lower surface 2A of the optical element 2 of the projection optical system PL, the lower surface 70A of the passageway forming member 70, and the like before or after the exposure operation in a state wherein the space on the image plane side of the projection optical system PL is filled with the liquid LQ, or before or after the measurement operation. Furthermore, if the adhering liquid LQ has been found, then that liquid LQ is removed by a prescribed liquid removal mechanism. If the liquid LQ adhering to the optical element 2 and the like is left as it is, then a problem will arise wherein a water residue (a so-called watermark) will be formed on the front surface of the optical element 2; however, the detection apparatus 66 can detect whether the liquid LQ has adhered to the optical element 2, and, if it has adhered, then the occurrence of the abovementioned problem can be prevented by removing that liquid LQ.

Figure 16:
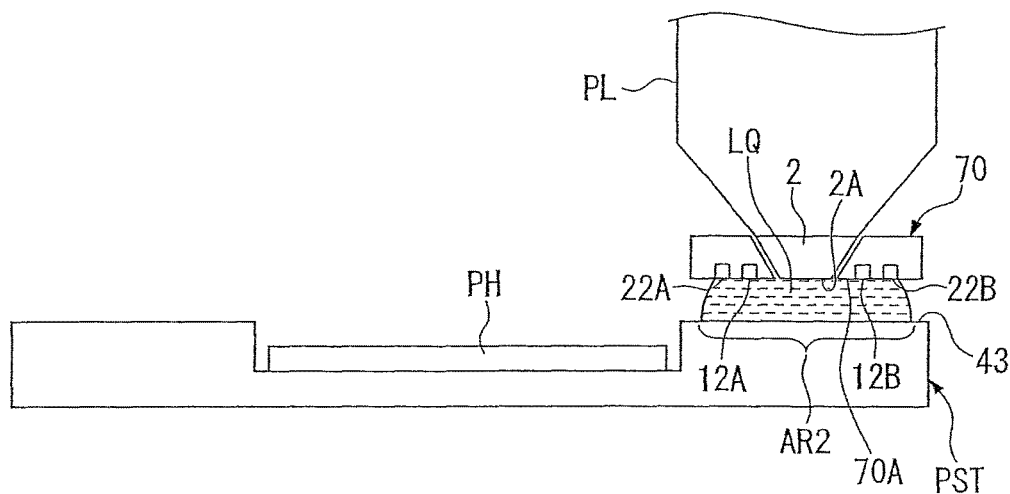
FIG. 16 is a side view that depicts one example of the operation of the exposure apparatus.

Furthermore, if the detection apparatus 66 has detected the adherence of the liquid LQ to the optical element 2, then the control apparatus CONT may supply the liquid LQ to the image plane side of the projection optical system PL so as to form the immersion area AR2 and wet the optical element 2, as depicted in FIG. 16, for example. In the example depicted in FIG. 16, the immersion area AR2 is formed by supplying the liquid LQ between the projection optical system PL and the upper surface 43 of the substrate stage PST in a state wherein the projection optical system PL and the upper surface 43 of the substrate stage PST are disposed so that they oppose one another. In so doing, it is possible to prevent the problem wherein a watermark is formed.

When unloading the substrate P for which the exposure process has finished from the substrate stage PST, that substrate P is lifted from the substrate holder PH (the substrate stage PST) by, for example, a lift mechanism that is provided to the substrate holder PH, and the rear surface of that substrate P and the holding surface PHa of the substrate holder PH thereby become separated from each other. At this time, the detection apparatus 66 may be used to detect whether the liquid LQ has adhered to the rear surface of the lifted substrate P. In this case, the detection apparatus 66 should be provided in advance with an emission portion, which emits detection beams from diagonally below to the rear surface of the substrate P, and a light receiving portion that receives the reflected light thereof, and should detect whether the liquid has adhered to the rear surface of the substrate P based on the light receiving result of the light receiving portion. Alternatively, the detection apparatus 66 may be provided with an imaging apparatus (CCD or the like) that is capable of imaging the rear surface of the substrate P, and may detect whether the liquid has adhered to the rear surface of the substrate P by processing the image. If the liquid LQ has adhered to the rear surface of the substrate P, then the control apparatus CONT eliminates that liquid LQ on the rear surface of the substrate P by, for example, blowing gas thereagainst using a prescribed liquid removal mechanism. In so doing, even if a constitution is adopted wherein, for example, an unloading apparatus holds the rear surface of the substrate P by suction through vacuum suction holes, it is possible to avoid problems, such as the liquid LQ entering the interior of the vacuum suction holes, or the liquid LQ forming a lubricating film and thereby causing the mispositioning of the substrate P, and it is therefore possible to reliably hold the substrate P to a support surface of the unloading apparatus.

In addition, if the liquid adhering to the rear surface of the substrate P is detected, then the unloading of that substrate P may be stopped, a warning, for example, may be issued, and the operator may be requested to remove the substrate P. In this case as well, it is possible to prevent, for example, the adherence of the liquid to the unloading apparatus.

Furthermore, the detection of whether the liquid has adhered to the rear surface of the substrate P may be performed after the substrate P is unloaded from the substrate stage PST, i.e., after the unloading apparatus (not shown) has received the substrate P. Furthermore, if the adherence of the liquid to the rear surface of the substrate P is detected, then the liquid should be removed, a warning should be issued, or the like. However, in this case, there is a possibility that the liquid will adhere to the unloading apparatus (not shown), and it is therefore necessary to remove that liquid or clean the unloading apparatus.

Figure 17:
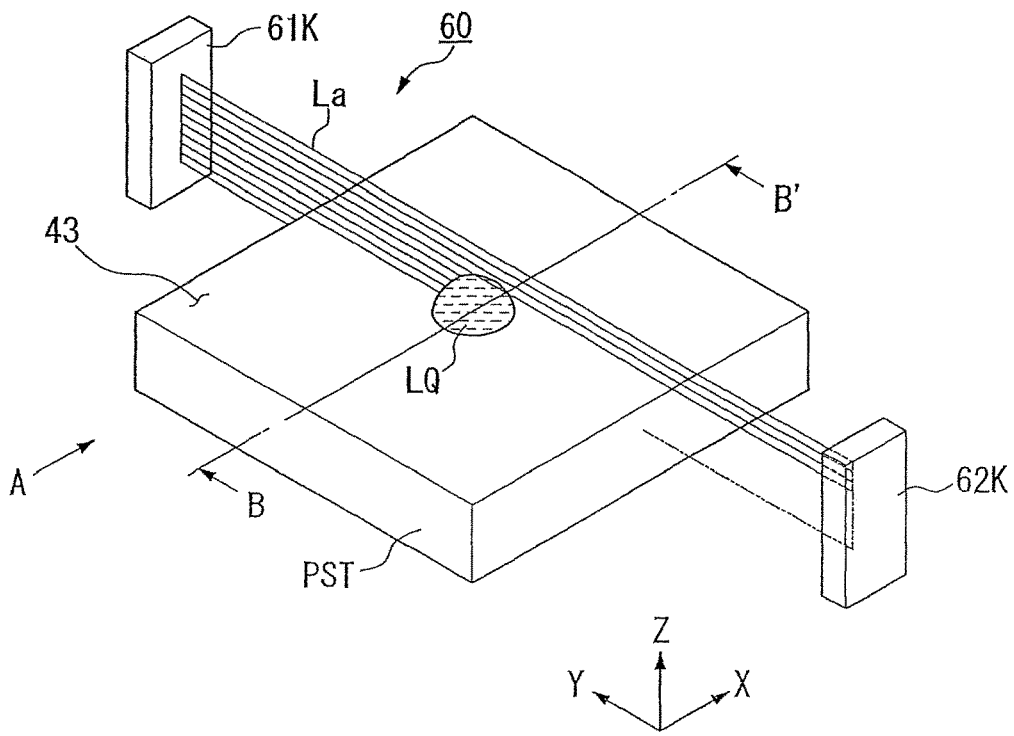
FIG. 17 is a perspective view that depicts another embodiment of the detection apparatus according to the present invention.
Figure 18A:
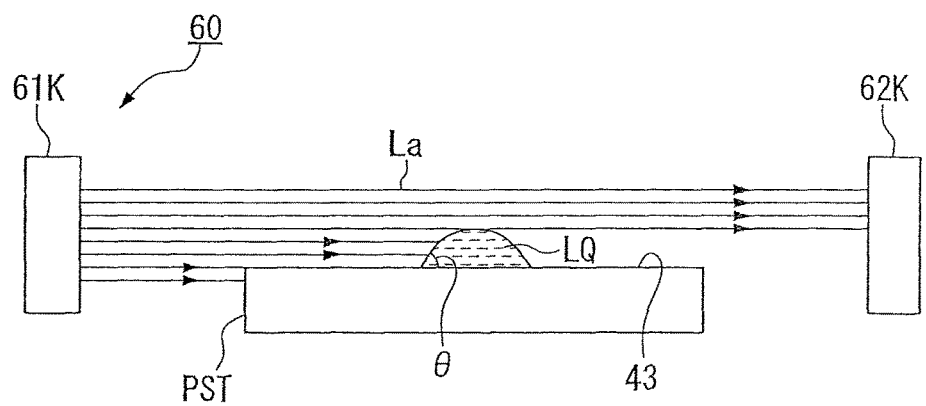
FIG. 18A is a side view of FIG. 17.
Figure 18B:
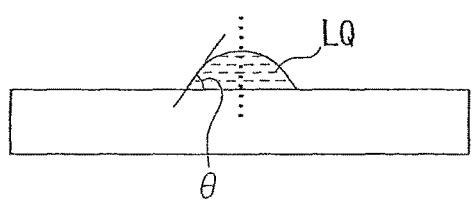
FIG. 18B is a cross sectional view along the B-B' line in FIG. 17.

FIG. 17 is a perspective view that depicts another embodiment of the present invention, FIG. 18A is a side view of FIG. 17 viewed from the arrow A direction, and FIG. 18B is a cross sectional view along the B-B' line in FIG. 17. In FIG. 17, FIG. 18A and FIG. 18B, the detection apparatus 60 has a light emitting portion 61K that emits a plurality of detection beams La arrayed in the Z axial direction to the upper surface 43 of the substrate stage PST, and a light receiving portion 62K disposed at a prescribed position with respect to the detection beams La. The light receiving portion 62K has a plurality of light receiving devices corresponding to the plurality of detection beams La emitted from the light emitting portion 61K.

The light emitting portion 61K and the light receiving portion 62K are fixed to, for example, the main column 3, and the detection beams La emitted from the light emitting portion 61K are set so that they pass through a position away from the projection optical system PL. Furthermore, the light emitting portion 61K and the light receiving portion 62K can be provided, for example, in the vicinity of the load position where the substrate P is loaded on the substrate stage PST, in the vicinity of the unload position where the substrate P is unloaded from the substrate stage PST, at a prescribed position between the load position and an exposure position (a position below the projection optical system PL), or at a prescribed position between the unload position and the exposure position.

In the embodiment explained referencing FIG. 6 and the like, the size and shape of the liquid LQ in the horizontal direction is detected by emitting a plurality of detection beams La so that they are arrayed in the horizontal direction (XY directions); however, in the present embodiment, the plurality of detection beams La, which are arrayed in the vertical direction (Z axial direction), are emitted, and the detection apparatus 60 can therefore derive the height of the liquid LQ (liquid droplet) based on the light receiving results of the light receiving portion 62K.

The control apparatus CONT can also detect the height h of the liquid LQ on the upper surface 43 using the detection apparatus 60 and, based on that detection results, derive the contact angle θ of the liquid LQ with respect to the upper surface 43, as depicted in FIG. 18A. Specifically, the control apparatus CONT can detect the height h of the liquid LQ using the detection apparatus 60 and then calculate the contact angle θ based on the abovementioned equation (1A).

In addition, in the embodiment depicted in FIG. 17, the detection beams La are emitted substantially parallel to the Y axial direction; however, the control apparatus CONT can emit the detection beams La while moving the substrate stage PST in the X axial direction, which is the direction that intersects with the optical paths of the detection beams La. By arithmetically processing the plurality of light receiving results of the light receiving portion 62K corresponding to the plurality of positions of the substrate stage PST, the control apparatus CONT can derive the shape of the liquid (liquid droplet) LQ, in the Z axial direction, that is present on the substrate stage PST. Furthermore, based on the derived shape of the liquid (liquid droplet) LQ, the control apparatus CONT can derive the affinity of the liquid LQ for the upper surface 43 of the substrate stage PST, specifically the contact angle θ of the liquid LQ with respect to the upper surface 43, as depicted in FIG. 18B.

Incidentally, it is preferable that the upper surface 43 of the substrate stage PST (the surface of the object opposing the lower surface 2A of the projection optical system PL) is liquid-repellent. By making the upper surface 43 liquid repellent, even if the liquid LQ remains on the upper surface 43, that liquid LQ can be smoothly collected. In addition, it is preferable that the front surface of the substrate P, whereon the immersion area AR2 of the liquid LQ is formed; the upper surface 301A of the fiducial member 300; the upper surface 401A of the luminous flux intensity nonuniformity sensor 400; the upper surface 501A of the spatial image measuring sensor 501; and the like are all liquid-repellent. By making these upper surfaces and the front surface of the substrate P liquid-repellent, the immersion area AR2 of the liquid LQ can be satisfactorily formed between the projection optical system PL and those surfaces, and the liquid can be smoothly recovered. In addition, by making the front surface of the substrate P liquid-repellent, the immersion area AR2 formed between the projection optical system PL and the front surface of the substrate P can be satisfactorily maintained even when immersion-exposing the substrate P while moving such. Likewise, it is also conceivable to perform the measurement process while moving the substrate stage PST in a state wherein the immersion area AR2 of the liquid LQ is formed on each of the upper surfaces 301A, 401A, 501A, and the immersion area AR2 can be satisfactorily maintained by making the upper surfaces 301A, 401A, 501A liquid-repellent.

Incidentally, there is a possibility that the liquid repellency of the upper surface of the substrate stage PST, including the upper surface 301A of the fiducial member 300 and the upper surfaces 401A, 501A of the upper plates 401, 501, will degrade over the course of time. For example, if, in order to make the upper surface of the substrate stage PST and the like liquid-repellent, they are coated with a liquid repellent material, or if the abovementioned members, upper plates, and the like are made of a liquid repellent material, then there is a possibility that that liquid repellency will degrade if they are irradiated by the exposure light EL. In particular, if, for example, fluorine based resin is used for the liquid repellent material and ultraviolet light is used for the exposure light EL, then the liquid repellency of the upper surface of the substrate stage PST and the like tends to degrade (tends to become lyophilic) In so doing, the liquid LQ tends to remain on the substrate stage PST, which invites a degradation of the exposure accuracy, the measurement accuracy, and the like.

Accordingly, the control apparatus CONT uses the detection apparatus 60 to periodically derive the contact angle θ of the liquid LQ with respect to the upper surface 43 of the substrate stage PST, including the upper surface 301A of the fiducial member 300 and the upper surfaces 401A, 501A of the upper plates 401, 501, i.e., the affinity of the liquid LQ for the upper surface 43. By deriving the contact angle θ, it is possible to ascertain the level of liquid repellency of the upper surface 43 of the substrate stage PST. If the derived contact angle θ (liquid repellency level) is less than a permissible value of a preset contact angle (liquid repellency level), then appropriate measures are taken with respect to the upper surface 43 of the substrate stage PST.

For example, if the contact angle θ of the liquid LQ with respect to the upper surface 301A of the fiducial member 300, which is replaceably disposed on the substrate stage PST, has been detected and is less than the abovementioned permissible value, then that fiducial member 300 is replaced with another (new) fiducial member 300 that has sufficient liquid repellency.

Likewise, if the contact angle θ of the liquid LQ with respect to the upper surface 401A of the upper plate 401, the upper surface 501A of the upper plate 501, or the like has been detected and is less than the abovementioned permissible value, then that upper plate 401 or that upper plate 501 is replaced with another (new) upper plate 401 or upper plate 501, respectively, that has sufficient liquid repellency.

Alternatively, if the contact angle θ of the liquid LQ with respect to the upper surface 43 has been detected, then it is also possible, based on that detected contact angle θ, to replace the plate member 43P, which has the upper surface 43, of the substrate stage PST.

In addition, the control apparatus CONT can of course use the detection apparatus 60 to detect the contact angle θ with respect to the front surface of the substrate P, which is held on the substrate stage PST.

In addition, by deriving the shape of the droplet of the liquid LQ using the detection apparatus 60 depicted in FIG. 17 in a state wherein the substrate stage PST is inclined, it is also possible to derive the dynamic contact angle, drop angle, and the like of the liquid LQ on the substrate stage PST (the substrate P).

Furthermore, when detecting the contact angle θ of the liquid LQ with respect to the upper surface 43 and the like, a small amount of the liquid (a liquid droplet) should be supplied to the upper surface 43 from the liquid supply ports 12 of the liquid supply mechanism 10, and the substrate stage PST should be moved so that that liquid LQ disposed on the upper surface 43 is disposed in the optical paths of the detection beams La emitted by the light emitting portion 61K.

In addition, if the front surface of the substrate P, the upper surface of the substrate stage PST including the upper surfaces 301A, 401A, 501A, and the like are not sufficiently liquid-repellent, then there is a possibility that, as discussed above, it will become difficult to satisfactorily maintain the immersion area AR2, e.g., a problem will occur wherein the liquid LQ flows out of the immersion area AR2. Accordingly, the occurrence of such problems can be avoided by controlling the operation of either the liquid supply mechanism 10 or the liquid recovery mechanism 20, or both, based on the detected contact angle θ. For example, if it is determined, based on the detected contact angle θ, that the level of liquid repellency of the front surface of the substrate P is low, then the control apparatus CONT can perform control, such as reducing the amount of liquid supplied by the liquid supply mechanism 10, increasing the amount of liquid recovered (recovery force) by the liquid recovery mechanism 20, and the like when performing immersion exposure while moving the substrate P.

Alternatively, based on the detected contact angle θ, the control apparatus CONT can also adjust the travel speed of the substrate P (substrate stage PST) when immersion-exposing the substrate P while moving such. For example, if it is determined that the liquid repellency level on the substrate P is low, then the control apparatus CONT can reduce the speed of movement of the substrate P. It is thereby possible to reduce the possibility that the liquid LQ will flow out of the desired area.

In addition, there is also a possibility that the pressure of the immersion area AR2 will change in accordance with the contact angle θ (liquid repellency level) of the front surface of the substrate P; if pressure fluctuations occur, then there is a possibility that, unfortunately, those fluctuations will slightly deform the substrate P, the substrate stage PST, and the like. For example, if the liquid repellency level is high, then the immersion area AR2 will become positively pressurized, and if the liquid repellency level is low, then the immersion area AR2 will become negatively pressurized. Therefore, based on the detected contact angle θ, the liquid supply quantity, the liquid recovery quantity, and the like may be adjusted to reduce the force that affects the substrate P, the substrate stage PST, and the like.

Furthermore, in the present embodiment as well, the accuracy of detecting the contact angle θ can be improved by using infrared light of a prescribed wavelength for the detection beams La.

In addition, in the embodiment discussed above, an imaging apparatus can also be adopted as the detection apparatus 60, which would enable the operator and the like to easily ascertain the state of the liquid disposed on the substrate stage PST (substrate P) and the state of the adhering liquid.

In addition, the present invention may also be adapted to a twin stage type exposure apparatus that has two stages on which substrates to be processed, such as wafers, are separately disposed, and which are independently movable in the X and Y directions. A twin stage type exposure apparatus is disclosed in, for example, Japanese Published Unexamined Patent Application No. H10-163099 and Japanese Published Unexamined Patent Application No. H10-214783 (corresponding to U.S. Pat. Nos. 6,341,007, 6,400,441, 6,549,269, and 6,590,634), Published Japanese Translation No. 2000-505958 of the PCT International Publication (corresponding U.S. Pat. No. 5,969,441), or U.S. Pat. No. 6,208,407, and these disclosures are each hereby incorporated by reference in its entirety to the extent permitted by the national laws and regulations of the designated states (or elected states) designated by the present international patent application.

Figure 19:
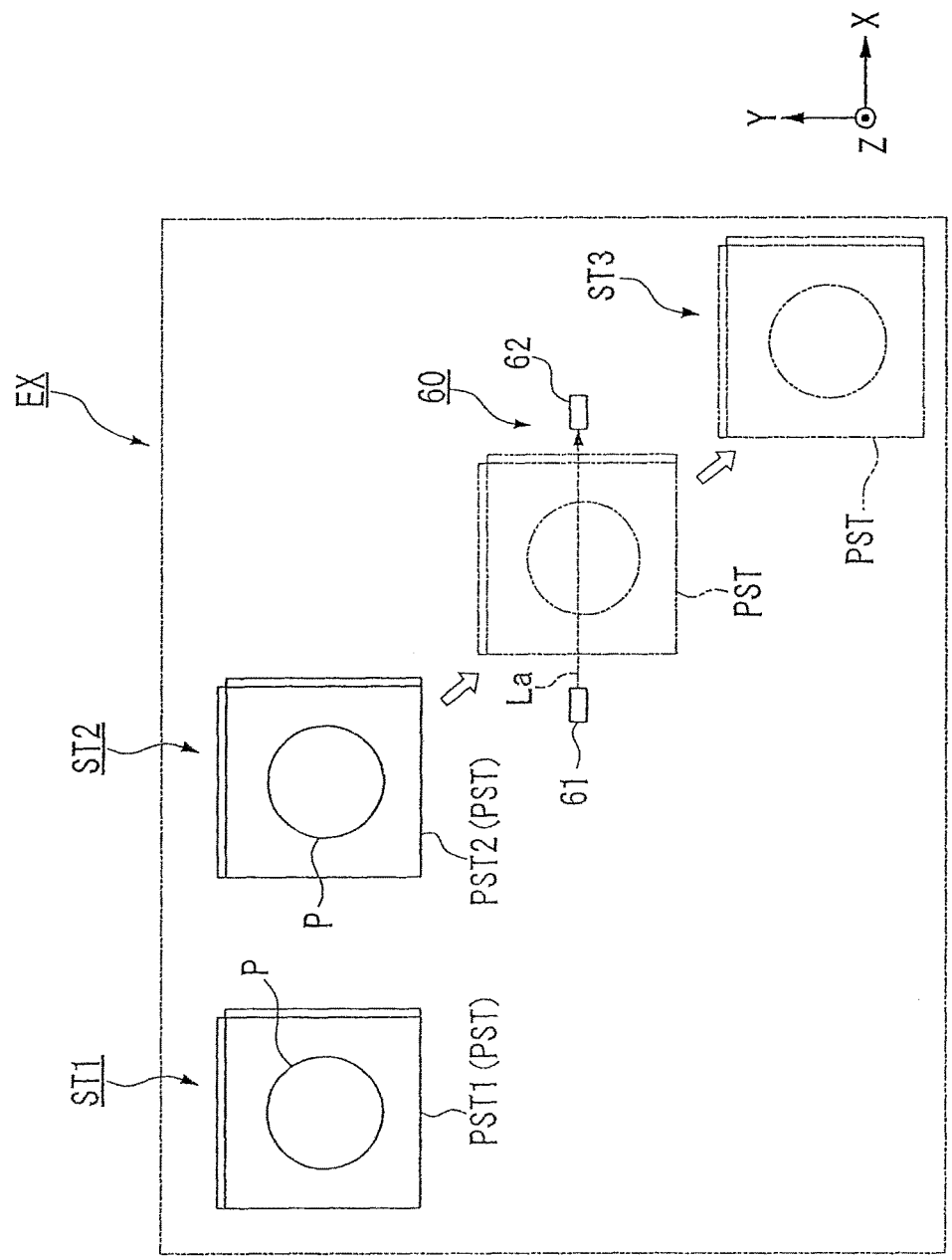
FIG. 19 is a plan view that depicts another embodiment of the detection apparatus according to the present invention.

FIG. 19 is a plan view that depicts a schematic constitution of a twin stage type exposure apparatus. The twin stage type exposure apparatus has first and second substrate stages PST1, PST2, which are each independently movable on a common base. The twin stage type exposure apparatus has an exposure station ST1 and a measurement and exchange station ST2; furthermore, the illumination optical system IL, the mask stage MST, the projection optical system PL, and the like, which were explained referencing FIG. 1, are mounted on the exposure station ST1. In addition, various measurement systems, such as the substrate alignment system and the focus leveling detection system, are mounted on the measurement and exchange station ST2.

The basic operation of such a twin stage type exposure apparatus is, for example, as follows: during the exposure process of the substrate P on the second substrate stage PST2 at the exposure station ST1, the substrate P on the first substrate stage PST1 is replaced and the measurement process is performed at the measurement and exchange station ST2. Furthermore, when each of these procedures is finished, the second substrate stage PST2 moves to the measurement and exchange station ST2 and, parallel thereto, the first substrate stage PST1 moves to the exposure station ST1 where, this time, the measurement and replacement processes are performed on the second substrate stage PST2, and the exposure process is performed on the substrate P on the first substrate stage PST1.

When the exposure process at the exposure station ST1 is finished, the substrate stage PST, which moved to the measurement and exchange station ST2, moves to an unload position ST3 in order to unload the substrate P for which the exposure process has finished. Furthermore, as depicted in FIG. 19, the detection apparatus 60, which detects whether the liquid LQ is present on the substrate P, the substrate stage PST, and the like, is provided on a movement path of the substrate stage PST2 that finished the exposure process and moves to the unload position ST3. The control apparatus CONT uses the detection apparatus 60 to detect whether the liquid LQ is present on the substrate P, the substrate stage PST, and the like before the substrate stage PST that finished the exposure process arrives at the unload position ST3. When the detection apparatus 60 is used to detect the presence of the liquid LQ, the control apparatus CONT emits the detection beams La from the light emitting portion 61 while moving the substrate stage PST to the unload position ST3. Furthermore, the detection beams La may be emitted in a state wherein the substrate stage PST is temporarily stopped. Furthermore, if the detection apparatus 60 does not detect the liquid LQ, then the control apparatus CONT moves the substrate stage PST to the unload position ST3 and uses the unloading apparatus to unload the substrate P on the substrate stage PST. On the other hand, if the detection apparatus 60 detects the liquid LQ, then the control apparatus CONT can remove that liquid LQ using a prescribed liquid removal mechanism, which is provided in advance at the unload position ST3 and the like, and can also remove that liquid LQ by returning the substrate stage PST to the measurement and exchange station ST2 or to the exposure station ST1 and then using a prescribed liquid removal mechanism, which is provided in advance, at the exposure station ST1 or the measurement and exchange station ST2. Furthermore, after the removal of the liquid LQ has been verified, the control apparatus CONT moves the substrate stage PST to the unload position ST3 and unloads the substrate P. In this case, the detection apparatus 60 may be constituted as depicted in FIG. 17, and not only detect the presence of the liquid LQ, but also measure the contact angle θ thereof.

In addition, the present invention can be adapted to an exposure apparatus that has an exposure stage that is capable of holding and moving the substrate to be processed, such as a wafer, and a measurement stage that has measurement members, such as various fiducial members and measurement sensors. In this case, at least some of the various measurement sensors and fiducial members disposed on the substrate stage PST in the embodiments discussed above can be disposed on the measurement stage, and the detection apparatus 60 can be used to detect the liquid LQ on the measurement stage. The exposure apparatus having the exposure stage and the measurement stage is disclosed in, for example, Japanese Published Unexamined Patent Application No. H11-135400, the disclosure of which is hereby incorporated by reference in its entirety to the extent permitted by the national laws and regulations of the designated states (or elected states) designated by the present international patent application.

As discussed above, the liquid LQ in the present embodiment is water. Pure water is advantageous because it can be easily obtained in large quantities at a semiconductor fabrication plant and the like, and because pure water has no adverse impact on the optical element (lens), the photoresist on the substrate P, and the like. In addition, because pure water has no adverse impact on the environment and has an extremely low impurity content, it can also be expected to have the effect of cleaning the front surface of the substrate P and the surface of the optical element provided on the front end surface of the projection optical system PL. Furthermore, the exposure apparatus may be provided with an ultrapure water manufacturing apparatus if the purity of the pure water supplied from the plant and the like is low.

Further, the refractive index n of pure water (or water) for the exposure light EL that has a wavelength of approximately 193 nm is said to be substantially 1.44; therefore, the use of ArF excimer laser light (193 nm wavelength) as the light source of the exposure light EL would shorten the wavelength on the substrate P to 1/n, i.e., approximately 134 nm, and thereby a high resolution would be obtained. Furthermore, because the depth of focus will increase approximately n times, i.e., approximately 1.44 times, that of in air, the numerical aperture of the projection optical system PL can be further increased if it is preferable to ensure a depth of focus approximately the same as that when used in air, and the resolution is also improved from this standpoint.

Furthermore, the numerical aperture NA of the projection optical system may become 0.9 to 1.3 if the liquid immersion method as discussed above is used. If the numerical aperture NA of such a projection optical system increases, then random polarized light conventionally used as the exposure light will degrade imaging performance due to the polarization effect, and it is therefore preferable to use polarized illumination. In that case, it is better to illuminate with linearly polarized light aligned in the longitudinal direction of the line pattern of the line-and-space pattern of the mask (the reticle), and to emit a large amount of diffracted light of the S polarized light component (the TE polarized light component), i.e., the polarized light direction component aligned in the longitudinal direction of the line pattern, from the pattern of the mask (the reticle). If a space between the projection optical system PL and the resist deposited on the front surface of the substrate P is filled with a liquid, then the transmittance through the resist surface increases for the diffracted light of the S polarized light component (the TE polarized light component), which contributes to the improvement of the contrast, compared with the case in which the space between the projection optical system PL and the resist deposited on the front surface of the substrate P is filled with air (a gas), and a high imaging performance can consequently be obtained even if the numerical aperture NA of the projection optical system exceeds 1.0. In addition, it is further effective to appropriately combine a phase shift mask and the oblique incidence illumination method (particularly the dipole illumination method) aligned in the longitudinal direction of the line pattern, as disclosed in Japanese Published Patent Application No. H06-188169.

In addition, if the substrate P is exposed with a fine line-and-space pattern (e.g., a line-and-space of approximately 25 to 50 nm) by using, for example, an ArF excimer laser as the exposure light and using a projection optical system PL that has a reduction magnification of approximately ¼, then the structure of the mask M (e.g., the fineness of the pattern and the thickness of the chrome) may cause the mask M to act as a polarizing plate due to the wave guide effect, and a larger amount of diffracted light of the S polarized light component (the TE polarized light component) compared with the diffracted light of the P polarized light component (the TM polarized light component), which decreases contrast, is emitted from the mask M, and it is therefore preferable to use the linear polarized light illumination discussed above; however, even if the mask M is illuminated with random polarized light, a high resolution performance can be obtained even if the numerical aperture NA of the projection optical system PL is as large as 0.9 to 1.3. In addition, if exposing a substrate P with an ultrafine line-and-space pattern of a mask M, then there is also a possibility that the P polarized light component (the TM polarized light component) will become greater than the S polarized light component (the TE polarized light component) due to the wire grid effect; however, because a greater quantity of diffracted light of the S polarized light component (the TE polarized light component) than the diffracted light of the P polarized light component (the TM polarized light component) is emitted from the mask M if the substrate P is exposed with a line-and-space pattern larger than 25 nm using, for example, an ArF excimer laser as the exposure light and a projection optical system PL that has a reduction magnification of approximately ¼, a high imaging performance can be obtained even if the numerical aperture NA of the projection optical system PL is as large as 0.9 to 1.3.

Furthermore, instead of just linear polarized light illumination (S polarized light illumination) aligned in the longitudinal direction of the line pattern of the mask (the reticle), it is also effective to combine the oblique incidence illumination method with the polarized light illumination method that linearly polarizes light in a direction tangential (circumferential) to a circle with the optical axis at the center, as disclosed in Japanese Published Patent Application No. H06-53120. In particular, if the mask (reticle) pattern includes line patterns extending in a plurality of differing directions instead of just a line pattern extending in a prescribed single direction, then, by combining the use of the zonal illumination method with the polarized light illumination method that linearly polarizes light in a direction tangential to a circle that has the optical axis at its center, as similarly disclosed in Japanese Published Patent Application No. H06-53120, it is possible to achieve high imaging performance even if the numerical aperture NA of the projection optical system is large.

In the present embodiment, the optical element 2 is affixed to the front end of the projection optical system PL and the relevant lens can adjust the optical characteristics of the projection optical system PL, e.g., aberrations (spherical aberration, coma aberration, and the like). Furthermore, the optical element affixed to the front end of the projection optical system PL may also be an optical plate used to adjust the optical characteristics of the projection optical system PL. Alternatively, it may be a plane parallel plate that is capable of transmitting the exposure light EL therethrough.

Furthermore, if high pressure is generated by the flow of the liquid LQ between the substrate P and the optical element at the front end of the projection optical system PL, then instead of making the optical element replaceable, it may be firmly fixed so that it does not move by that pressure.

In addition, the exposure apparatus which uses the liquid immersion method discussed above has a constitution wherein the substrate P is exposed after filling the space of the optical path on the light emerging side of the terminal optical element 2 of the projection optical system PL with the liquid (pure water), but the space of the optical path on the light incident side of the terminal optical element 2 of the projection optical system PL may also be filled with the liquid (pure water), as disclosed in PCT International Publication WO2004/019128.

Furthermore, the present embodiment is constituted so that a space between the projection optical system PL and the front surface of the substrate P is filled with the liquid LQ, but it may be constituted so that the space is filled with the liquid in a state wherein, for example, a cover glass having a plane parallel plate is affixed to the front surface of the substrate P.

Furthermore, although the liquid LQ in the present embodiment is water, it may be a liquid other than water; for example, if the light source of the exposure light EL is an $F_2$ laser, then this $F_2$ laser light will not pass through water, so it would be acceptable to use as the liquid LQ a fluorine based fluid, such as perfluorinated polyether (PFPE) or fluorine based oil, that is capable of transmitting $F_2$ laser light. In this case, the portions that make contact with the liquid LQ are treated in order to make them lyophilic by forming a thin film with a substance that has a molecular structure that contains fluorine and that has a low polarity. In addition, it is also possible to use as the liquid LQ one (e.g., cedar oil) that is transparent to the exposure light EL, has the highest possible refractive index, and is stable with respect to the projection optical system PL and the photoresist deposited on the front surface of the substrate P. In this case as well, the surface treatment is performed in accordance with the polarity of the liquid LQ used. In addition, a liquid can also be used that has a refractive index that is higher than that of the terminal optical element 2 of the projection optical system PL with respect to the exposure light EL.

Furthermore, the substrate P in each of the abovementioned embodiments is not limited to a semiconductor wafer for manufacturing semiconductor devices, and may be a glass substrate for a display device, a ceramic wafer for a thin film magnetic head, the original plate of a mask or reticle (synthetic silica glass, silicon wafer) used by an exposure apparatus, or the like.

In addition, the exposure apparatus EX may be a step-and-scan system scanning type exposure apparatus (scanning stepper) that performs exposure by scanning the pattern of the mask M by synchronously moving the mask M and the substrate P, as well as a step-and-repeat system projection exposure apparatus (stepper) that exposes the substrate P with the full pattern of the mask M, with the mask M and the substrate P in a stationary state, and sequentially step-moves the substrate P. In addition, the present invention can also be adapted to a step-and-stitch system exposure apparatus that transfers at least two patterns onto the substrate P so that the patterns are partially superimposed on each other.

In addition, in the embodiments discussed above, an exposure apparatus is adopted that a space between the projection optical system PL and the substrate P is locally filled with a liquid, but the present invention can also be adapted to a liquid immersion exposure apparatus wherein the entire front surface of the substrate to be exposed is covered with the liquid. The structure and the exposure operation of the immersion exposure apparatus wherein the entire front surface of the substrate to be exposed is covered with the liquid are disclosed in detail in, for example, Japanese Published Unexamined Patent Application No. H6-124873, Japanese Published Unexamined Patent Application No. H10-303114 and U.S. Pat. No. 5,825,043, the disclosures of which are each hereby incorporated by reference in its entirety to the extent permitted by the national laws and regulations of the designated states (or elected states) designated by the present international patent application.

The type of exposure apparatus EX is not limited to semiconductor device fabrication exposure apparatuses that expose the substrate P with the pattern of a semiconductor device, but the present invention can also be widely adapted to exposure apparatuses for manufacturing liquid crystal devices or displays, exposure apparatuses for manufacturing thin film magnetic heads, imaging devices (CCDs), or reticles and masks, and the like.

If a linear motor is used in the substrate stage PST or the mask stage MST (refer to U.S. Pat. No. 5,623,853 and U.S. Pat. No. 5,528,118), then either an air levitation type that uses an air bearing, or a magnetic levitation type that uses Lorentz's force or reactance force may be used. In addition, each of the stages PST, MST may be a type that moves along a guide or may be a guideless type.

For the drive mechanism of each of the stages PST, MST, a planar motor may be used that opposes a magnet unit, wherein magnets are arranged two dimensionally, to an armature unit, wherein coils are arranged two dimensionally, and drives each of the stages PST, MST by electromagnetic force. In this case, any one among the magnet unit and the armature unit is connected to the stages PST, MST and the other one should be provided on the moving surface side of the stages PST, MST.

The reaction force generated by the movement of the substrate stage PST may be mechanically discharged to the floor (ground) by using a frame member so that it is not transmitted to the projection optical system PL, as recited in Japanese Published Patent Application No. H08-166475 (U.S. Pat. No. 5,528,118).

The reaction force generated by the movement of the mask stage MST may be mechanically discharged to the floor (ground) by using a frame member so that it is not transmitted to the projection optical system PL, as recited in Japanese Published Patent Application No. H08-330224 (U.S. Pat. No. 5,874,820).

The exposure apparatus EX of the embodiments in the present application is manufactured by assembling various subsystems, including each constituent element recited in the claims of the present application, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes the mutual mechanical connection of the various subsystems, the wiring and connection of electrical circuits, the piping and connection of the atmospheric pressure circuit, and the like. Naturally, before the process of assembling the exposure apparatus from these various subsystems, there are also the processes of assembling each individual subsystem. When the process of assembling the exposure apparatus from the various subsystems is finished, a comprehensive adjustment is performed to ensure the various accuracies of the exposure apparatus as a whole. Furthermore, it is preferable to manufacture the exposure apparatus in a clean room wherein the temperature, the cleanliness level, and the like are controlled.

Figure 20:
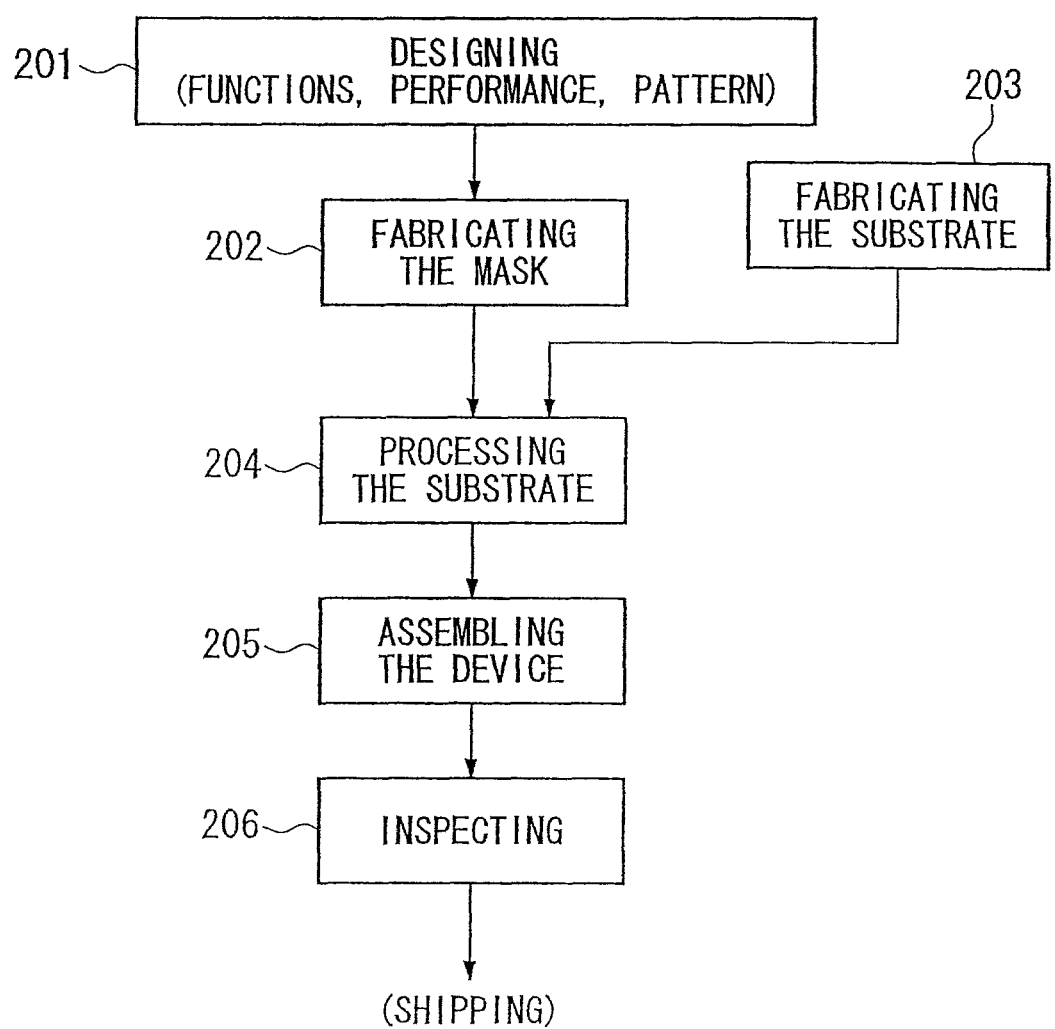
FIG. 20 is a flowchart that depicts one example of a process of manufacturing a semiconductor device.

As shown in FIG. 20, a micro-device, such as a semiconductor device, is manufactured by: a step 201 that designs the functions and performance of the micro-device; a step 202 that fabricates a mask (reticle) based on this design step; a step 203 that fabricates a substrate, which is the base material of the device; an exposure processing step 204 wherein the exposure apparatus EX of the embodiments discussed above exposes the substrate with a pattern of the mask; a device assembling step 205 (including a dicing process, a bonding process, and a packaging process); an inspecting step 206; and the like.

INDUSTRIAL APPLICABILITY

The detection apparatus is used to detect the presence of liquid on an object disposed lower than the front end of a projection optical system, the state of the immersion area, or the shape or contact angle of the liquid, and it is therefore possible to take optimal measures, based on those detection results, in order to maintain high exposure and measurement accuracies. For example, if the immersion area is not formed at the desired position, then an appropriate measure should be taken, based on the detection results of the detection apparatus, to dispose the liquid at the desired position. In addition, if liquid flows out and adheres to a position outside of the desired position, then appropriate measures should be taken based on the detection results of the detection apparatus, e.g., stopping the supply of the liquid, removing the liquid, and the like. Thereby, a device that has the desired performance can be manufactured.

The invention claimed is:
1. An exposure apparatus comprising:
a projection system having a final optical element via which an exposure beam is projected;
an immersion member having (i) an opening through which the exposure beam is projected, (ii) liquid supply ports and (iii) liquid recovery ports;
a stage which is movable below and relative to the projection system and the immersion member, the stage including a holder configured to hold a substrate;
a detection system configured to detect a residual liquid on at least one of the substrate held on the holder of the stage and the stage; and
a controller configured to control the detection system, wherein:
a liquid immersion area is formed on an upper surface of the substrate held on the holder of the stage, while supplying immersion liquid via the liquid supply ports facing the upper surface of the substrate and removing the immersion liquid via the liquid recovery ports,
the liquid immersion area is formed such that only a portion of the upper surface of the substrate is covered by the immersion liquid,
the substrate is exposed with the exposure beam through the immersion liquid in the liquid immersion area, and
the controller controls the detection system to perform detection of the residual liquid while the substrate is held by the holder after the liquid immersion area has been formed on at least the portion of the upper surface of the substrate and/or a portion of the stage adjacent to the holder after completion of exposure of at least a portion of the substrate to the exposure beam through the immersion liquid.

2. The exposure apparatus according to claim 1, wherein the detection system comprises one or more of a light-receiving detector, an infrared sensor, and a detector to detect scattered light.

3. The exposure apparatus according to claim 1, wherein the detection system generates, upon detection of the residual liquid, an alarm or error signal to instruct performance of a drying action.

4. The exposure apparatus according to claim 1, wherein the detection system is provided between an exposure station where the exposure beam is projected onto the substrate by the projection system and an unload position where the exposed substrate is unloaded from the holder of the stage.

5. The exposure apparatus according to claim 4, wherein the projection system is provided at the exposure station and the detection system is provided at a measurement station, the measurement station being physically separate from the exposure station.

6. The exposure apparatus according to claim 1, wherein:
the detection system has an emitting portion that emits detection light and a light receiving portion.

7. The exposure apparatus according to claim 6, wherein:
the detection light is emitted from the emitting portion to a plurality of positions, and at least one of a size and a shape of the residual liquid is obtained based on a light receiving result of the light receiving portion.

8. The exposure apparatus according to claim 6, wherein:
the detection system performs the detection while the detection light and the stage holding the substrate are relatively moved.

9. The exposure apparatus according to claim 6, further comprising:
a bending portion that bends an optical path of the detection light.

10. The exposure apparatus according to claim 6, wherein:
the detection light travels through a space between the final optical element and the substrate substantially parallel to the upper surface of the substrate.

11. The exposure apparatus according to claim 10, wherein:
whether the residual liquid is present in an optical path of the detection light is determined based on a light receiving result of the light receiving portion.

12. The exposure apparatus according to claim 6, wherein:
a position of the residual liquid is obtained based on a light receiving result of the light receiving portion.

13. The exposure apparatus according to claim 6, wherein:
the emitting portion emits the detection light to the upper surface of the substrate or an upper surface of the stage.

14. The exposure apparatus according to claim 13, wherein:
the light receiving portion receives light from the upper surface of the substrate or the upper surface of the stage, and the residual liquid on the upper surface of the substrate or the upper surface of the stage is detected based on the light receiving result.

15. The exposure apparatus according claim 6, wherein: the detection light is infrared light.

16. The exposure apparatus according to claim 6, wherein:
the detection light includes a sheet light flux.

17. The exposure apparatus according to claim 1, wherein the controller controls an operation of at least supply and recovery of the immersion liquid via the liquid supply ports and the liquid recovery ports based on a detection result of the detection system.

18. The exposure apparatus according to claim 17, wherein:
the controller stops the supply of the immersion liquid if it is determined that the detection result of the detection system is abnormal.

19. The exposure apparatus according to claim 1, wherein the stage has an upper surface configured to be substantially a same height as the upper surface of the substrate held by the holder of the stage.

20. The exposure apparatus according to claim 1, further comprising:
a drying station which is capable of drying the substrate, the stage, or both.

21. The exposure apparatus according to claim 20, wherein
the drying station dries the substrate, the stage, or both, based on an alarm or an error signal generated by the detection system.

22. A device manufacturing method comprising:
exposing a substrate through the projection system of the exposure apparatus according to claim 1; and
processing the exposed substrate.

23. An exposure method comprising:
projecting an exposure beam onto a substrate via a projection system having a final optical element while an immersion member having (i) an opening through which the exposure beam is projected, (ii) liquid supply ports and (iii) liquid recovery ports, supplies and recovers an immersion liquid between the final optical element and substrate, the substrate being held by a holder of a stage which is movable below and relative to the projection system and the immersion member; and
detecting, with a detection system, a residual liquid on at least one of the substrate held on the holder of the stage and the stage,
wherein:
a liquid immersion area is formed on an upper surface of the substrate held on the holder of the stage, while supplying the immersion liquid via the liquid supply ports facing the upper surface of the substrate and removing the immersion liquid via the liquid recovery ports,
the liquid immersion area is formed such that only a portion of the upper surface of the substrate is covered by the immersion liquid,
the substrate is exposed with the exposure beam through the immersion liquid in the liquid immersion area, and
the detection of the residual liquid is performed while the substrate is held by the holder after the liquid immersion area has been formed on at least the portion of the upper surface of the substrate and/or a portion of the stage adjacent to the holder after completion of exposure of at least a portion of the substrate to the exposure beam through the immersion liquid.

24. The exposure method according to claim 23, wherein the detection system comprises one or more of a light-receiving detector, an infrared sensor, and a detector to detect scattered light.

25. The exposure method according to claim 23, further comprising:
generating, upon detection of the residual liquid by the detection system, an alarm or error signal to instruct performance of a drying action.

26. The exposure method according to claim 23, wherein the detection system is provided between an exposure station where the exposure beam is projected onto the substrate by the projection system and an unload position where the exposed substrate is unloaded from the holder of the stage.

27. The exposure method according to claim 26, wherein the projection system is provided at the exposure station and the detection system is provided at a measurement station, the measurement station being physically separate from the exposure station.

28. The exposure method according to claim 23, wherein:
the detection system has an emitting portion that emits detection light and a light receiving portion.

29. The exposure method according to claim 28, wherein:
the detection light is emitted from the emitting portion to a plurality of positions, and at least one of a size and a shape of the residual liquid is obtained based on a light receiving result of the light receiving portion.

30. The exposure method according to claim 28, wherein:
the detection system performs the detection while the detection light and the stage holding the substrate are relatively moved.

31. The exposure method according to claim 28, wherein:
the detection light travels through a space between the final optical element and the substrate substantially parallel to the upper surface of the substrate.

32. The exposure method according to claim 31, wherein:
whether the residual liquid is present in an optical path of the detection light is determined based on a light receiving result of the light receiving portion.

33. The exposure method according to claim 28, further comprising:
obtaining a position of the residual liquid based on a light receiving result of the light receiving portion.

34. The exposure method according to claim 28, wherein:
the emitting portion emits the detection light to the upper surface of the substrate or an upper surface of the stage.

35. The exposure method according to claim 34, wherein:
the light receiving portion receives light from the upper surface of the substrate or the upper surface of the stage, and the residual liquid on the upper surface of the substrate or the upper surface of the stage is detected based on the light receiving result.

36. The exposure method according claim 28, wherein:
the detection light is infrared light.

37. The exposure method according to claim 28, wherein:
the detection light includes a sheet light flux.

38. The exposure method according to claim 23, further comprising:
controlling an operation of at least supply and recovery of the immersion liquid via the liquid supply ports and the liquid recovery ports based on a detection result of the detection system.

39. The exposure method according to claim 38, wherein:
the controlling includes stopping the supply of the immersion liquid if it is determined that the detection result of the detection system is abnormal.

40. The exposure method according to claim 23, wherein the stage has an upper surface configured to be substantially a same height as the upper surface of the substrate held by the holder of the stage.

41. The exposure method according to claim 23, further comprising:
drying the substrate, the stage, or both at a drying station.

42. The exposure method according to claim 41, wherein the drying station dries the substrate, the stage, or both, based on an alarm or an error signal generated by the detection system.

43. A device manufacturing method comprising:
exposing a substrate with the exposure method according to claim 23; and
processing the exposed substrate.

* * * * *